United States Patent
Eid et al.

(10) Patent No.: US 12,007,170 B2
(45) Date of Patent: Jun. 11, 2024

(54) THERMAL MANAGEMENT IN INTEGRATED CIRCUIT PACKAGES

(71) Applicant: Intel Corporation, Santa Clara, CA (US)

(72) Inventors: Feras Eid, Chandler, AZ (US); Telesphor Kamgaing, Chandler, AZ (US); Georgios Dogiamis, Chandler, AZ (US); Aleksandar Aleksov, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 942 days.

(21) Appl. No.: 16/533,235

(22) Filed: Aug. 6, 2019

(65) Prior Publication Data

US 2021/0041182 A1  Feb. 11, 2021

(51) Int. Cl.
*F28D 15/04* (2006.01)
*H01L 23/367* (2006.01)
*H01L 23/38* (2006.01)
*H01L 23/427* (2006.01)

(52) U.S. Cl.
CPC ........ *F28D 15/046* (2013.01); *H01L 23/3672* (2013.01); *H01L 23/3675* (2013.01); *H01L 23/38* (2013.01); *H01L 23/427* (2013.01)

(58) Field of Classification Search
None
See application file for complete search history.

(56) References Cited

U.S. PATENT DOCUMENTS

| | | | |
|---|---|---|---|
| 6,550,531 B1 * | 4/2003 | Searls | F28D 15/0233 165/104.33 |
| 7,439,617 B2 | 10/2008 | Deppisch et al. | |
| 8,564,957 B2 | 10/2013 | Usui et al. | |
| 8,780,561 B2 | 7/2014 | Danello et al. | |
| 9,076,754 B2 | 7/2015 | Hung et al. | |
| 9,646,910 B2 | 5/2017 | Ahuja et al. | |
| 9,667,210 B2 | 5/2017 | Couglar et al. | |
| 9,671,141 B2 | 6/2017 | Kim et al. | |
| 9,704,788 B2 | 7/2017 | Gowda et al. | |
| 9,746,889 B2 | 8/2017 | Mittal et al. | |
| 9,837,595 B2 | 12/2017 | Yu et al. | |
| 9,978,732 B2 | 5/2018 | Penunuri et al. | |
| 10,269,688 B2 | 4/2019 | Gowda et al. | |
| 10,504,816 B2 | 12/2019 | Beauchemin et al. | |
| 10,510,687 B2 | 12/2019 | Hung | |
| 11,011,448 B2 | 5/2021 | Mallik et al. | |
| 11,221,184 B1 * | 1/2022 | Weed | F28D 15/04 |

(Continued)

FOREIGN PATENT DOCUMENTS

| | | |
|---|---|---|
| CN | 103314435 B | 3/2017 |
| JP | 2013042030 | 2/2013 |

(Continued)

OTHER PUBLICATIONS

U.S. Appl. No., filed Jun. 21, 2019, entitled "Device, System, and Method to Regulate Temperature of a Resonator Structure"; 45 pages.

*Primary Examiner* — Nilufa Rahim
(74) *Attorney, Agent, or Firm* — Akona IP PC

(57) ABSTRACT

Disclosed herein are structures and assemblies that may be used for thermal management in integrated circuit (IC) packages.

20 Claims, 35 Drawing Sheets

(56) References Cited

U.S. PATENT DOCUMENTS

| | | |
|---|---|---|
| 11,227,859 B2 | 1/2022 | Eid et al. |
| 11,480,394 B2* | 10/2022 | North .................... F28F 13/14 |
| 11,535,360 B1* | 12/2022 | Roper .................. F28D 15/046 |
| 2006/0087032 A1 | 4/2006 | Muthukumar et al. |
| 2006/0199299 A1 | 9/2006 | Deshpande et al. |
| 2007/0044483 A1* | 3/2007 | Refai-Ahmed ......... F28D 15/04 |
| | | 62/3.4 |
| 2008/0142954 A1 | 6/2008 | Hu |
| 2008/0237841 A1 | 10/2008 | Arana et al. |
| 2009/0016391 A1 | 1/2009 | Kalberer |
| 2010/0230805 A1 | 9/2010 | Refai-Ahmed |
| 2013/0043581 A1 | 2/2013 | Negoro |
| 2013/0119529 A1 | 5/2013 | Lin et al. |
| 2013/0208426 A1 | 8/2013 | Kim et al. |
| 2013/0258599 A1 | 10/2013 | Danello et al. |
| 2014/0002989 A1 | 1/2014 | Ahuja et al. |
| 2014/0085822 A1* | 3/2014 | Campbell ............... H05K 7/203 |
| | | 361/689 |
| 2014/0264821 A1 | 9/2014 | Tang et al. |
| 2014/0354314 A1 | 12/2014 | Arora et al. |
| 2014/0362552 A1 | 12/2014 | Murayama et al. |
| 2015/0035134 A1 | 2/2015 | Hung et al. |
| 2015/0035135 A1 | 2/2015 | Hung et al. |
| 2015/0062824 A1 | 3/2015 | Hyun et al. |
| 2015/0075186 A1 | 3/2015 | Prajapati |
| 2015/0108628 A1 | 4/2015 | Yu et al. |
| 2015/0162307 A1 | 6/2015 | Chen et al. |
| 2015/0380388 A1 | 12/2015 | Yu et al. |
| 2017/0084554 A1 | 3/2017 | Dogiamis et al. |
| 2017/0092561 A1 | 3/2017 | Eid et al. |
| 2017/0160017 A1 | 6/2017 | MacDonald |
| 2017/0167800 A1* | 6/2017 | Sunada ................. H01L 23/427 |
| 2017/0229373 A1 | 8/2017 | Kim et al. |
| 2018/0040549 A1 | 2/2018 | Shim et al. |
| 2018/0110158 A1 | 4/2018 | Talpallikar et al. |
| 2018/0270993 A1* | 9/2018 | Kulkarni ............... F28D 1/0477 |
| 2018/0294249 A1 | 10/2018 | Watanabe et al. |
| 2018/0358338 A1 | 12/2018 | Penunuri et al. |
| 2019/0006291 A1 | 1/2019 | Neal et al. |
| 2019/0139925 A1 | 5/2019 | Yu et al. |
| 2019/0348345 A1* | 11/2019 | Parida ..................... H01L 25/18 |
| 2019/0385929 A1* | 12/2019 | Ku ..................... H01L 25/0655 |
| 2020/0043853 A1 | 2/2020 | Kim et al. |
| 2020/0058571 A1 | 2/2020 | Wang et al. |
| 2020/0091036 A1* | 3/2020 | Chen ...................... H01L 24/32 |
| 2020/0132392 A1* | 4/2020 | Joshi .................... H05K 7/2039 |
| 2020/0185300 A1 | 6/2020 | Xu et al. |
| 2020/0211927 A1 | 7/2020 | Wan et al. |
| 2020/0235082 A1 | 7/2020 | Eid et al. |
| 2020/0248969 A1* | 8/2020 | Sudhakar .............. F28D 15/046 |
| 2020/0292245 A1* | 9/2020 | Naito .................. F28D 15/0233 |
| 2020/0312742 A1 | 10/2020 | Lofgreen et al. |
| 2020/0365485 A1* | 11/2020 | Hu ...................... H01L 25/0657 |
| 2020/0402885 A1 | 12/2020 | Kim et al. |
| 2020/0403619 A1 | 12/2020 | Biber et al. |
| 2020/0404805 A1* | 12/2020 | Gao .................... H05K 7/20781 |
| 2021/0035859 A1 | 2/2021 | Mehta et al. |
| 2021/0035881 A1 | 2/2021 | Mallik et al. |
| 2021/0035921 A1 | 2/2021 | Neal et al. |
| 2021/0043541 A1 | 2/2021 | Eid et al. |
| 2021/0043543 A1 | 2/2021 | Eid et al. |
| 2021/0043544 A1 | 2/2021 | Eid et al. |
| 2021/0043573 A1 | 2/2021 | Eid et al. |
| 2021/0356212 A1* | 11/2021 | Naito ...................... F28F 3/086 |
| 2022/0099383 A1* | 3/2022 | Bozorgi .............. F28D 15/0233 |

FOREIGN PATENT DOCUMENTS

| | | |
|---|---|---|
| KR | 20120010616 A | 2/2012 |
| KR | 20140135509 A | 11/2014 |
| KR | 20160037582 A | 4/2016 |
| WO | 2017123188 A1 | 7/2017 |
| WO | 2018106226 A1 | 6/2018 |
| WO | 2019066998 A1 | 4/2019 |
| WO | 2019132967 A1 | 7/2019 |

* cited by examiner

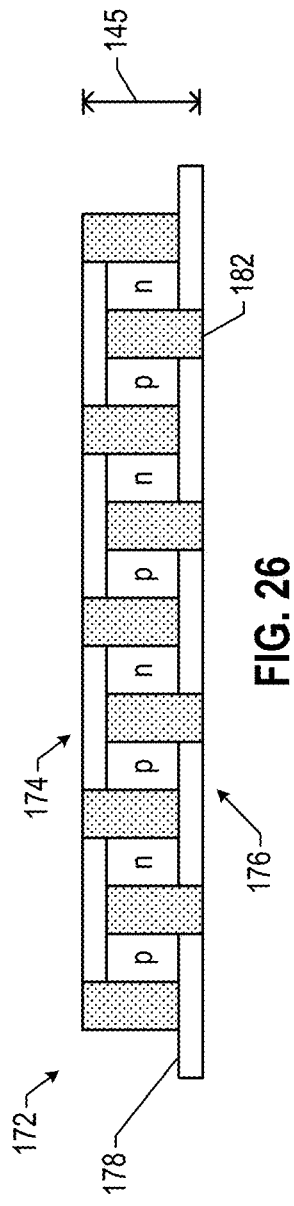
FIG. 26
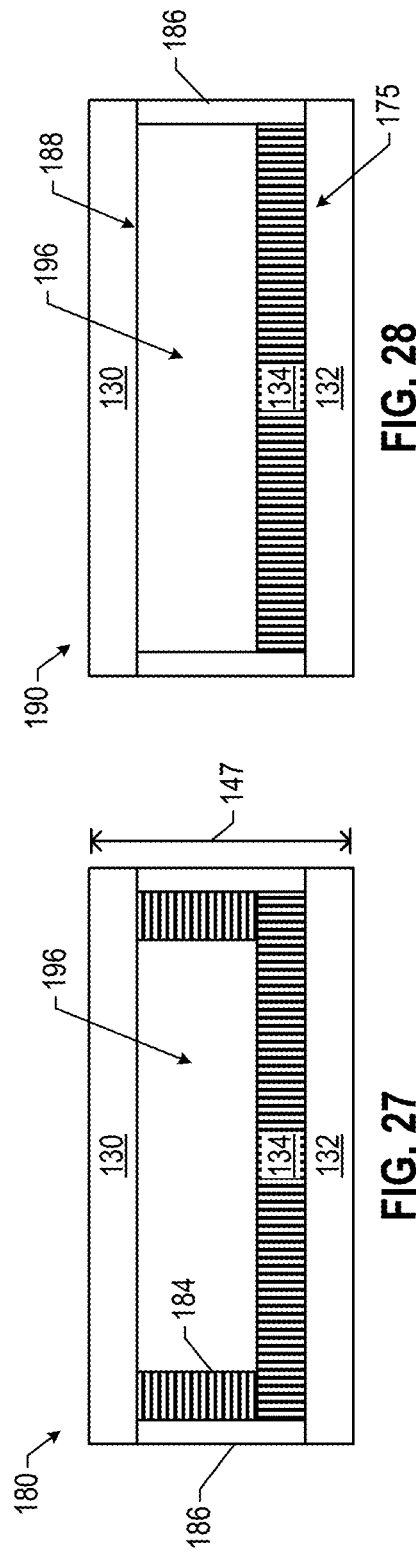
FIG. 27
FIG. 28

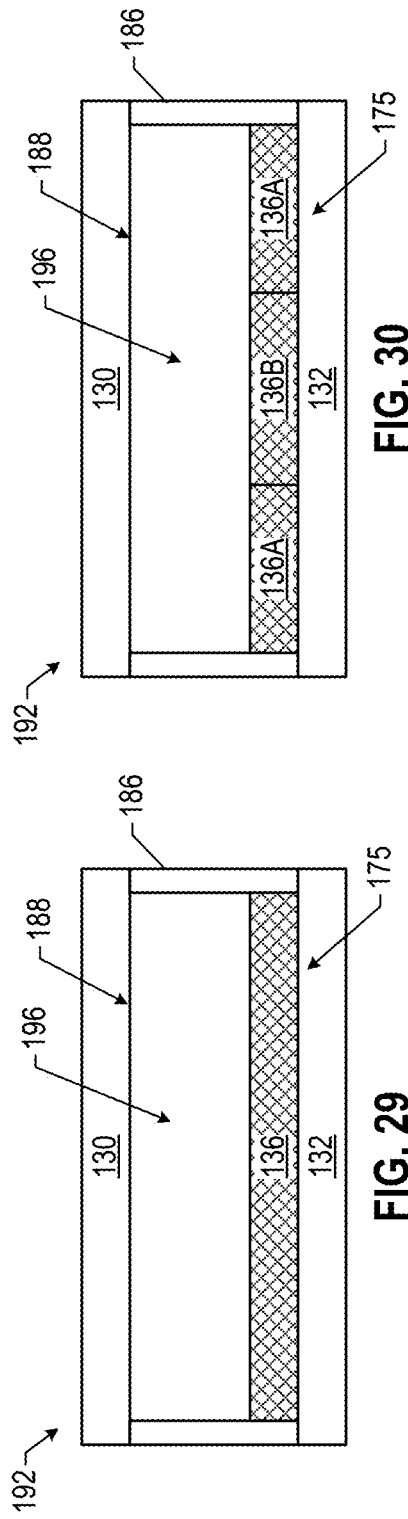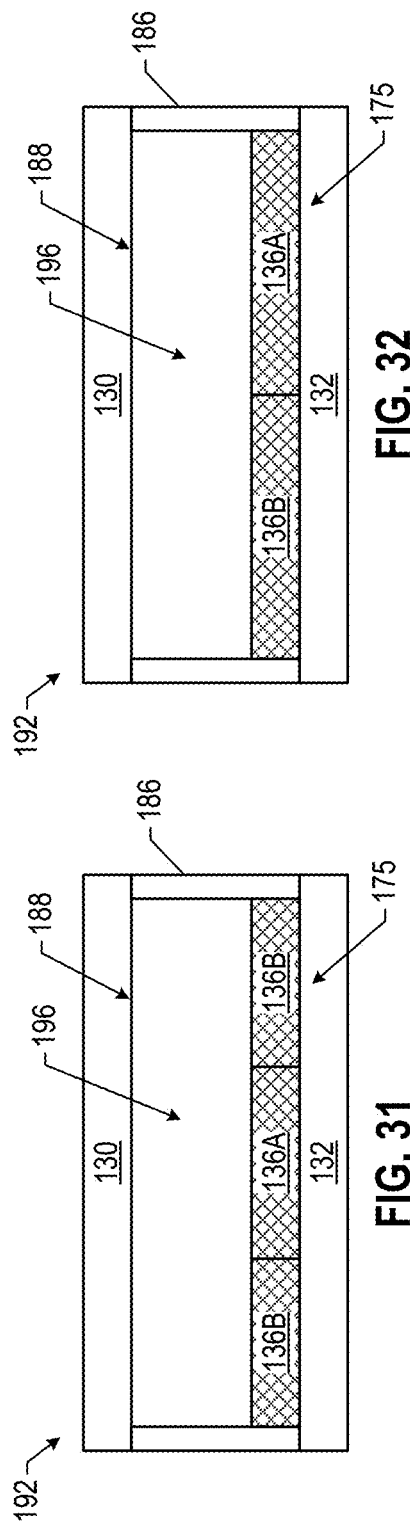

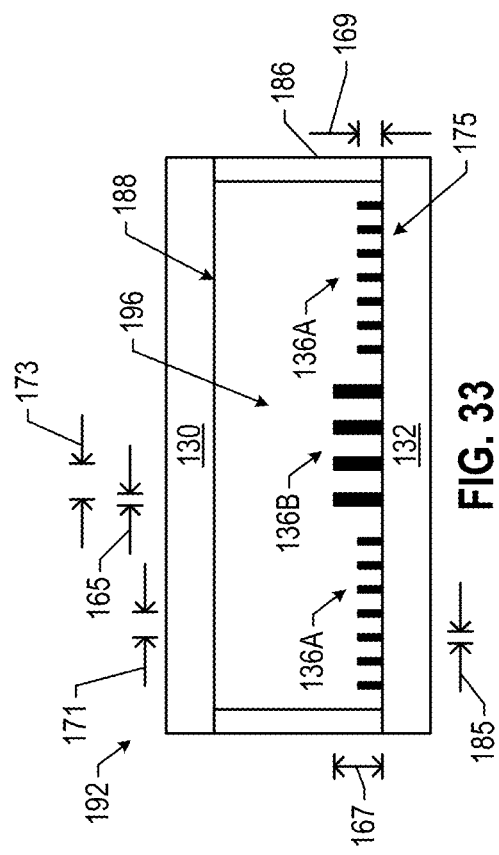
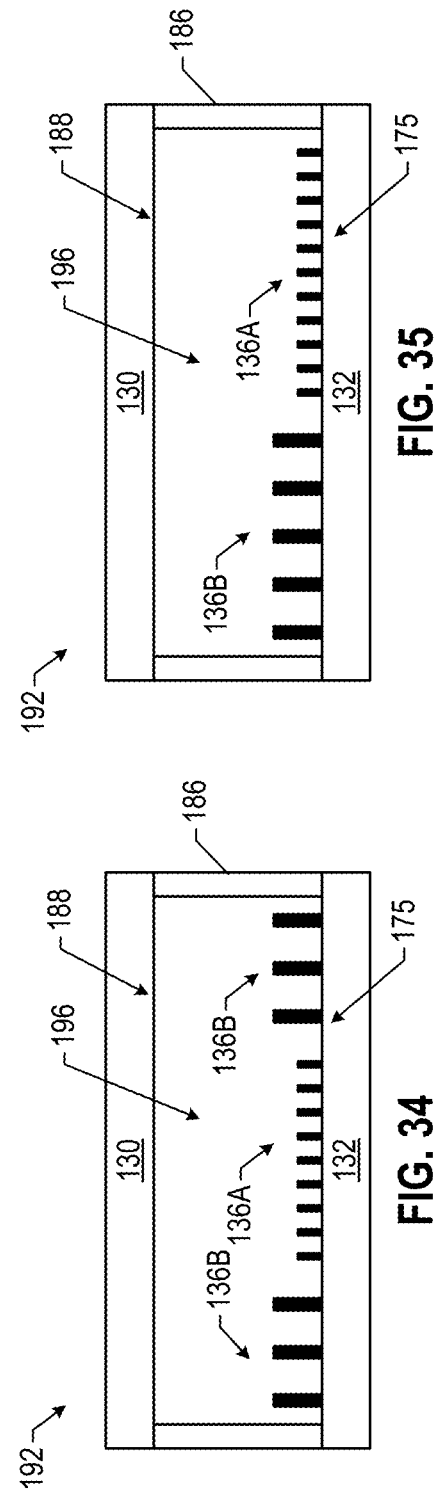

THERMAL MANAGEMENT IN INTEGRATED CIRCUIT PACKAGES

BACKGROUND

Many electronic devices generate significant amounts of heat during operation. Some such devices include heat sinks or other components to enable the transfer of heat away from heat-generating elements in these devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 26 is a side, cross-sectional view of an example thermoelectric cooler (TEC) that may be included in a thermal management arrangement in an IC package, in accordance with various embodiments.

FIGS. 27-28 are side, cross-sectional views of example vapor chambers that may be included in a thermal management arrangement in an IC package, in accordance with various embodiments.

FIGS. 29-38 are side, cross-sectional views of example vapor chambers that may be included in a thermal management arrangement in an IC package, in accordance with various embodiments.

DETAILED DESCRIPTION

Figure 1:
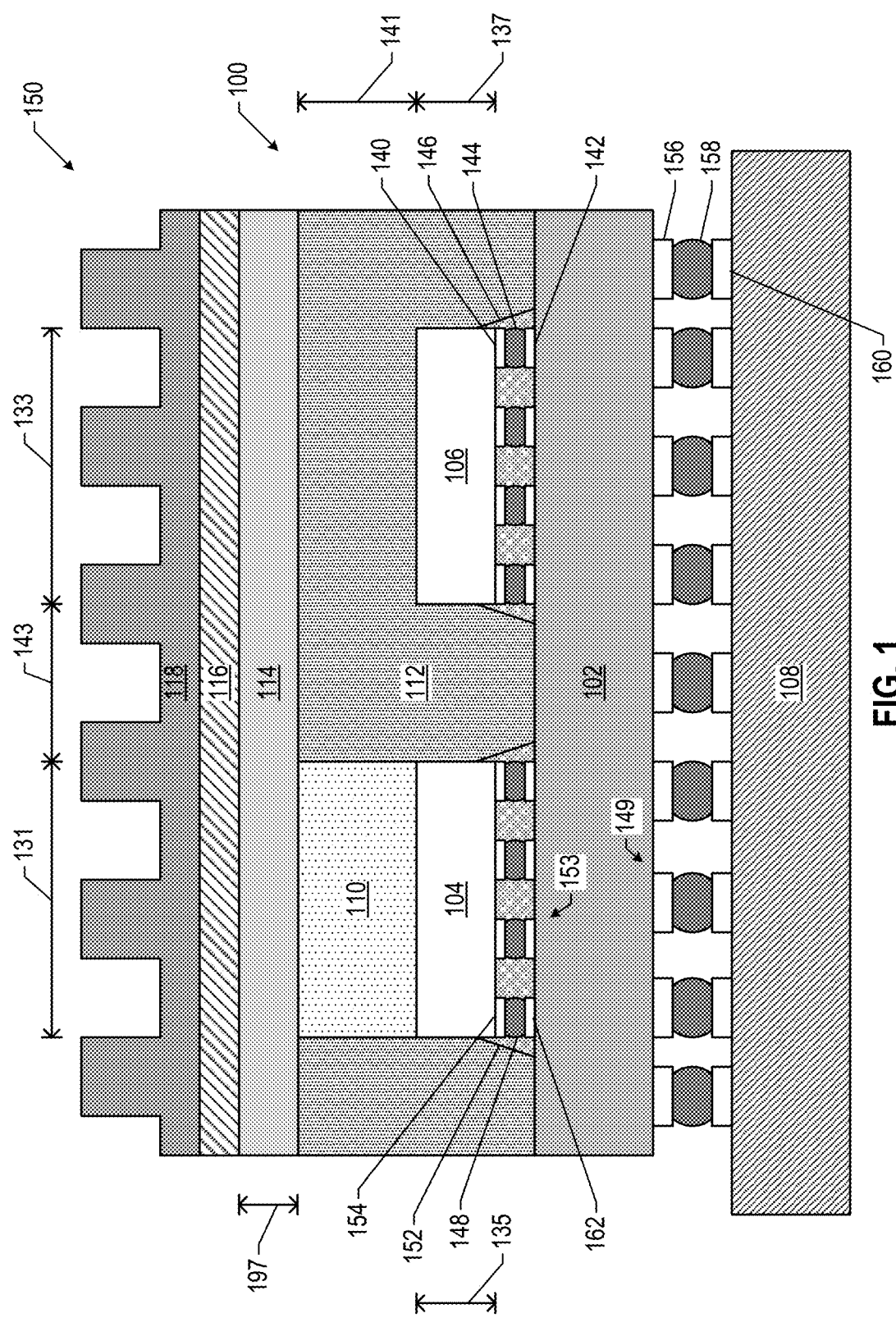
FIG. 1 is a side, cross-sectional view of an integrated circuit (IC) assembly including an IC package with an example thermal management arrangement, in accordance with various embodiments.

Disclosed herein are structures and assemblies that may be used for thermal management in integrated circuit (IC) packages. Making electronic devices smaller may involve bringing components closer together than they were in earlier devices. This may increase the likelihood of thermal cross talk, in which heat generated by components during operation is transferred to other components in the device. The performance of some components may be largely indifferent to this heat, while the performance of other components may be substantially degraded. For example, in radio frequency (RF) communication devices, shrinking the size of such a device may involve bringing the power amplifier (PA) dies closer to the acoustic wave resonator (AWR) dies. However, since the AWR dies may be very sensitive to temperature fluctuations, thermal cross talk between the PA dies and the AWR dies may result in temperature fluctuations for the AWR dies that are outside of an acceptable range for reliable performance. Conventional approaches to limiting this thermal cross talk typically include separately packaging the PA dies and AWR dies. These thermal issues are not limited to the RF setting; similar issues arise in other electronic devices as well, such as wearable devices, multichip server packages, optical devices, etc.

The structures and assemblies disclosed herein may enable closer integration of heat-generating and temperature-sensitive components than previously achievable. For example, the structures and assemblies disclosed herein may enable heat-generating components (like the PA dies discussed above) and temperature-sensitive components (like the AWR dies discussed above) to be included in a single package, without compromising the performance of the temperature-sensitive components. The structures and assemblies disclosed herein not only enable smaller form factors for existing electronic devices, but also enable the next generation of electronic devices. For example, next-generation 5G wireless communication devices may require additional hardware to accommodate an increasing number of filters and communication bands; the structures and assemblies disclosed herein may enable this hardware to be compactly integrated into desirably sized devices, accelerating adoption of this next-generation technology and facilitating its use in a broader array of devices.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

A number of examples of thermal management arrangements in IC packages and IC assemblies are disclosed herein. Although these arrangements may be separately discussed for ease of illustration, any suitable ones of these arrangements may be combined in an IC package or IC assembly. For example, any of the arrangements of FIGS. 1-7 may be used in combination with any of the embodiments including a cooling device (e.g., as illustrated in FIG. 8-13, 16-19, 39-40, or 42), or in combination with any of the other arrangements of FIGS. 1-7. This particular set of combinations is just an example, and any suitable combination of any of the embodiments disclosed herein are within the scope of this disclosure.

FIG. 1 is a side, cross-sectional view of an IC assembly 150 including an IC package 100 with an example thermal management arrangement, in accordance with various embodiments. The IC package 100 of FIG. 1 includes a package substrate 102 to which a heat-generating (HG) component 104 and a temperature-sensitive (TS) component 106 are coupled. While all electrical components generate heat during operation, and all electrical components have some sensitivity to temperature, the terms "heat-generating" and "temperature-sensitive" are used herein to identify a relative relationship between the components 104 and 106; namely, that the HG component 104, during operation, may generate enough heat to negatively impact the performance of the TS component 106 unless the components 104 and 106 are part of a thermal management arrangement, such as the arrangements disclosed herein. In some embodiments, the TS component 106 may be associated with a maximum temperature, such that adequate performance of the TS component 106 may not be achieved if the temperature of the TS component 106 is above the maximum temperature. When the IC package 100 is a multi-chip server or field programmable gate array (FPGA) package, an example of such a TS component 106 may be a memory die or stack (e.g., memory devices having a specified maximum temperature of approximately 85 degrees Celsius), while a corresponding HG component 104 may be a logic component, such as a processor die. In some embodiments, the TS component 106 may be associated with a temperature range, such that adequate performance of the TS component 106 may not be achieved if the temperature of the TS component 106 is above or below the temperature range. When the IC package 100 is an RF package, an example of such a TS component 106 may include a component (e.g., a die) that includes resonators (e.g., AWRs), while a corresponding HG component 104 may include a component (e.g., a die) that includes PAs and/or switches. When the IC package 100 is an optical interconnect package, an example of such a TS component 106 may include a component (e.g., a die) that generates optical signals (e.g., vertical cavity surface emitting lasers), while a corresponding HG component 104 may include a logic component, such as a processor die. In some embodiments, the HG component 104 may be a high-power density (HPD) component and the TS component 106 may be a low-power density (LPD) component. As used herein, the term "high-power density" and "low-power density" are relative terms, and refer to the relative amount of power consumed/generated by the components during operation. In particular, an HPD component has a higher power density during operation than an LPD component.

Although FIG. 1 and others of the accompanying figures depict only a single HG component 104 and a single TS component 106, this is simply for ease of illustration, and any of the IC packages 100 or IC assemblies 150 disclosed herein may include any desired number of additional components (or fewer components, as appropriate). For example, any of the IC packages 100 disclosed herein may include passive components (e.g., resistors, inductors, capacitors, or combinations thereof) disposed at either face of a package substrate 102, embedded in a package substrate 102, or in any other suitable location. In another example, any of the IC packages 100 disclosed herein may include active components (e.g., transistors) disposed at either face of a package substrate 102, embedded in a package substrate 102, or in any other suitable location.

As noted above, the HG component 104 and the TS component 106 may be coupled to the package substrate 102. In particular, the package substrate 102 may include a first face 149 and an opposing second face 153, and the HG component 104 and the TS component 106 may be coupled to the second face 153. The package substrate 102 may include a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the top and bottom surfaces, or between different locations on the top surface, and/or between different locations on the bottom surface. These conductive pathways may take the form of any of the interconnect structures 1628 discussed below with reference to FIG. 44 (e.g., including lines and vias). FIG. 1 (and others of the accompanying drawings) illustrate conductive contacts 142 at the second face 153 electrically coupled to conductive contacts 140 of the TS component 106 by solder bumps 144, but any suitable interconnects (e.g., first-level interconnects, pillars/posts, wirebonds, bumps, waveguides, etc.) may be used to couple the TS component 106 to the package substrate 102 in any of the embodiments disclosed herein. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). Similarly, FIG. 1 (and others of the accompanying drawings) illustrate conductive contacts 162 at the second face 153 of the package substrate 102 electrically coupled to conductive contacts 154 of the HG component 104 by solder bumps 148, but any suitable interconnects (e.g., first-level interconnects, posts/pillars, wirebonds, etc.) may be used to couple the HG component 104 to the package substrate 102 in any of the embodiments disclosed herein. An underfill material 146 may be disposed around the solder balls 144 coupling the TS component 106 to the package substrate 102, and an underfill material 152 may be disposed around the solder bumps 148 coupling the HG component 104 to the package substrate 102. An underfill material may provide mechanical support to these interconnects, helping mitigate the risk of cracking or delamination due to differential thermal expansion between the package substrate 102 and the HG component 104/TS component 106. In some embodiments, the underfill material 146 and the underfill material 152 may have a same material composition, while in other embodiments, the underfill materials 146 and 152 may have different material compositions.

As illustrated in FIG. 1, and others of the accompanying drawings, conductive contacts 156 may be disposed at the first face 149 of the package substrate 102, and solder balls 158 may be disposed thereon. Conductive pathways (not shown) in the package substrate 102 may electrically couple the conductive contacts 162 to the conductive contacts 142, the conductive contacts 162 to the conductive contacts 156, and/or the conductive contacts 142 to the conductive contacts 156. These conductive pathways may also conductively couple any elements embedded in the package substrate 102 (not shown) to any of the conductive contacts. In the IC assembly 150 of FIG. 1, the IC package 100 is illustrated as coupled to a circuit board 108 (e.g., a motherboard); in particular, the conductive contacts 156 may be electrically coupled to conductive contacts 160 of the circuit board 108 by the solder balls 158 (e.g., for a ball grid array (BGA) package), but any suitable interconnects may be used (e.g., pins in a pin grid array (PGA) package or lands in a land grid array (LGA) package). In other IC assemblies, an IC package 100 (e.g., in accordance with any of the embodiments disclosed herein) may be coupled to another IC package, a package interposer, or any other suitable support that may take the place of the circuit board 108. Further, although the IC package 100 of FIG. 1 (and others of the accompanying drawings) includes the components 104 and 106 coupled directly to a package substrate 102, in any of the embodiments disclosed herein, an intermediate component may be disposed between the components 104/106 and the package substrate 102 (e.g., an interposer, a silicon bridge, an organic bridge, etc.). In such embodiments the interposer, silicon bridge, organic bridge, etc., may serve as the package substrate 102.

The IC package 100 may further include a mold compound 112 disposed around the HG component 104 and the TS component 106, a heat spreader 114 above the HG component 104 and the TS component 106, and a high thermal conductivity (HTC) material 110 between the HG component 104 and the heat spreader 114. As shown in FIG. 1, the mold compound 112 may be present between the HG component 104 and the TS component 106, and also between the TS component 106 and the heat spreader 114. The mold compound 112 may have a lower thermal conductivity than the heat spreader 114, and a lower thermal conductivity than the HTC material 110; the term "high thermal conductivity" is used to describe the material 110 to indicate that the material 110 has a relatively higher thermal conductivity than the mold compound 112. In some embodiments, the mold compound 112 may include an epoxy matrix with one or more filler materials (e.g., silica). In some embodiments, the HTC material 110 may include a metal (e.g., copper or aluminum), silicon and carbon (e.g., in the form of silicon carbide), matrices of copper and silicon and carbon (e.g., in the form of silicon carbide), matrices of copper and diamond, or any of the thermal interface material (TIM) materials disclosed herein. The thermal conductivity of the HTC material 110 may be higher than, or lower than, the thermal conductivity of the heat spreader 114. The heat spreader 114 may have high thermal conductivity, and may facilitate the spread of heat away from the HG component 104 (and toward the heat sink 118, as discussed below).

In the IC package 100 of FIG. 1, the presence of the HTC material 110 creates a thermal pathway for heat to be transferred away from the HG component 104 to the heat spreader 114, while the mold compound 112 provides a thermal barrier between the TS component 106 and the HG component 104, between the TS component 106 and the HTC material 110, and between the TS component 106 and the heat spreader 114. Thus, the thermal arrangement of FIG. 1 may help insulate the TS component 106 from heat generated by and conducted through other portions of the IC package 100, allowing the thermal performance of the TS component 106 to stay within a desired range.

Figure 2:
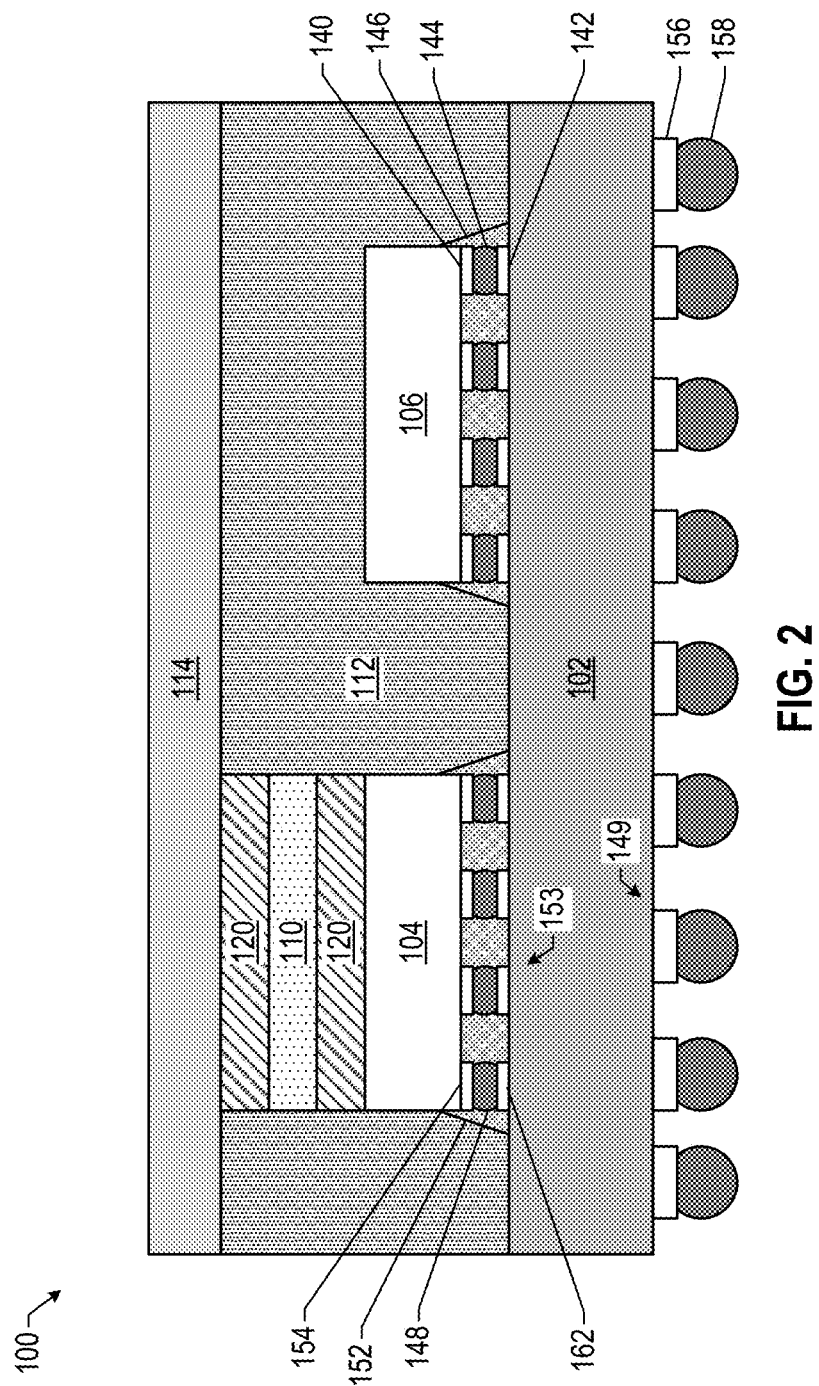
FIGS. 2-22 are side, cross-sectional views of IC packages with example thermal management arrangements, in accordance with various embodiments.
Figure 3:
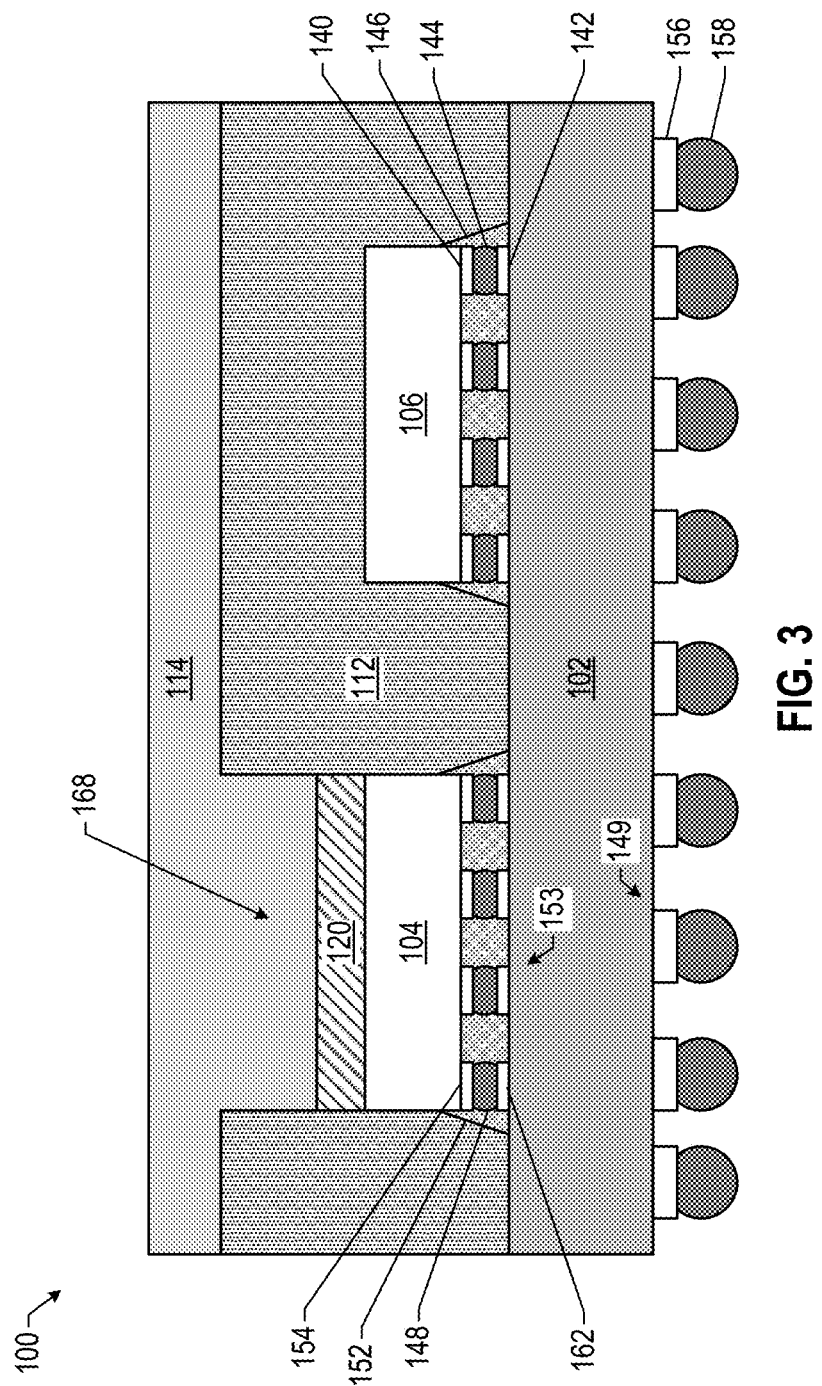
Figure 21:
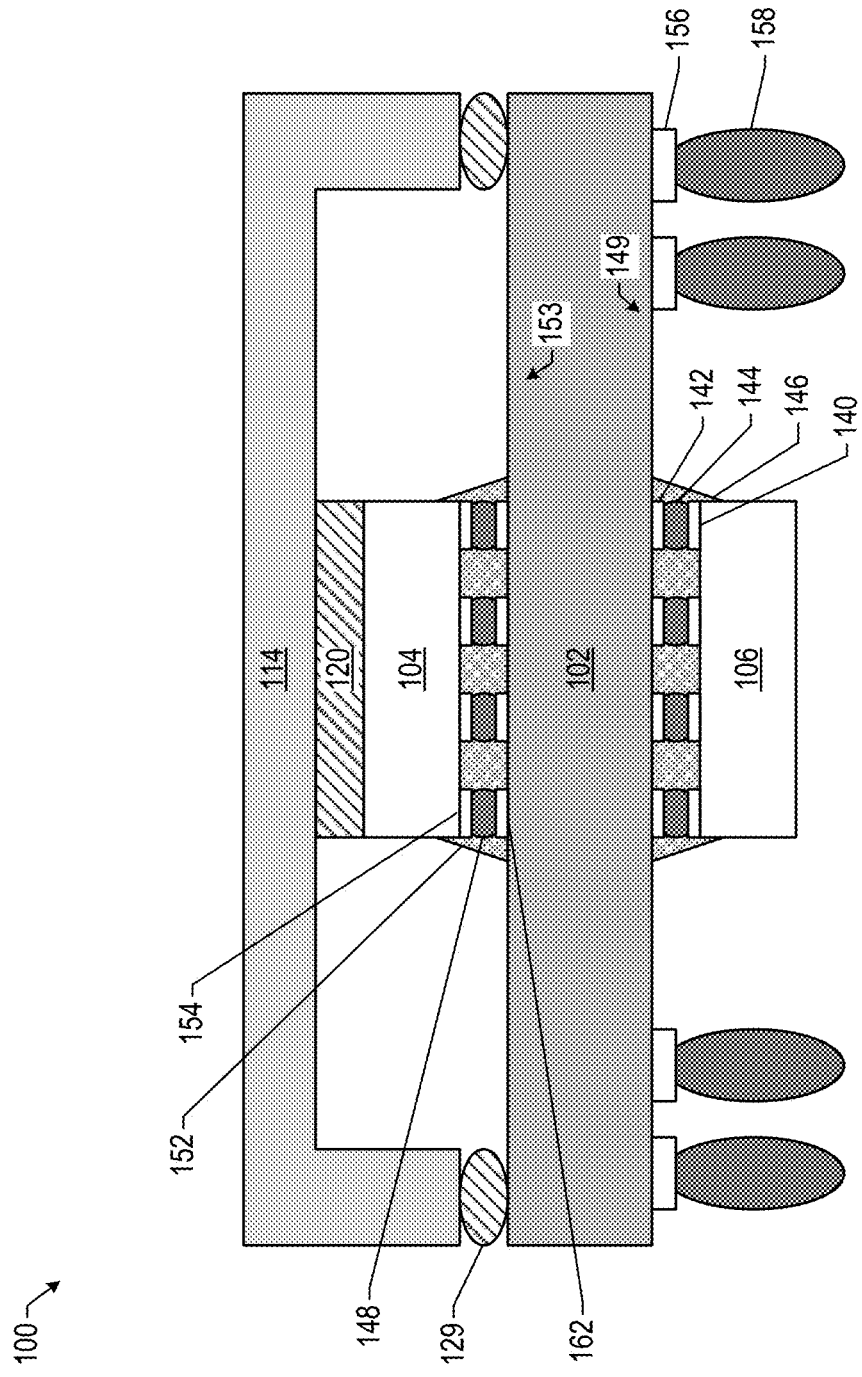

The heat spreader 114 illustrated in FIG. 1 (and others of the accompanying figures) is shown as substantially planar above the rest of the IC package 100, but in any of the embodiments disclosed herein, the heat spreader 114 may include leg portions that extend toward the package substrate 102 and are secured to the package substrate 102 (e.g., as illustrated in FIG. 21 and discussed below) and/or pedestals, ribs, or other three-dimensional features (e.g., as illustrated in FIG. 3 and discussed below). In some embodiments, the heat spreader 114 may be formed in situ above the rest of the IC package 100 by plating, additive manufacturing, or another technique, while in other embodiments, the heat spreader 114 may be separately manufactured (e.g., by stamping) and then brought into thermal contact with the rest of the IC package 100. In the latter embodiments, a TIM (not shown in FIG. 1, but discussed below with reference to FIG. 2, for example) may be present between the rest of the IC package 100 and at least a portion of the heat spreader 114. In some embodiments, the heat spreader 114 may include copper, aluminum, or nickel. In some embodiments, the heat spreader 114 may include copper plated with nickel (e.g., a layer of nickel having a thickness between 5 microns and 10 microns). In some embodiments, the heat spreader 114 may include nickel-plated aluminum. In some embodiments, the heat spreader 114 may include ceramics with good thermal conductivity (e.g., ceramics including diamond, silicon carbide, or aluminum nitride), or any combination of the materials discussed herein.

The dimensions of the elements of the IC package 100 of FIG. 1 (and others of the accompanying figures) may take any suitable values. For example, in some embodiments, a height 135 of the HG component 104 (e.g., a PA die) may be between 100 microns and 800 microns. In some embodiments, a width 131 of the HG component 104 may be between 0.5 millimeters and 10 millimeters (e.g., between 1 millimeter and 5 millimeters). In some embodiments, a height 137 of the TS component 106 (e.g., an AWR die) may be between 100 microns and 800 microns. In some embodiments, a width 133 of the TS component 106 may be between 0.5 millimeters and 10 millimeters (e.g., between 1 millimeter and 5 millimeters). In some embodiments, a distance 143 between the HG component 104 and the TS component 106 may be less than 5 millimeters (e.g., between 0.1 millimeter and 5 millimeters). In some embodiments, a thickness 197 of a heat spreader 114 may be between 50 microns and 3 millimeters (e.g., between 250 microns and 1 millimeter when the heat spreader 114 is formed in situ, or between 0.5 millimeters and 3 millimeters when the heat spreader 114 is separately manufactured). In some embodiments, a thickness 141 of the mold compound 112 between the TS component 106 and the heat spreader 114 may be greater than 10 microns (e.g., greater than 50 microns).

The IC assembly 150 of FIG. 1 also includes a heat sink 118 and a TIM 116 between the heat sink 118 and the IC package 100. The TIM 116 may aid in the transfer of heat from the IC package 100 (e.g., from the heat spreader 114) to the heat sink 118, and the heat sink 118 may be designed to readily dissipate heat into the surrounding environment, as known in the art (e.g., using fins, as shown). In some embodiments, the TIM 116 may be a polymer TIM or a solder TIM. Any of the IC packages 100 disclosed herein may be part of an IC assembly 150 including a heat sink 118 and a TIM 116.

FIG. 1 illustrates an IC assembly 150 including an IC package 100; any of the other IC packages 100 disclosed herein may be incorporated into an IC assembly like the IC assembly 150. Further, the subsequent drawings may include a number of elements that are also included in FIG. 1 or other drawings; any of these elements may take any suitable ones of the forms of those elements discussed herein with reference to any other drawing, and vice versa, and a discussion of these elements may not be repeated.

FIG. 2 illustrates an IC package 100 that is similar to the IC package 100 of FIG. 1, but in which a TIM 120 is present between the HTC material 110 and the HG component 104, as well as between the HTC material 110 and the heat spreader 114. Such an embodiment may be appropriate when the HTC material 110 is separately manufactured or prepared, and then positioned above the HG component 104 (e.g., using a pick-and-place tool). In other embodiments in which the HTC material 110 is plated or additively manufactured directly on top of the HG component 104 (not shown in FIG. 2), a TIM 120 may only be present between the HTC material 110 and the heat spreader 114, not between the HTC material 110 and the HG component 104. In some embodiments, the HTC material 110 may be a piece of foil (e.g., a metal foil), and may have a thickness between 50 microns and 300 microns. The TIM 120 of FIG. 2 may include a polymer TIM, a solder TIM, or a combination thereof. A solder TIM 120 may include an indium-based solder, such as a pure indium solder or an indium alloy solder (e.g., an indium-tin solder, an indium-silver solder, an indium-gold solder, an indium-nickel solder, or an indium-aluminum solder). In embodiments in which the TIM 120 includes a solder TIM, the other elements of the IC package 100 that contact the TIM 120 (e.g., the HG component 104, the HTC material 110, and/or the heat spreader 114) may have an adhesion material region (not shown) facing the TIM 120. The adhesion material region may serve to wet the TIM 120, and may include gold, silver, titanium, nickel, and/or indium.

FIG. 3 illustrates an IC package sharing many characteristics with the IC packages 100 of FIGS. 1 and 2, but in which the heat spreader 114 includes a pedestal 168 that extends down toward the HG component 104. The pedestal 168 may be a feature that is stamped into the heat spreader 114 when the heat spreader 114 is manufactured, or the heat spreader 114 (including the pedestal 168) may be additively manufactured or otherwise formed. A TIM 120, which may take the form of any of the TIMs 120 disclosed herein, may be disposed between the pedestal 168 and the HG component 104 to facilitate heat transfer between the HG component 104 and the heat spreader 114.

Figure 4:
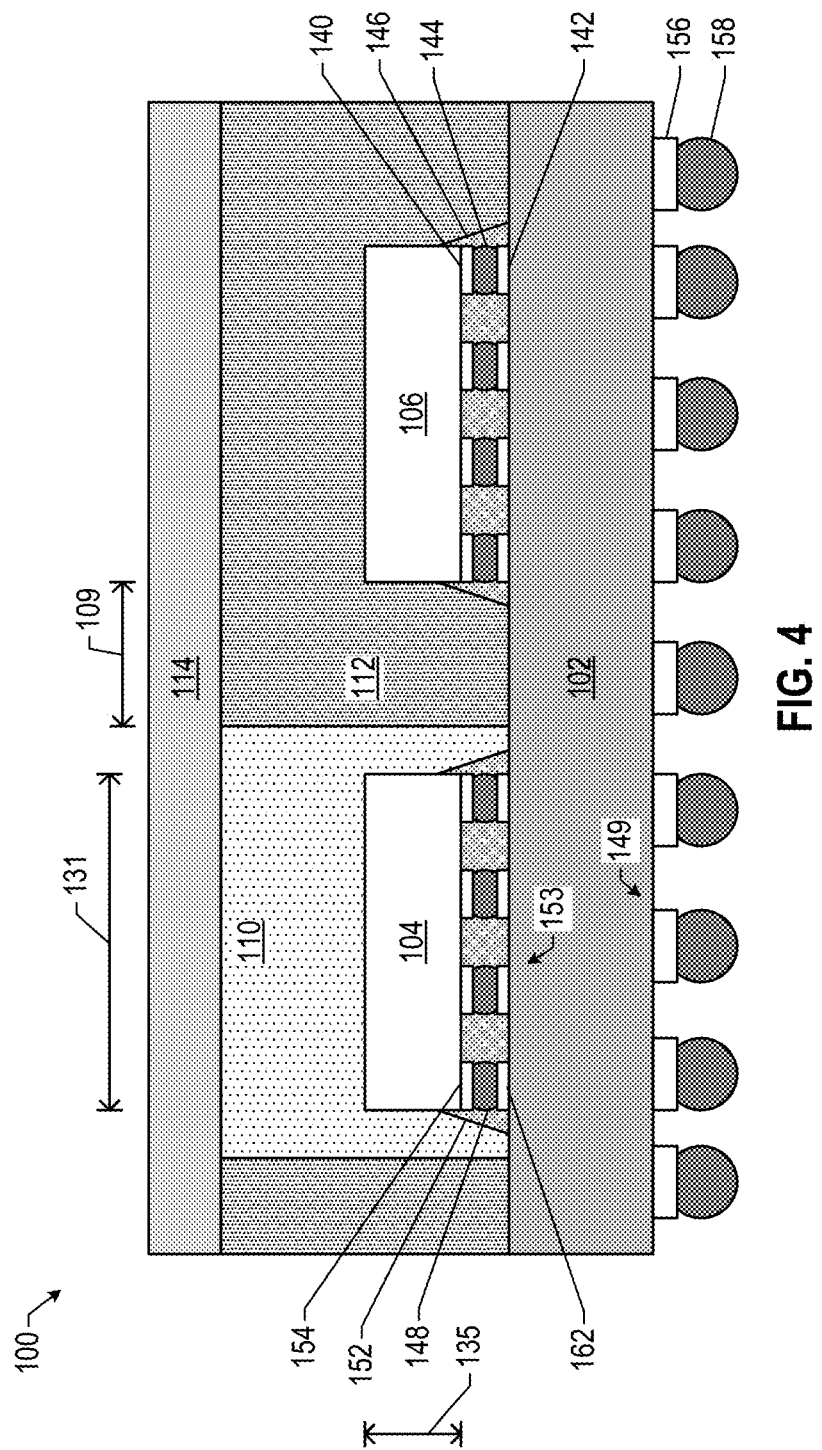
Figure 5:
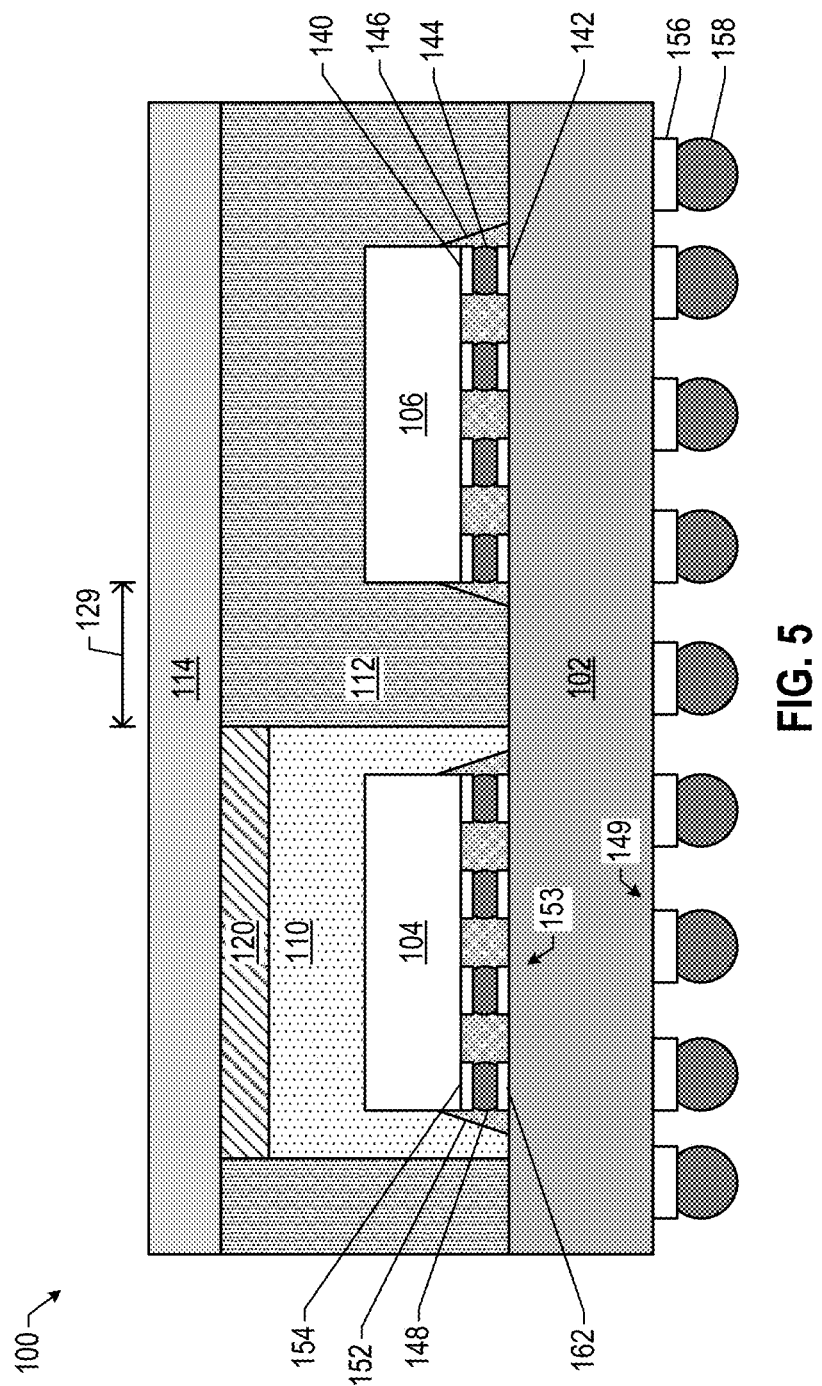

FIG. 4 illustrates an IC package 100 in which the HTC material 110 extends between the HG component 104 and the heat spreader 114 (as discussed above with reference to FIG. 1) but also extends laterally around the HG component 104 (including into the volume between the HG component 104 and the TS component 106). As shown in FIG. 4, in some embodiments, the HTC material 110 may be conformal over the HG component 104 (and the underfill material 152). In some embodiments, a TIM (not shown) may be present between the HG component 104 and the HTC material 110 and/or between the HTC material 110 and the heat spreader 114 (e.g., as shown in FIG. 5). An embodiment like that of FIG. 4 may be particularly advantageous when the width 131 of the HG component 104 is comparable to or less than the height 135; placing the HTC material 110 around the side faces of such an HG component 104 may allow an ample amount of heat to be drawn away from the HG component 104 via the side faces. The HTC material 110 may be spaced away from the TS component 106 by intervening mold compound 112 to preserve some thermal isolation of the TS component 106. In some embodiments, the distance 109 between the HTC material 110 and the TS component 106 may be between greater than 50 microns (e.g., greater than 100 microns). As noted above, FIG. 5 illustrates an IC package 100 like the IC package 100 of FIG. 4, but in which a TIM 120 is present between the HTC material 110 and the heat spreader 114. Such an embodiment may be particularly advantageous when the heat spreader 114 is separately manufactured, as noted above.

Figure 6:
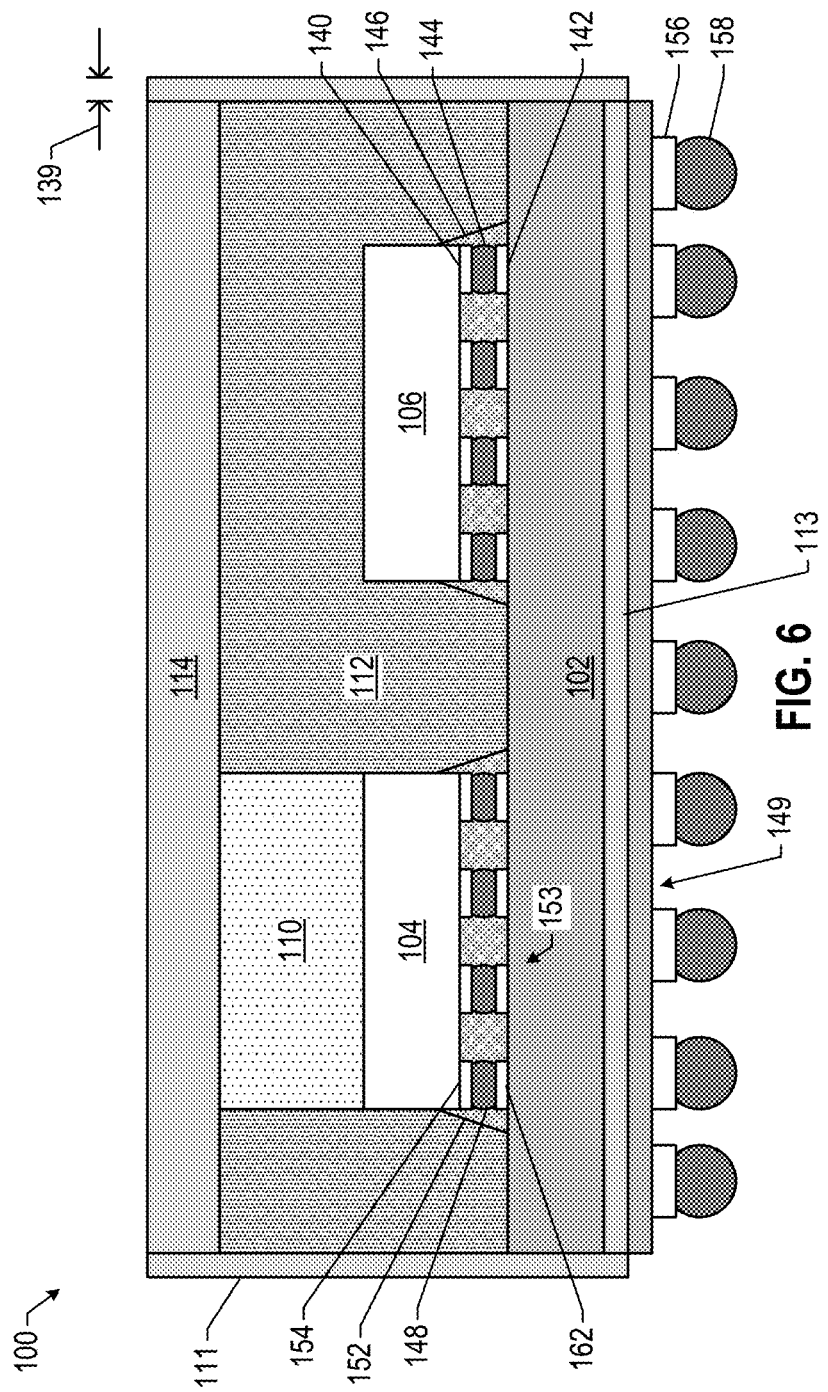

FIG. 6 illustrates an IC package 100 similar to the IC package 100 of FIG. 1, but in which an electrically conductive coating 111 is in conductive contact with the heat spreader 114 and with an electrically conductive plane 113 in the package substrate 102. In some embodiments, the plane 113 may be a ground plane. When the heat spreader 114 is electrically conductive, the heat spreader 114, the coating 111, and the plane 113 together may form an electromagnetic shield around the HG component 104, the TS component 106, and any other components therein. Such electromagnetic shielding may advantageously mitigate the effects of electromagnetic interference on the HG component 104, the TS component 106, and any other components therein. In some embodiments, the thickness 139 of the coating 111 may be less than 5 microns (e.g., less than 2 microns). The coating 111 may include any suitable metal (e.g., aluminum, copper, tin, or combinations thereof), and in some embodiments, may include an electrically conductive paste (e.g., a silver-filled epoxy). In some embodiments, the coating 111 may be sprayed or rolled onto the side faces of the rest of the IC package 100, and may make contact with exposed side faces of the plane 113 at the sides of the package substrate 102. Although the electromagnetic shield structure of FIG. 6 is illustrated in conjunction with the thermal management arrangements of FIG. 1, the electromagnetic shield structure of FIG. 6 may be used in conjunction with any of the thermal management arrangements in any of the IC packages 100 disclosed herein.

Figure 7:
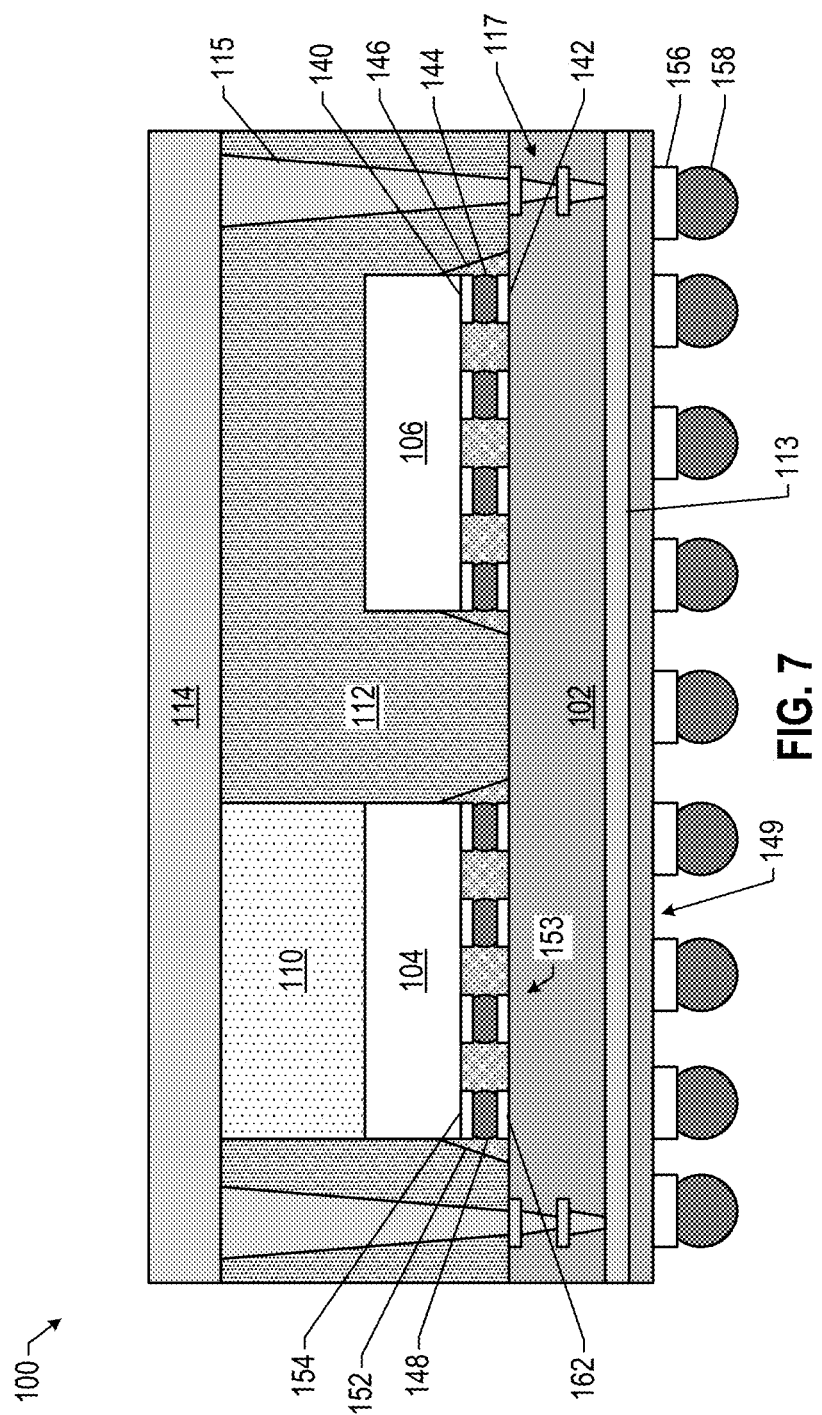

FIG. 7 illustrates an IC package 100 similar to the IC package 100, but in which electrically conductive through-mold vias (TMVs) 115 are in conductive contact with the heat spreader 114 and with an electrically conductive plane 113 in the package substrate 102 by way of vias 117 in the package substrate. When the heat spreader 114 is electrically conductive, the heat spreader 114, the TMVs 115, the vias 117, and the plane 113 together may form an electromagnetic shield around the HG component 104, the TS component 106, and any other components therein, like that illustrated in FIG. 6. In some embodiments, the TMVs 115 may include a conductive material (e.g., a metal, such as copper) and may have a tapered shape, narrowing toward the package substrate 102, as shown. The vias 117 may also include a conductive material (e.g., a metal, such as copper), and may have a tapered shape, narrowing toward the plane 113. As shown, the vias 117 may be arranged in a stack, with intervening pads, as known in the art. Although the electromagnetic shield structure of FIG. 7 is illustrated in conjunction with the thermal management arrangements of FIG. 1, the electromagnetic shield structure of FIG. 7 may be used in conjunction with any of the thermal management arrangements in any of the IC packages 100 disclosed herein.

In some embodiments, an IC package 100 may include a cooling device. Such a cooling device may be active (in that power must be supplied to the cooling device for it to perform a cooling function) or passive (in that cooling may occur without the need for a power supply). An example of an active cooling device that may be included in an IC package 100 is a thermoelectric cooler (TEC), discussed further below with reference to FIG. 26, and an example of a passive cooling device that may be included in an IC package 100 is a vapor chamber, discussed further below with reference to FIGS. 27-42.

Figure 8:
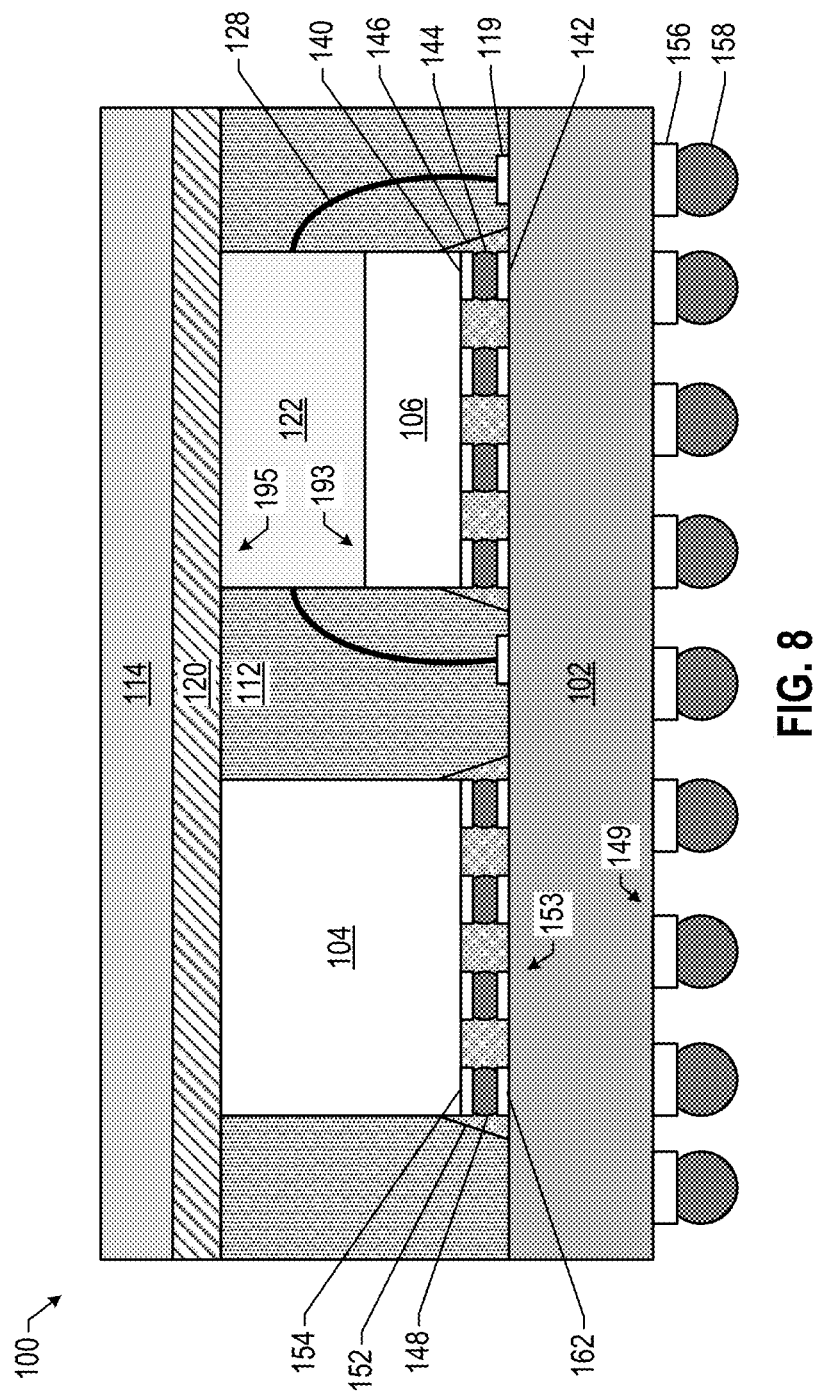

FIG. 8 illustrates an IC package 100 having a cooling device 122 between the TS component 106 and the heat spreader 114; a layer of TIM 120 is disposed between the cooling device 122/mold compound 112 and the heat spreader 114. In some embodiments, the cooling device 122 may be an active device (e.g., a TEC), and power may be supplied to the cooling device 122 via wirebonds 128 from the cooling device 122 to conductive contacts 119 at the second face 153 of the package substrate 102. In embodiments in which the cooling device 122 is a passive device (e.g., a vapor chamber), no wirebonds 128 or conductive contacts 119 may be present. During operation of the IC package 100, the cooling device 122 may draw heat away from the face 193 (proximate to the TS component 106) and emit that heat at the face 195 (proximate to the heat spreader 114). When the cooling device 122 includes a TEC, the cooling device 122 may perform this heat transfer function when it is turned on, and when it is turned off, the cooling device 122 may have a high thermal resistance (e.g., may have an overall thermal conductivity lower than the TIM 120, lower than the heat spreader 114, and/or lower than the mold compound 112). This high thermal resistance may provide thermal isolation of the TS component 106, and thus a TEC cooling device 122 may provide thermal benefits in both the on- and off-state. If a TEC cooling device 122 were instead located between the HG component 104 and the heat spreader 114, the low thermal conductivity of the TEC cooling device 122 in the off-state would block the heat pathway from the HG component 104 to the heat spreader 114, causing excessive heating of the HG component 104 and increasing the risk of undesirably heating the TS component 106. FIG. 8 does not depict a TIM between the TS component 106 and the cooling device 122; in some such embodiments, the cooling device 122 may be fabricated directly on top of the TS component 106, while in other embodiments, a TIM may be present to provide an interface between the TS component 106 and a separately fabricated cooling device 122.

Figure 9:
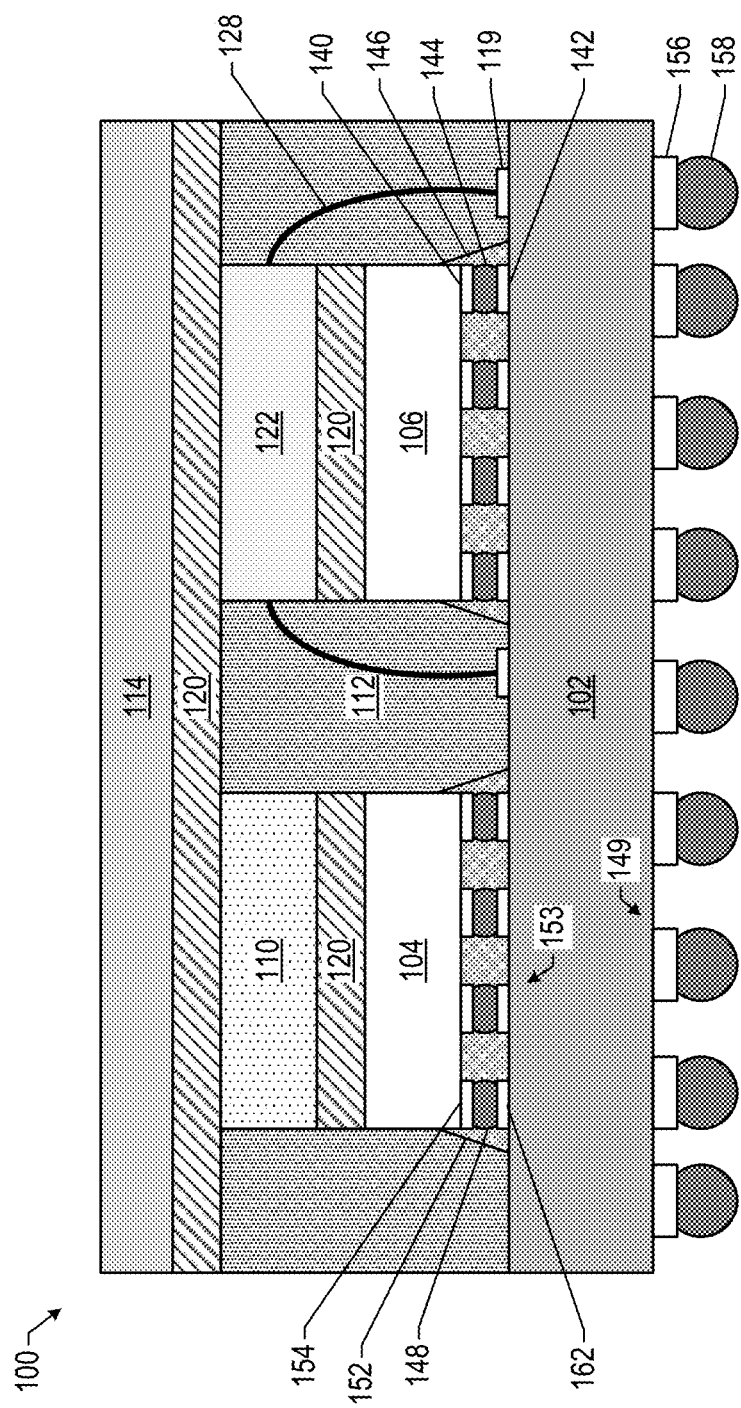

In FIG. 8, the HG component 104 is shown as having a greater height than the TS component 106 so that the HG component 104 may contact the TIM 120, but this is simply illustrative, and the HG component 104 and TS component 106 may have any relative heights, with any height differences accommodated by intervening TIM 120, HTC material 110, and/or pedestals 168, as discussed above. For example, FIG. 9 illustrates an IC package 100 also having a cooling device 122 between the TS component 106 and the heat spreader 114, and further including an HTC material 110 between the HG component 104 and the heat spreader 114, as well as additional TIM 120 between the HG component 104 and the HTC material 110. FIG. 9 also illustrates a TIM 120 between the TS component 106 and the cooling device 122, but as discussed above with reference to FIG. 8, such a TIM 120 may or may not be present in an IC package 100.

Figure 10:
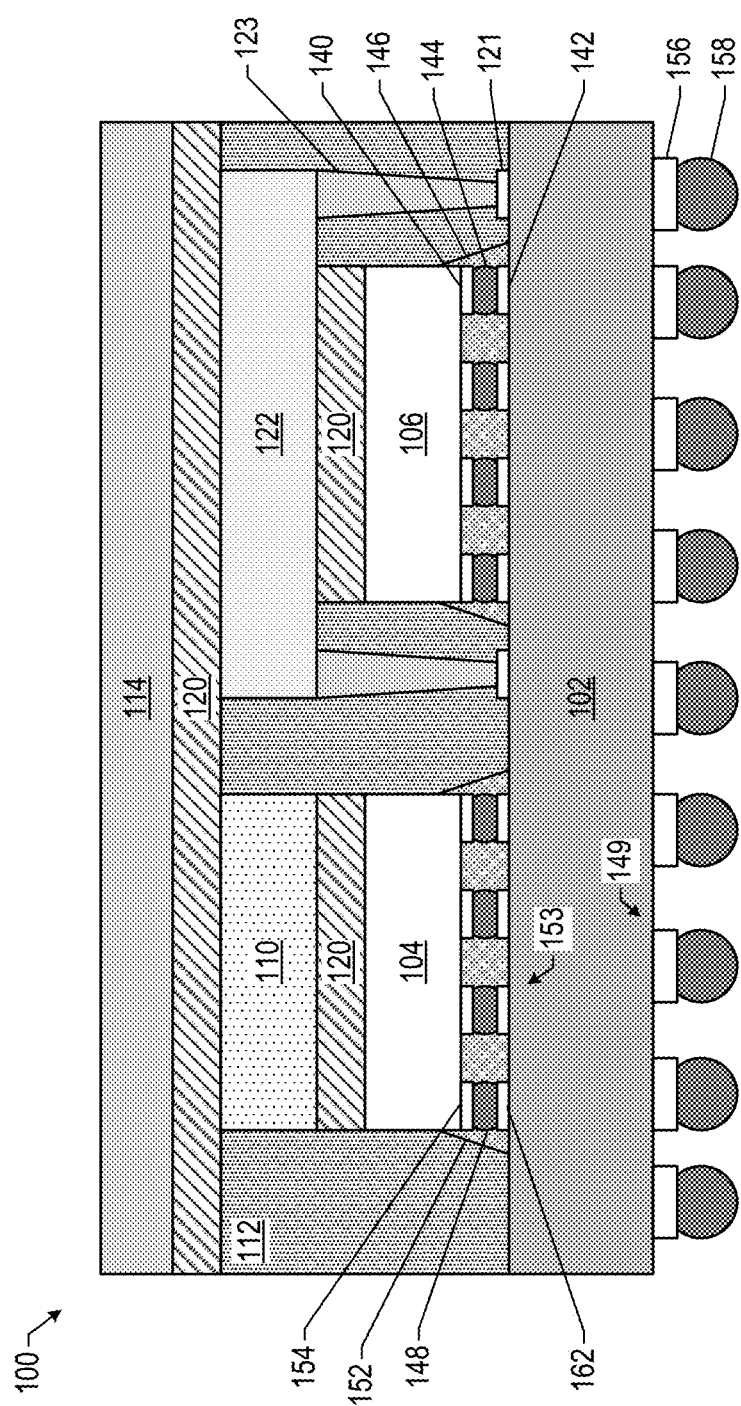

FIG. 10 illustrates an IC package 100 like the IC package 100 of FIG. 9, but in which electrical connections between the cooling device 122 and the package substrate 102 (when present) are provided by TMVs 123 through the mold compound 112 between the cooling device 122 and conductive contacts 121 of the package substrate 102, instead of through wirebonds 128. In some embodiments, the TMVs 123 may have a diameter between 50 microns and 500 microns. Electrical connections between the cooling device 122 and the package substrate 102 of FIG. 8 may also be made by TMVs 123, instead of by wirebonds 128.

Figure 11:
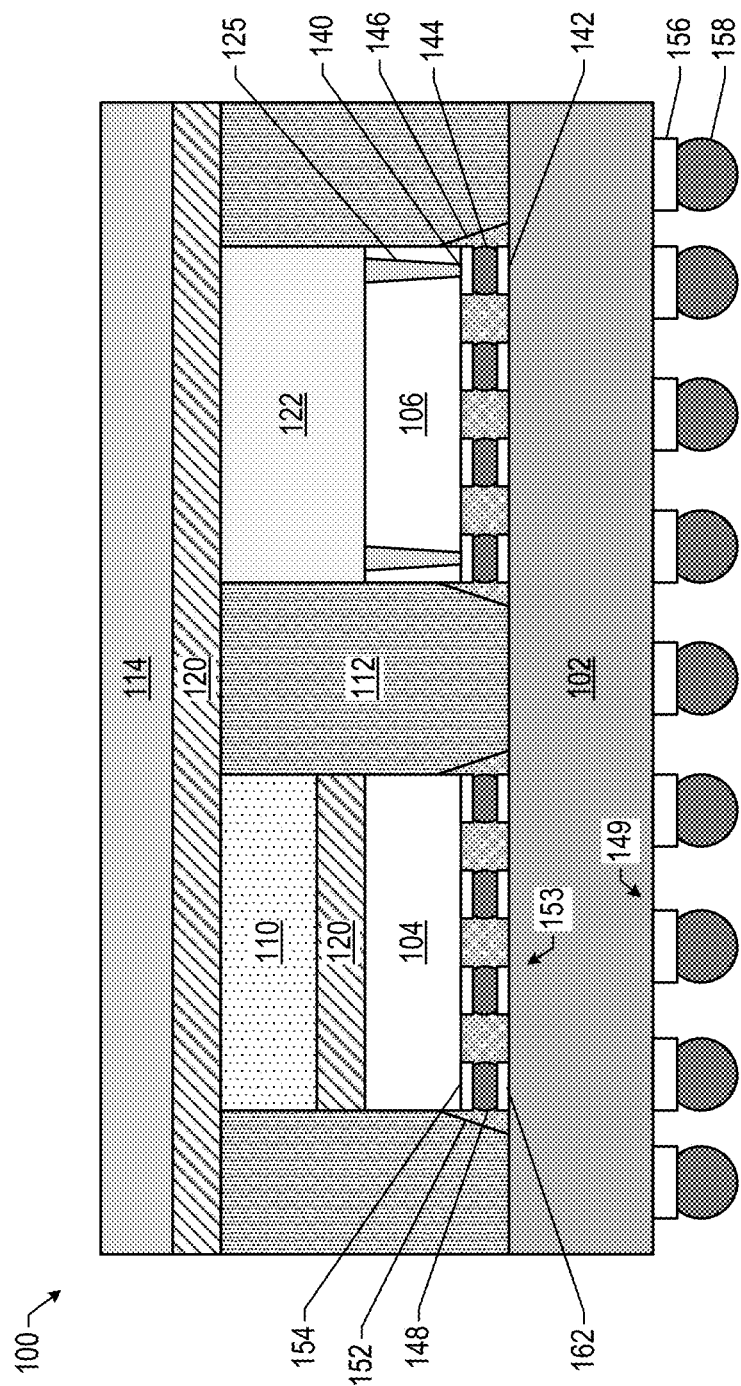

FIG. 11 illustrates an IC package 100 like the IC package 100 of FIGS. 9 and 10, but in which electrical connections between the cooling device 122 and the package substrate 102 (when present) are provided by electrical pathways 125 through the TS component 106. The electrical pathways 125 are shown in FIG. 11 as taking the form of vias, but this is simply for ease of illustration, and any suitable conductive structures may provide the electrical pathways 125. Electrical connections between the cooling device 122 and the package substrate 102 of FIG. 8 may also be made by electrical pathways 125 through the TS component 106, instead of by wirebonds 128.

Figure 12:
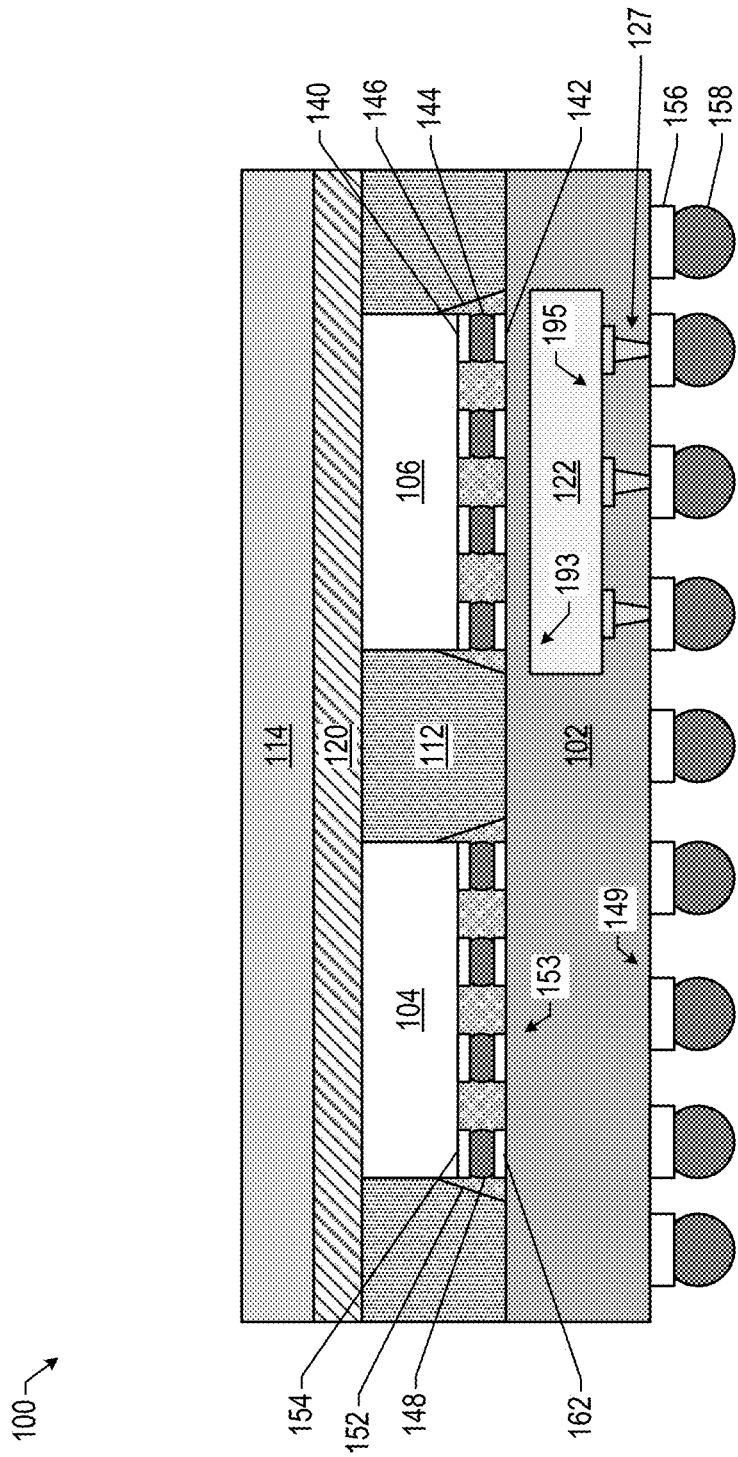

FIG. 12 illustrates an IC package 100 having a cooling device 122 embedded in the package substrate 102 in the shadow of the TS component 106. A layer of TIM 120 is disposed between the HG component 104/TS component 106 and the heat spreader 114. In some embodiments, the cooling device 122 may be an active device (e.g., a TEC), and power may be supplied to the cooling device 122 via conductive pathways (not shown) in the package substrate 102. In embodiments in which the cooling device 122 is a passive device (e.g., a vapor chamber), no such conductive pathways may be present. Thermal vias 127 may be disposed between the cooling device 122 and the first face 149 of the package substrate 102; these thermal vias 127 may include vias, pads, and/or lines in the package substrate 102, and may serve as thermal pathways to dissipate heat (and may not, for example, be coupled to any signal or power/ground pathways). In particular, during operation of the IC package 100, the cooling device 122 may draw heat away from the face 193 (proximate to the TS component 106) and emit that heat at the face 195 (proximate to the thermal vias 127). The thermal vias 127 may help transfer the heat to the first face 149 of the package substrate 102, where it may dissipate. Although FIG. 12 (and others of the accompanying drawings) illustrates the thermal vias 127 in contact with the face 195 of the cooling device 122, this need not be the case, and the thermal vias 127 may be spaced apart from the face 195 (e.g., by one or more intervening layers of the package substrate 102) while still performing their thermal function. In an embodiment in which heat transfer is desirable between the TS component 106 and the package substrate 102 (e.g., to the cooling device 122 in the package substrate 102), the underfill material 146 may be selected to have a higher thermal conductivity than the mold compound 112 and/or the underfill material 152 (e.g., the underfill material 146 may be an epoxy material with fillers having a higher thermal conductivity than fillers included in the mold compound 112 and/or the underfill material 152, such as aluminum oxide or boron nitride fillers). Further, thermal vias 127 (not shown) in the package substrate 102 may be located between the TS component 106 and the cooling device 122, and may also be located between the TS component 106 and the first face 149 of the package substrate 102 without being in a shadow of the cooling device 122 (e.g., as discussed below with reference to FIG. 16).

Figure 13:
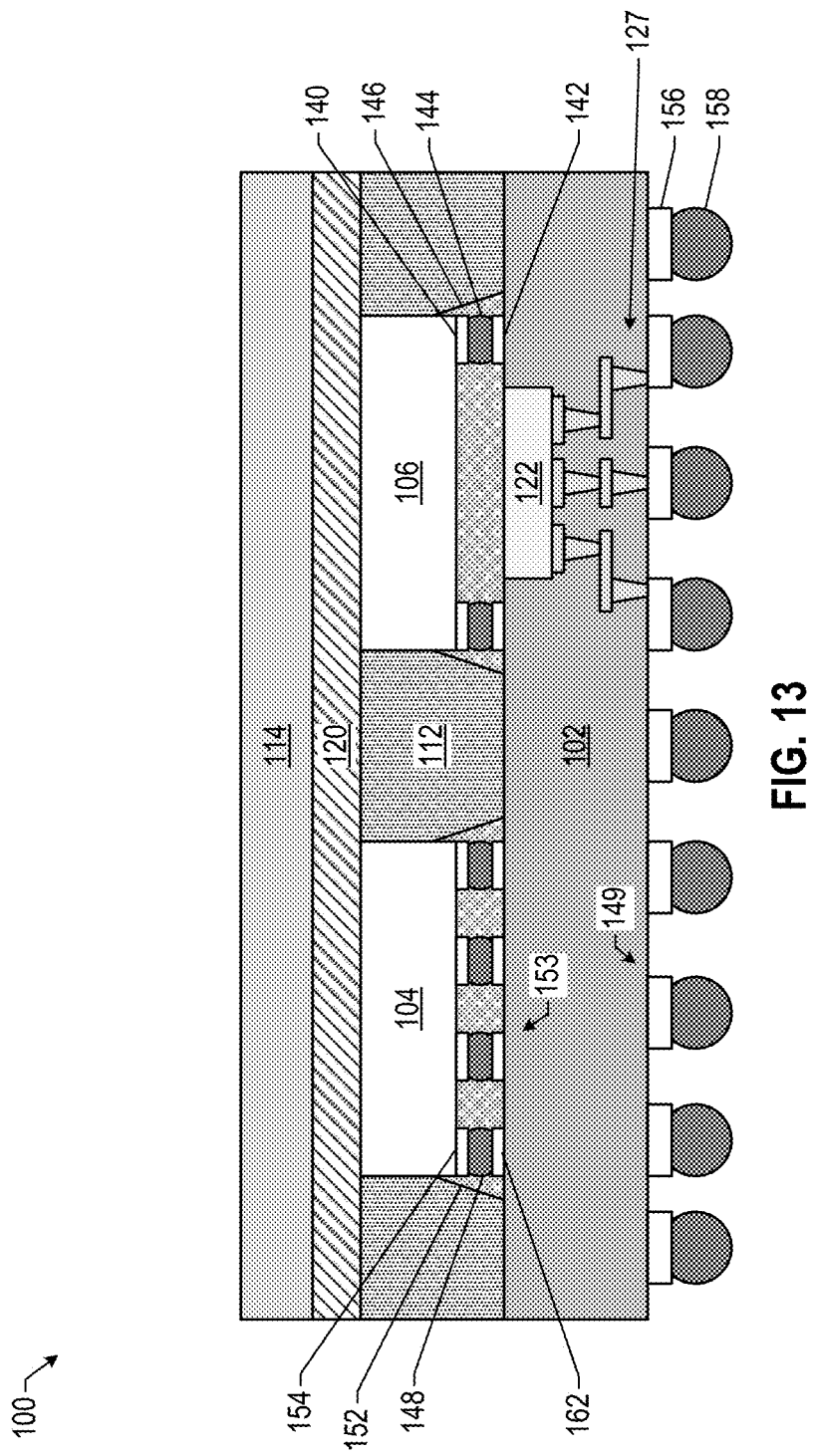

In the embodiment of FIG. 12, the cooling device 122 is spaced apart from the second face 153 of the package substrate 102 (e.g., by one or more intervening layers of the package substrate 102). In other embodiments, the cooling device 122 may be located at the second face 153 of the package substrate 102. For example, FIG. 13 illustrates an IC package 100 like the IC package 100 of FIG. 12, but in which the cooling device 122 (which may be an active or passive cooling device, as discussed above) has a top surface that is coplanar with the second face 153 of the package substrate 102; in other embodiments, a top surface of the cooling device 122 may be above the second face 153 of the package substrate 102. As discussed above with reference to FIG. 12, the embodiment of FIG. 13 may also include thermal vias 127 between the cooling device 122 and the first face 149 of the package substrate 102.

Figure 14:
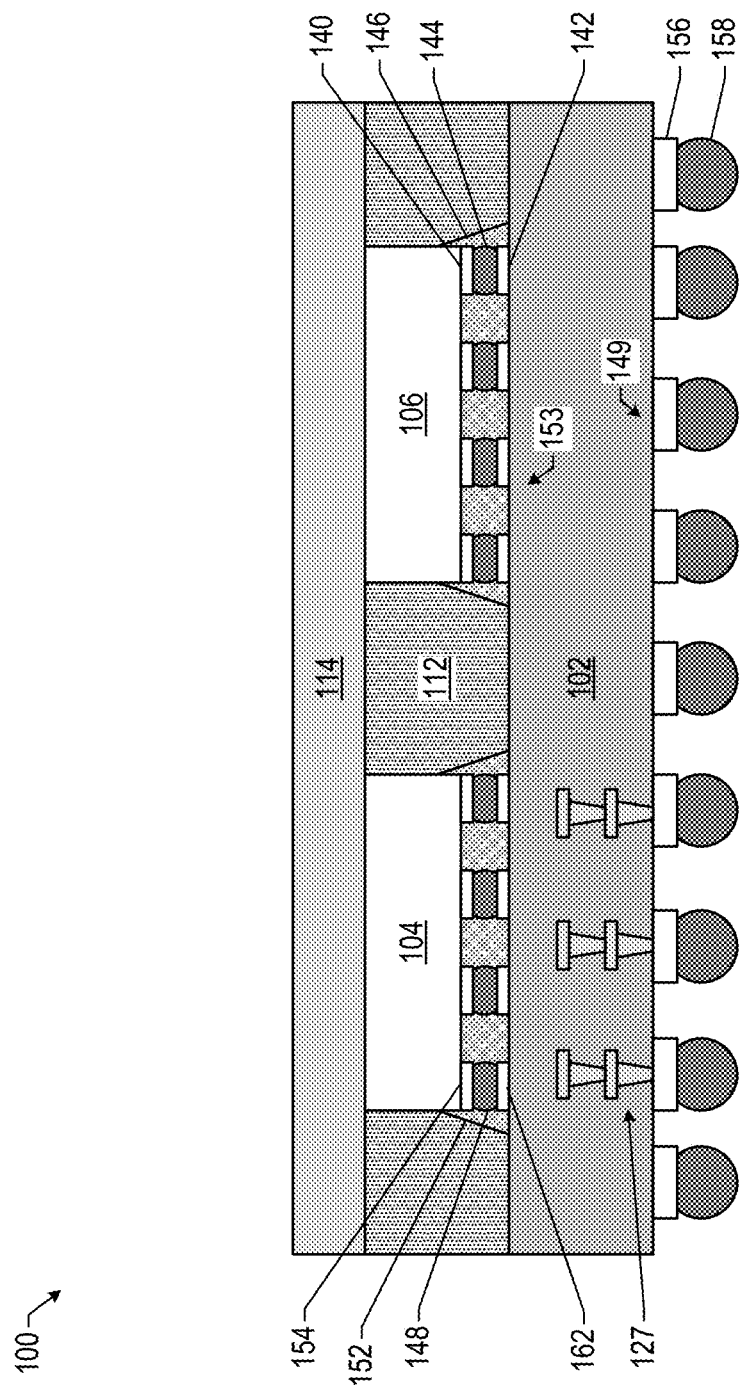

In some embodiments of the IC packages 100 disclosed herein, a thermal arrangement in an IC package 100 may include thermal management structures proximate to top and bottom faces of the HG component 104 (e.g., in addition to or instead of the thermal management structures proximate to a TS component 106, as described herein). For example, FIG. 14 illustrates an IC package 100 in which thermal vias 127 are disposed in the shadow of the HG component 104, between the HG component 104 and the first face 149 of the package substrate 102, to draw heat away from the bottom face of the HG component 104. The thermal vias 127 may be spaced apart from the second face 153 of the package substrate 102, as shown, or may begin at second face 153 of the package substrate 102. Additionally, a heat spreader 114 is located proximate to the top face of the HG component 104 (e.g., in direct contact with the top face of the HG component 104, as illustrated in FIG. 14), to draw heat away from the top face of the HG component. In an embodiment in which heat transfer is desirable between the HG component 104 and the package substrate 102 (e.g., to thermal vias 127 in the package substrate 102), the underfill material 152 may be selected to have a higher thermal conductivity than the mold compound 112 and/or the underfill material 146 (e.g., the underfill material 152 may be an epoxy material with fillers having a higher thermal conductivity than fillers included in the mold compound 112 and/or the underfill material 146, such as aluminum oxide or boron nitride fillers).

Figure 15:
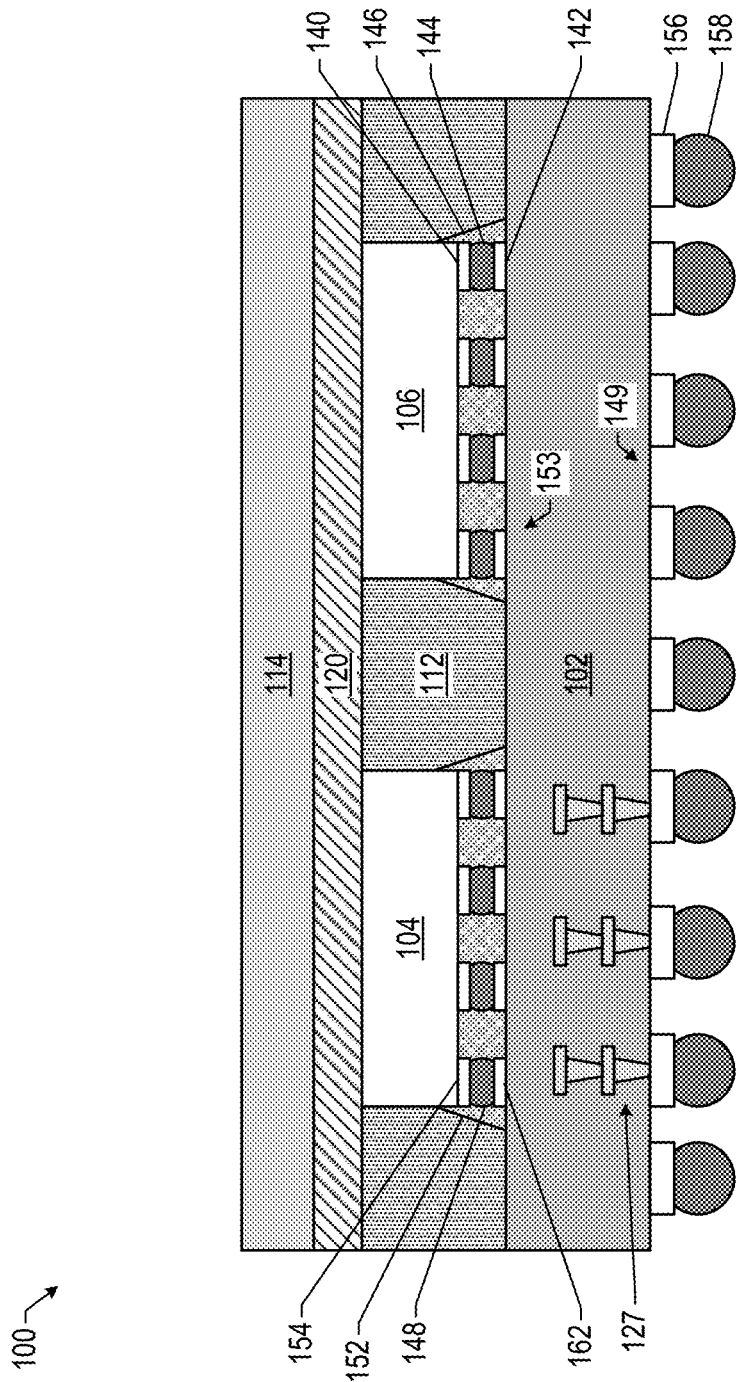

FIG. 15 illustrates an IC package 100 like the IC package 100 of FIG. 14, but in which a layer of TIM 120 is disposed between the HG component 104/TS component 106 and the heat spreader 114. In some embodiments, the TIM 120 may be present between the HG component 104 and the heat spreader 114 (to facilitate heat transfer from the HG component 104 to the heat spreader 114) but not between the TS component 106 and the heat spreader 114 (to help with thermal isolation of the TS component 106 from the heat spreader 114).

Figure 16:
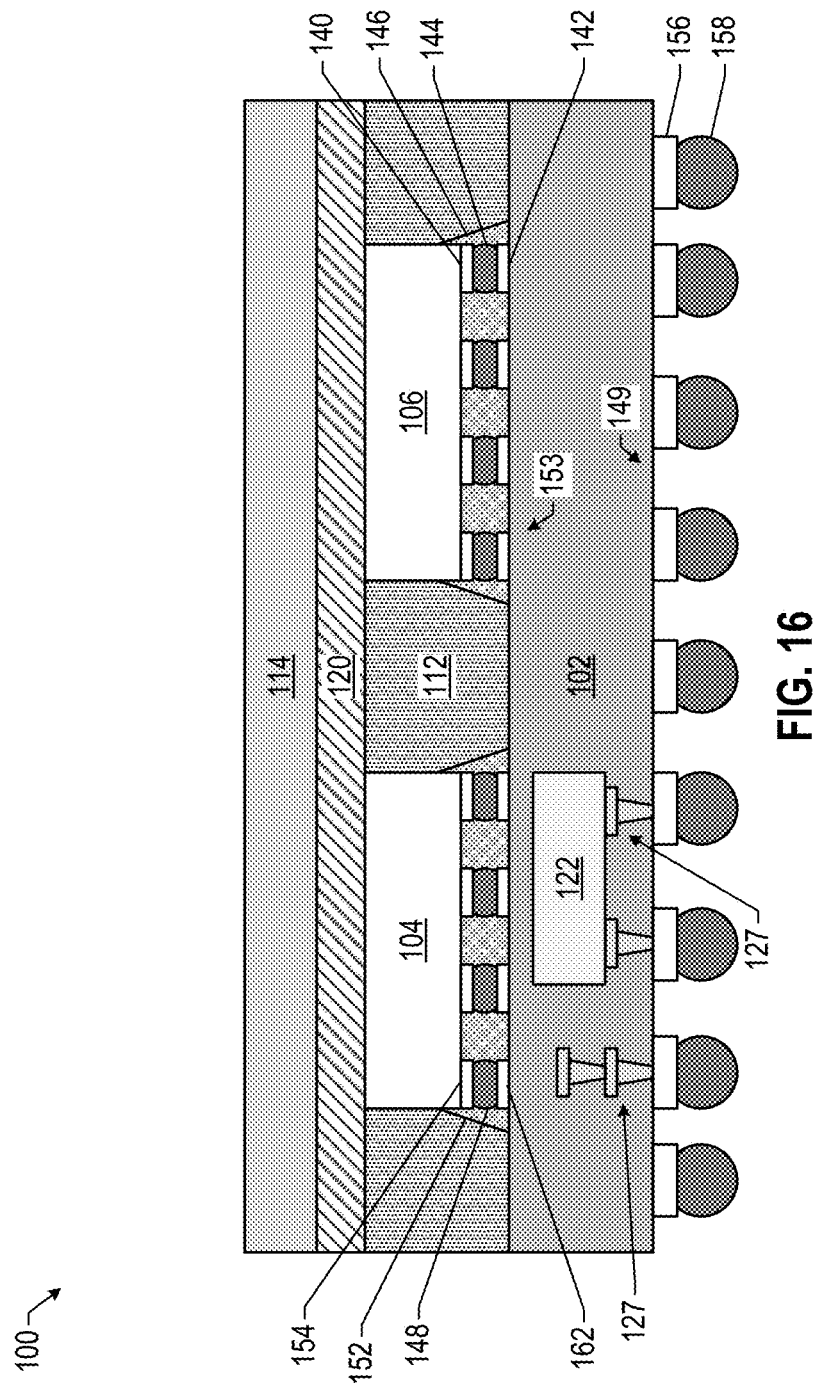

FIG. 16 illustrates an IC package 100 having a cooling device 122 (e.g., an active or passive device) embedded in the package substrate 102 in the shadow of the HG component 104. A layer of TIM 120 is disposed between the HG component 104/TS component 106 and the heat spreader 114. Thermal vias 127 may be disposed between the cooling device 122 and the first face 149 of the package substrate 102, and additional thermal vias 127 may be disposed between the HG component 104 and the first face 149 of the package substrate 102, but laterally offset from the cooling device 122 (as noted above with reference to FIG. 12). As discussed above, the underfill material 152 may be selected to have a higher thermal conductivity than the mold compound 112 and/or the underfill material 146, and the underfill material 146 may be selected to have a lower thermal conductivity than the mold compound 112 and/or the underfill material 152.

Figure 17:
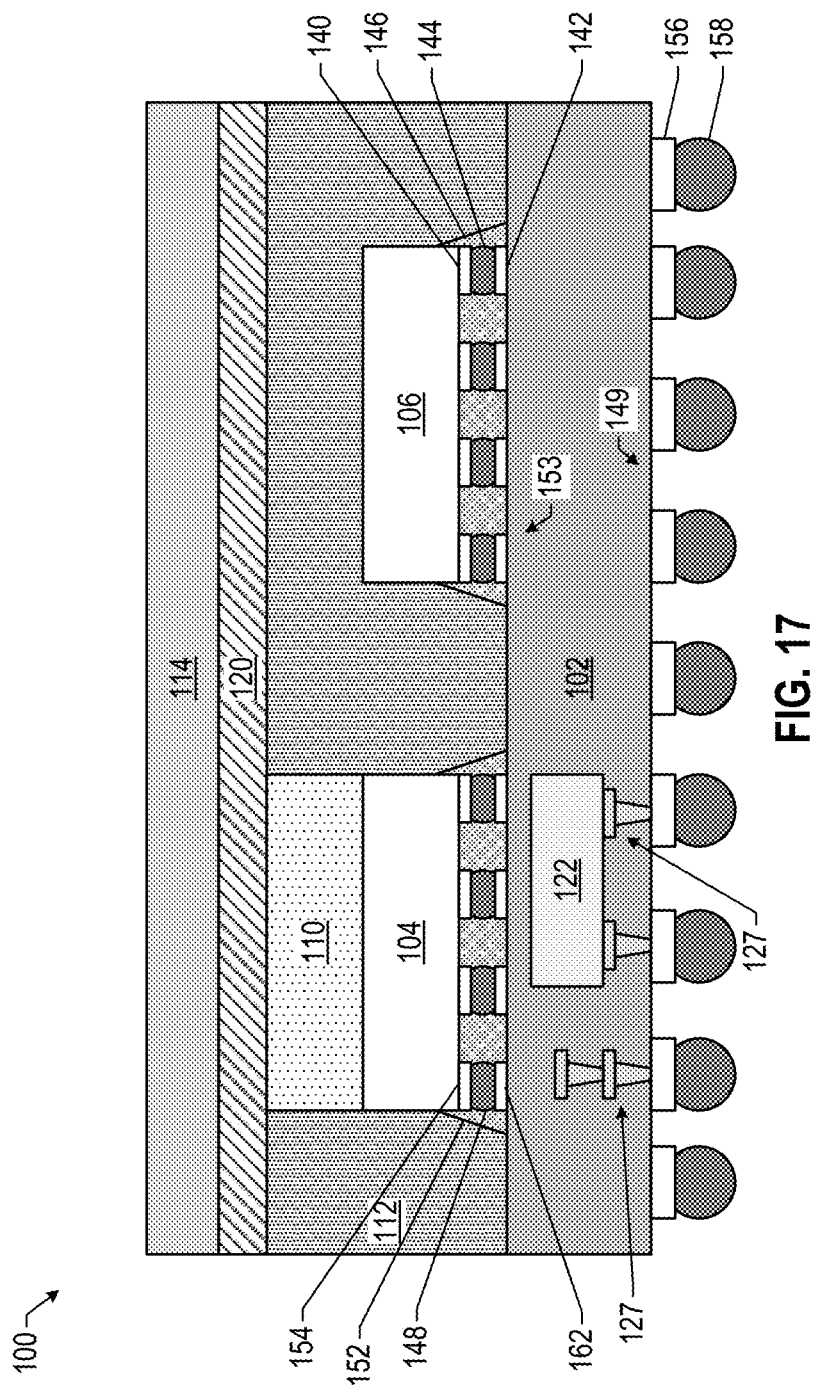

FIG. 17 illustrates an IC package 100 that is similar to the IC package 100 of FIG. 16, but which further includes an HTC material 110 between the HG component 104 and the heat spreader 114 (with mold compound 112 between the TS component 106 and the heat spreader 114), as discussed above with reference to FIG. 1. Including the HTC material 110 may enhance heat transfer from the top surface of the HG component 104 to the heat spreader 114 (via the TIM 120), and may make room for additional mold compound 112 between the TS component 106 and the heat spreader 114 (to provide further thermal isolation for the TS component 106). In some embodiments, a layer of TIM 120 (not shown) may be present between the HG component 104 and the HTC material 110. This is one example of a combination of the various embodiments illustrated herein; as noted above, any suitable ones of the embodiments disclosed herein may be combined to provide a thermal management arrangement within the scope of this disclosure.

Figure 18:
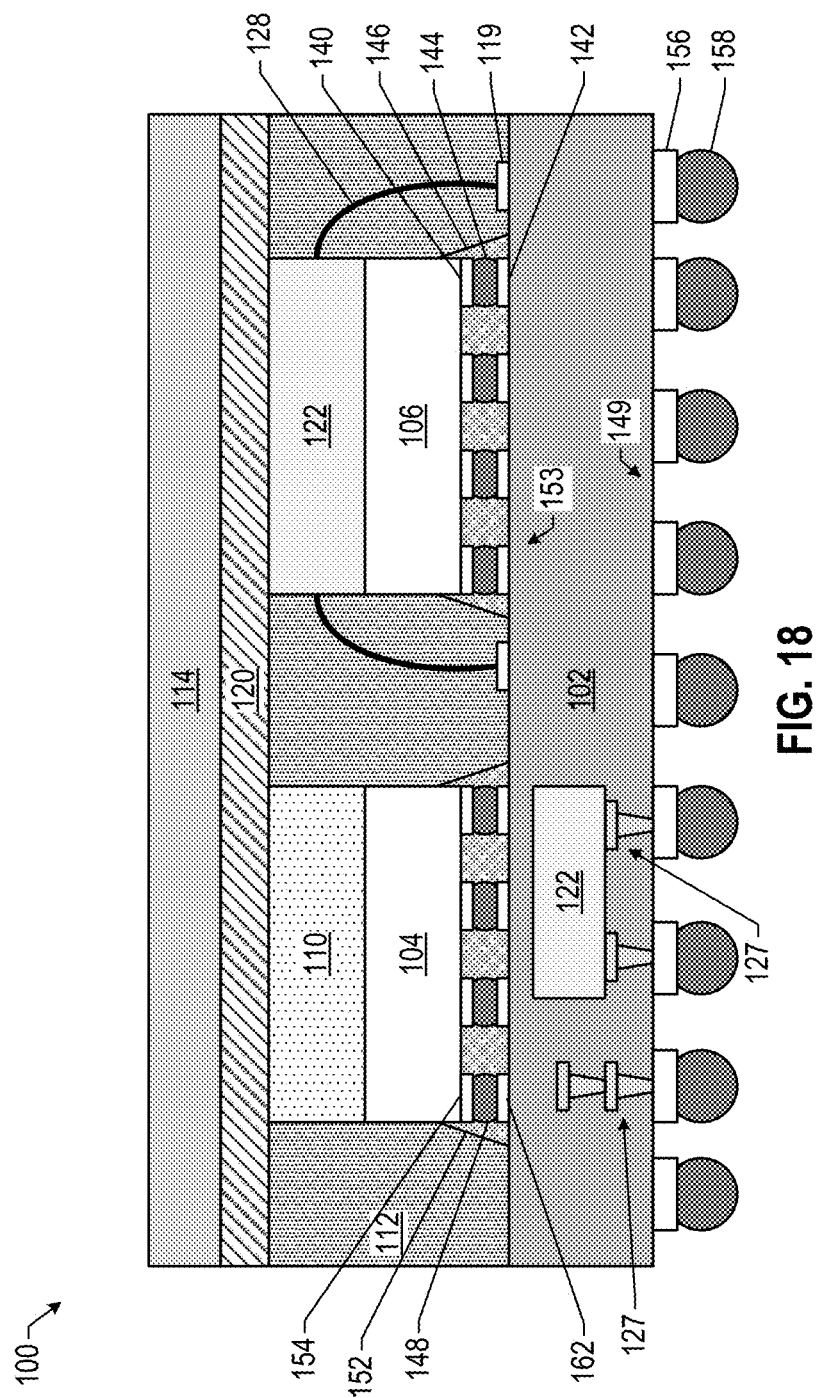

FIG. 18 illustrates an IC package 100 that is similar to the IC package 100 of FIG. 17, but which further includes a cooling device 122 between the TS component 106 and the heat spreader 114, as discussed above with reference to FIG. 8. Including the additional cooling device 122 between the TS component 106 and the heat spreader 114 may enhance heat removal from the TS component 106 (and, when the additional cooling device 122 is a TEC, may enhance thermal isolation between the TS component 106 and the HG component 104 when the TEC is off). In some embodiments, a layer of TIM 120 (not shown) may be present between the TS component 106 and the additional cooling device 122. This is another example of a combination of the various embodiments illustrated herein; as noted above, any suitable ones of the embodiments disclosed herein may be combined to provide a thermal management arrangement within the scope of this disclosure.

Figure 19:
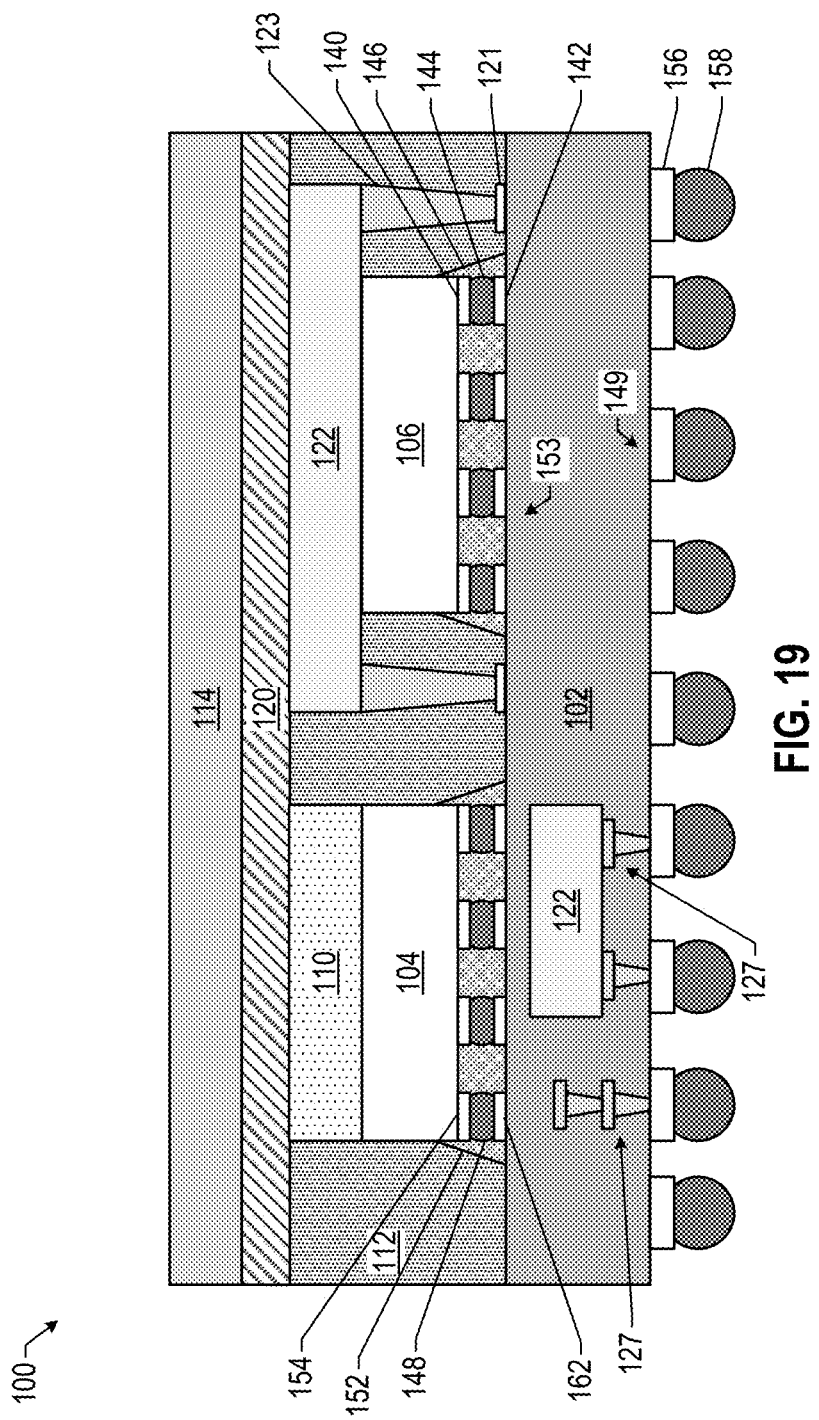

FIG. 19 illustrates an IC package 100 that is similar to the IC package 100 of FIG. 18, but in which electrical connections to the cooling device 122 above the TS component 106 are provided by TMVs 123 through the mold compound 112 between the cooling device 122 and conductive contacts 121 of the package substrate 102 (e.g., as discussed above with reference to FIG. 10), instead of through wirebonds 128.

Figure 20:
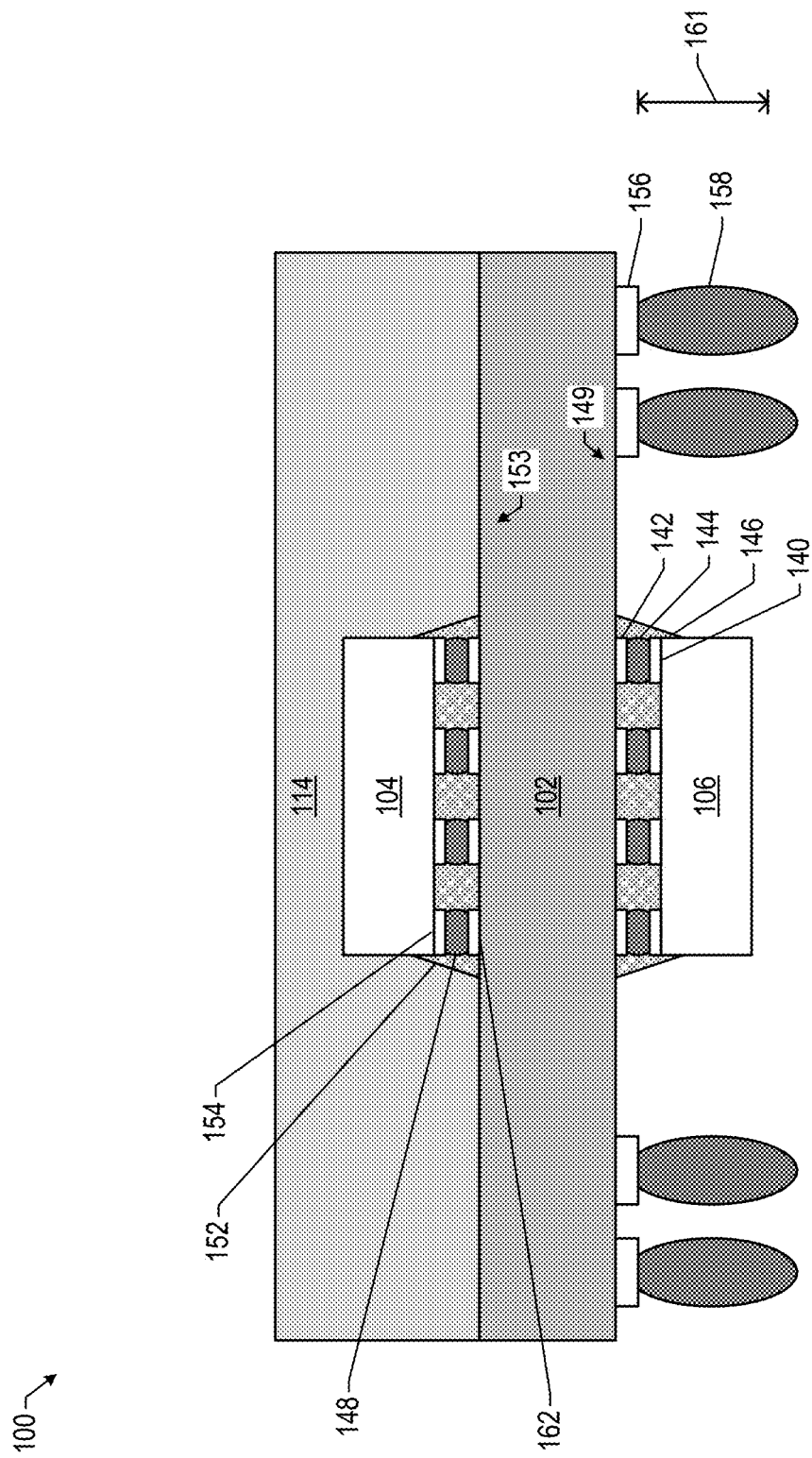

FIG. 20 illustrates an IC package 100 in which the TS component 106 is disposed at the first face 149 of the package substrate 102, and the HG component 104 is disposed at the second face 153 of the package substrate 102. FIG. 20 illustrates the TS component 106 in the shadow of the HG component 104 (and vice versa), but this need not be the case; for example, the TS component 106 and the HG component 104 may be laterally offset with respect to each other. In the IC package 100 of FIG. 20, the package substrate 102 itself may provide some amount of thermal isolation between the TS component 106 and the HG component 104. A heat spreader 114 may be conformally disposed over the HG component 104 (e.g., using any of the deposition or additive manufacturing techniques discussed herein) to draw heat away from the HG component 104 from the top and side faces, as well as from the package substrate 102 (to further reduce the thermal crosstalk between the HG component 104 and the TS component 106). The underfill material 146 and/or the underfill material 152 may be selected to have a lower thermal conductivity than a dielectric of the package substrate 102, in order to provide additional thermal isolation to the TS component 106. The solder balls 158 (or other interconnects, as discussed above) may have a height 161 that is large enough so that the solder balls 158 may couple the IC package 100 to another component (e.g., a circuit board 108, as discussed above with reference to FIG. 1) while accommodating the TS component 106. The IC package 100 of FIG. 20 may have a greater z-height than IC packages 100 in which the HG component 104 and the TS component 106 are both coupled to the second face 153 of the package substrate, but may have a smaller x-y footprint.

FIG. 21 illustrates an IC package 100 like the IC package 100 of FIG. 20, but in which the heat spreader 114 is not conformal over the HG component 104. Instead, the heat spreader 114 may be a separately manufactured element that is in thermal contact with the HG component 104 by way of an intervening layer of TIM 120. The heat spreader 114 may have legs that are coupled to the second face 153 of the package substrate 102 by a sealant 129. The sealant 129 may have gaps (not shown) around the perimeter of the heat spreader 114, to allow any gas generated during solder reflow to escape.

Figure 22:
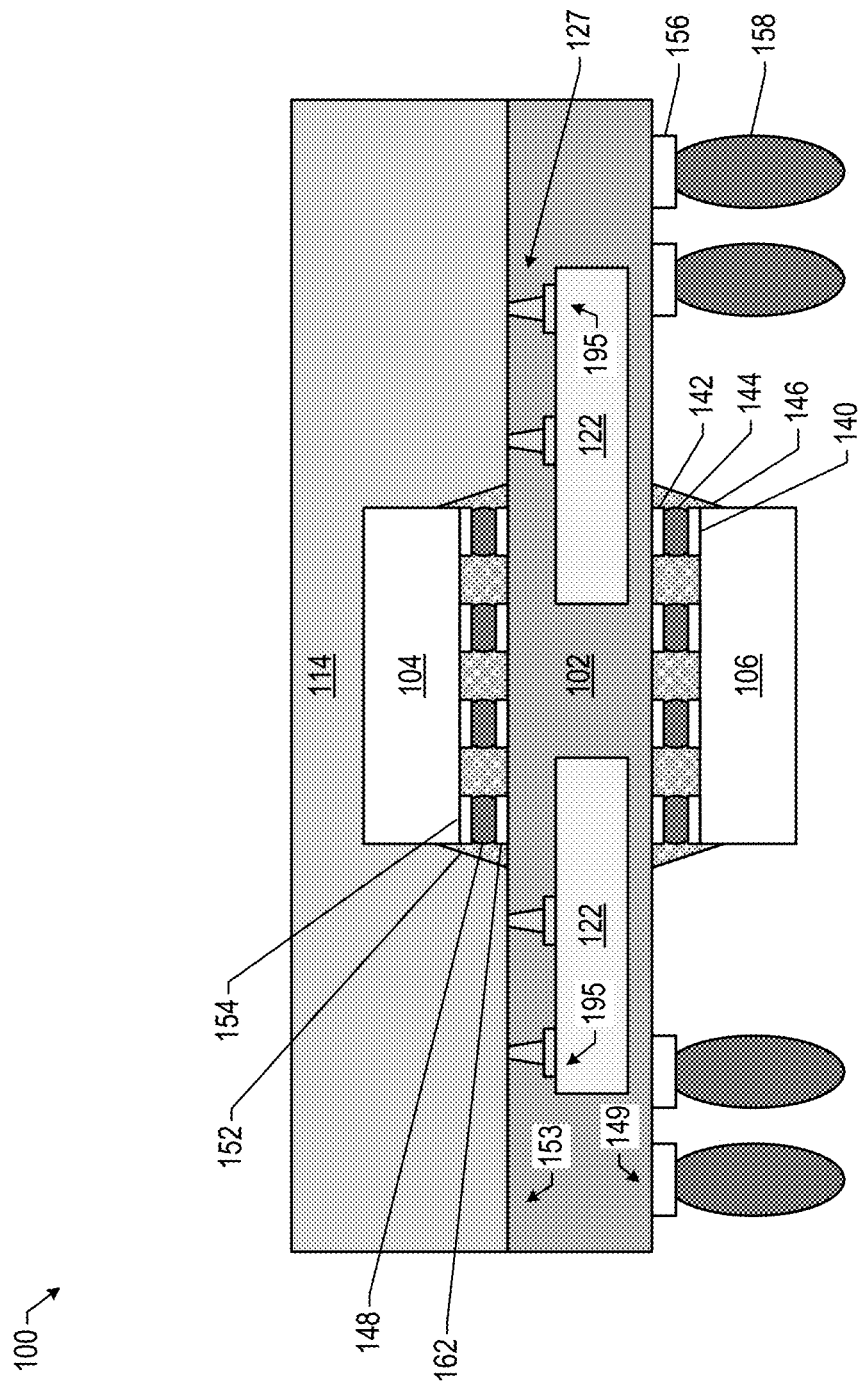

FIG. 22 illustrates an IC package 100 like the IC package 100 of FIG. 20, but which further includes one or more cooling devices 122 in the package substrate 102. The particular number and arrangement of cooling devices 122 in the package substrate 102 is simply illustrative, and any number and arrangement may be used. Thermal vias 127 may be disposed between the cooling devices 122 and the second face 153 of the package substrate 102, drawing heat away from the faces 195 of the cooling devices 122 and directing this heat toward the conformal heat spreader 114. Further, thermal vias 127 (not shown) in the package substrate 102 may be located between the TS component 106 and the cooling devices 122.

Figure 23:
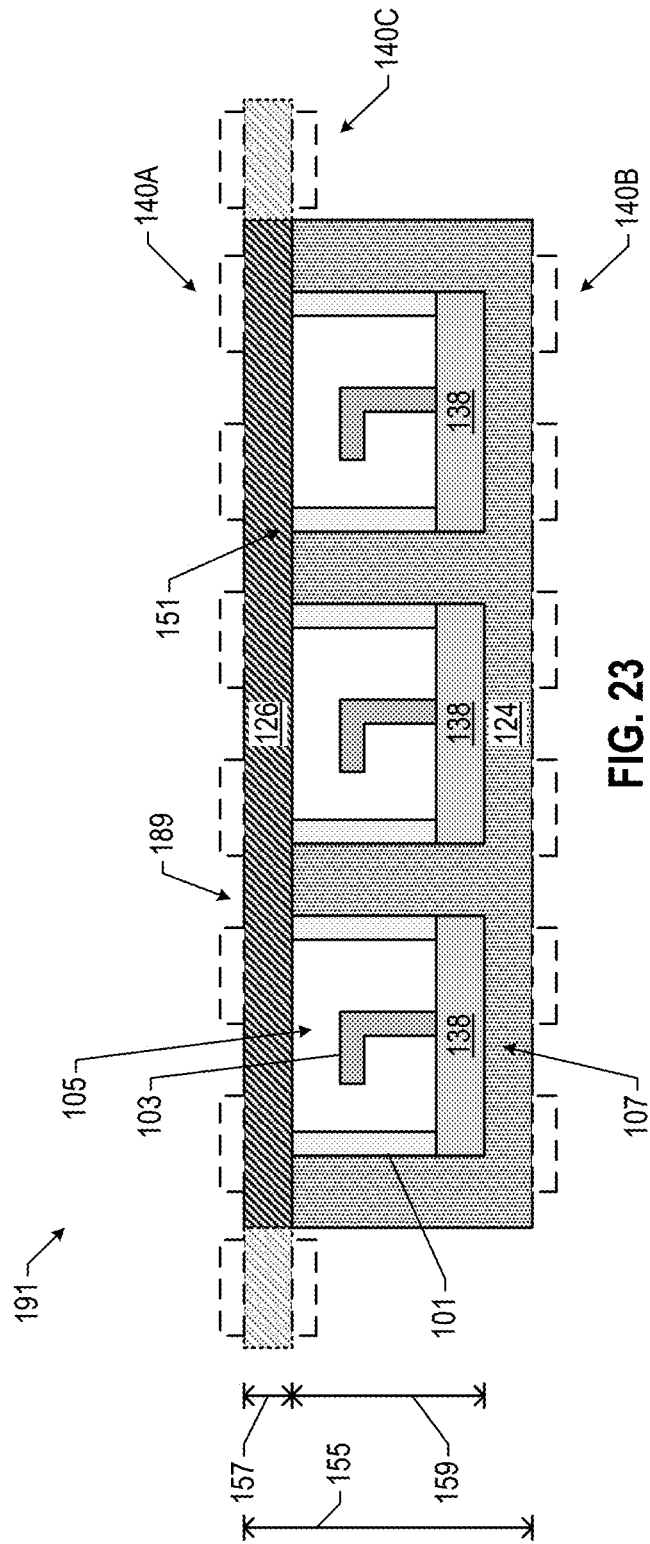
FIG. 23 is a side, cross-sectional view of an example resonator component that may be included in a thermal management arrangement in an IC package, in accordance with various embodiments.

A number of examples of TS components 106 are disclosed herein, including resonator components that may be used in RF devices. FIG. 23 is a side, cross-sectional view of an example resonator component 191 that may serve as the TS component 106 in any of the IC packages 100 herein. The resonator component 191 may include a lid 126 having a first face 151 to which one or more resonator units 107 are attached. A resonator unit 107 may include a base 138, a resonator 103 (e.g., an AWR) coupled to the base, and side walls 101 that couple the base 138 to the lid 126. The base 138, side walls 101, and lid 126 may define a hermetically sealed cavity 105 into which the resonator 103 extends. The cavity 105 may be under vacuum, or may include a gas (e.g., air). The resonator 103 may include a piezoelectric material, and thus mechanical deformation of the resonator 103 may be associated with the generation of electrical signals. A mold compound 124 may be disposed around the resonator units 107. Conductive contacts 140 of the resonator component 191 (shown in dashed lines) may be arranged in any of a number of ways; the conductive contacts 140 may include conductive contacts 140A at a second face 189 of the lid 126 and/or conductive contacts 140B at a face of the base 138 or mold compound 124. In some embodiments, the lid 126 may include portions that extend beyond the resonator units (as shown in dashed lines), and in some such embodiments, conductive contacts 140C of the resonator component 191 may be disposed at the first face 151 of the lid 126 in these portions. Conductive pathways (not shown) may run through the lid 126, the side walls 101, the base 138, and/or the mold compound 124 between the resonators 103 and the conductive contacts 140.

The dimensions of the resonator component 191 may take any suitable values. In some embodiments, a height 159 (the sum of the heights of the base 138 and the cavity 105) may be between 50 microns and 500 microns. In some embodiments, a height 157 of the lid 126 may be between 50 microns and 500 microns. In some embodiments, a height 155 of the resonator component 191 may be between 100 microns and 1 millimeter. In some embodiments, a height 155 of the resonator component 191 may be less than 300 microns. In an IC package 100, the resonator component 191 may have its temperature monitored and its operation stabilized by temperature compensation circuits, which may calibrate the frequency of the resonator component 191 as a function of temperature within a narrow temperature range. These temperature compensation circuits may be part of a TS component 106 that includes the resonator component 191. The thermal arrangements disclosed herein may decrease the risk that the temperature of a resonator component 191 exceeds the narrow range in which the temperature compensation circuits may successfully operate, improving the reliability and performance of the resonator component 191 (and, for example, any filters relying on the resonator component 191, as discussed below with reference to FIG. 47).

Figure 24:
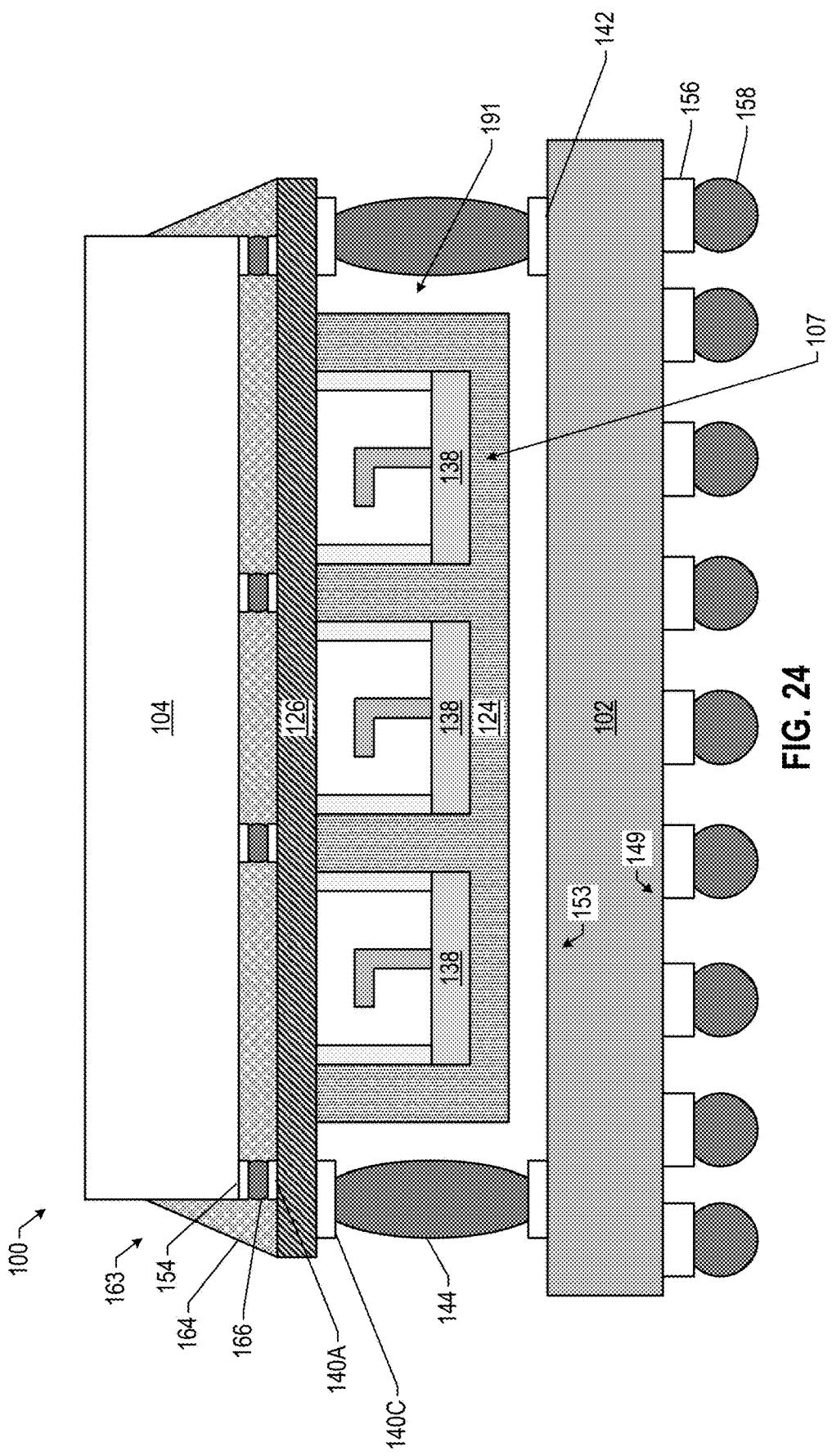
FIGS. 24-25 are side, cross-sectional views of IC packages that include the resonator component of FIG. 23, in accordance with various embodiments.

FIG. 24 illustrates an example IC package 100 including an IC assembly 163 coupled to a package substrate 102. The IC assembly 163 includes the resonator component 191 of FIG. 23 and an HG component 104 (e.g., a PA). In the IC assembly 163, the lid 126 of the resonator component 191 includes conductive contacts 140A at the second face 189 of the lid 126, as well as conductive contacts 140C at the first face 151 of the lid 126. The HG component 104 is coupled to the conductive contacts 140A by solder bumps 166 (or another interconnect), and an underfill material 164 is disposed between the HG component 104 and the lid 126. The underfill material 164 may be selected to have a relatively low thermal conductivity to help thermally isolate the HG component 104 from the resonators 103 of the resonator component 191. Further, the lid 126 may be formed from a low thermal conductivity material (e.g., a glass or low thermal conductivity ceramic) to provide further thermal isolation. The IC assembly 163 may be coupled to a package substrate 102 by solder balls 144 (or other interconnects) between the conductive contacts 140C and the conductive contacts 142; the height of the solder balls 144 may be selected to accommodate the portion of the resonator component 191 below the lid 126. The IC assembly 163 may be manufactured, sold, or otherwise handled, and may later be packaged by securing the IC assembly 163 to the package substrate 102; in other embodiments, the IC assembly 163 may not be secured to a package substrate 102, but may instead be included in an electronic device in any other suitable manner. An embodiment like that of FIG. 24 may be useful in settings in which decreasing the size of the IC package 100 is particularly important, and/or when functionality is improved and/or cost is decreased by having the resonator component 191 and the HG component 104 integrated into one IC assembly 163, even at the expense of potentially greater thermal crosstalk.

Figure 25:
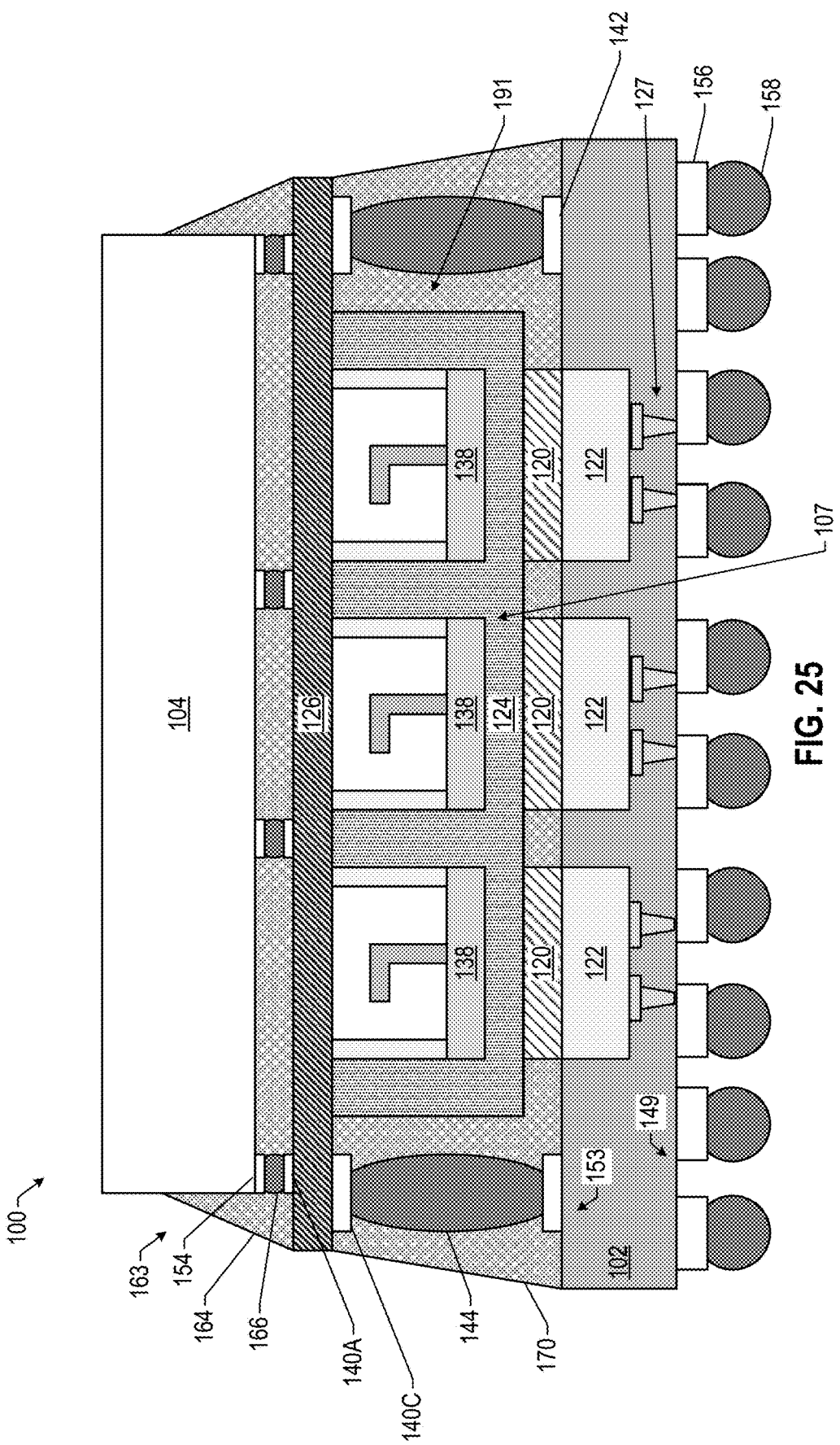

FIG. 25 illustrates an IC package 100 like that of FIG. 24, but in which the package substrate 102 includes one or more cooling devices 122 (e.g., one cooling device 122 per resonator unit 107) in the shadow of the resonator component 191. A portion of TIM 120 is disposed between each resonator unit 107 and the package substrate 102 to facilitate thermal transfer between the resonator component 191 and the cooling devices 122. Thermal vias 127 may be disposed between the cooling devices and the first face 149 of the package substrate 102. In some embodiments, the TIM 120 between the resonator component 191 and the package substrate 102 may be a continuous layer, rather than separate portions under each resonator unit 107. In some embodiments, the cooling devices 122 may not be disposed at the second face 153 of the package substrate 102, but may be spaced apart from the second face 153 (as discussed above). FIG. 25 also illustrates underfill material 170 disposed around the solder balls 144 (or other interconnects. In other embodiments, the package substrate 102 may include additional thermal vias 127 (e.g., between the resonator component 191 and the cooling devices 122, or lateral to the cooling devices 122), or may include thermal vias 127 instead of cooling devices 122. In the embodiment of FIG. 25, the IC assembly 163 may be the same as the IC assembly 163 of FIG. 24, but the IC assembly 163 is packaged differently (including a different package substrate 102). In some embodiments, the base 138 of each resonator unit may be in direct contact with TIM 120 (i.e., there is no mold compound between the base 138 and the TIM 120).

As noted above, in some embodiments, the cooling device 122 included in an IC package 100 may be a TEC. FIG. 26 is a side, cross-sectional view of an example TEC 172 that may be included in any of the thermal management arrangements disclosed herein (e.g., serving as the cooling device 122). The TEC 172 of FIG. 26 includes alternating portions of p-type thermoelectric material and n-type thermoelectric material, with electrodes 174 coupling adjacent portions. The thermoelectric materials may include bismuth telluride, bismuth selenide, or antimony telluride, for example. A thermal insulator 182 may be disposed around the p- and n-type thermoelectric material portions, as shown, and conductive contacts 178 may be present at either end of the p/n "chain." These conductive contacts 178 may be used for wirebonding, solder attachment, or other electrical interconnects. In some embodiments, the TEC 172 may be fabricated directly on another component (e.g., with the surface 176 of the TEC 172 in contact with a TS component 106, as illustrated in FIG. 8), while in other embodiments, the TEC 172 may be fabricated separately and then later integrated into an IC package 100 (e.g., with a TIM 120 providing a thermal interface). In some embodiments, a height 145 of the TEC 172 may be less than 500 microns (e.g., less than 100 microns).

As noted above, in some embodiments, the cooling device 122 included in an IC package 100 may be a vapor chamber. FIG. 27 is a side, cross-sectional view of an example vapor chamber 180 that may be included in any of the thermal management arrangements disclosed herein (e.g., serving as the cooling device 122). The vapor chamber 180 may include a condenser 130, an evaporator 132, and side walls 186 between the condenser 130 and the evaporator 132, all defining a vapor space 196. The side walls 186 may provide a good seal with the condenser 130 and the evaporator 132; in some embodiments, the side walls 186 may include solder or an impermeable adhesive. The evaporator 132 may include a uniform wick region 134 extending into the vapor space 196, and the side walls 186 may include wick regions 184 extending into the vapor space 196; the wicks in the wick region 134 may have a uniform structure across the interior surface of the evaporator 132. A fluid (e.g., water, not shown) may also be disposed in the vapor space 196; when the evaporator 132 is heated (e.g., by a heat source located proximate to the evaporator 132), the fluid proximate to the wick region 134 may evaporate and flow toward the condenser 130. The fluid may condense on the "cooler" condenser 130, and then may flow laterally along the condenser 130 and be wicked back down to the evaporator 132 via the wick regions 184 and the wick region 134. In some embodiments, the vapor chamber 180 (or any of the vapor chambers disclosed herein) may have a height 147 between 200 microns and 3 millimeters.

FIG. 28 is a side, cross-sectional view of an example vapor chamber 190, which may be included in any of the thermal management arrangements disclosed herein (e.g., serving as the cooling device 122). Like the vapor chamber 180 of FIG. 27, the vapor chamber 190 may include a condenser 130, an evaporator 132, and side walls 186 between the condenser 130 and the evaporator 132, all defining a vapor space 196. The evaporator 132 may include a uniform wick region 134 extending into the vapor space 196, but in contrast to the vapor chamber 180 of FIG. 27, the side walls 186 may not include wicks extending into the vapor space 196. The wicks of the wick region 134 of the vapor chamber 190 may have a uniform structure across the interior surface of the evaporator 132. Further, the vapor chamber 190 may include a superhydrophobic material 188 at the interior face of the condenser 130, as well as a superhydrophilic material 175 at the interior face of the evaporator 132 (e.g., in the wick region 134). A fluid (e.g., water, not shown) may also be disposed in the vapor space 196; when the evaporator 132 is heated (e.g., by a heat source located proximate to the evaporator 132), the fluid proximate to the wick region 134 may evaporate and flow toward the condenser 130. The superhydrophobic material 188 of the condenser 130 may cause the condensed fluid to be quickly repelled from the condenser 130 when the condensed fluid droplets reach a certain size, so that the condensed fluid may be said to "jump" back to the evaporator 132. The vapor chamber 190 may thus be referred to as a jumping drops vapor chamber.

FIG. 29 is a side, cross-sectional view of another example jumping drops vapor chamber 192. Like the vapor chamber 190 of FIG. 28, the vapor chamber 192 may include a condenser 130, an evaporator 132, and side walls 186 between the condenser 130 and the evaporator 132, all defining a vapor space 196. The vapor chamber 192 may also include a superhydrophobic material 188 at the interior face of the condenser 130, as well as a superhydrophilic material 175 at the interior face of the evaporator 132. A fluid (e.g., water, not shown) may also be disposed in the vapor space 196. In contrast to the vapor chamber 190 (and in contrast to the vapor chamber 180), the evaporator 132 may include a non-uniform wick region 136 extending into the vapor space 196. In particular, the non-uniform wick region 136 may include subregions whose wicks have different characteristics (e.g., height, width, spacing, volume fraction, etc., as discussed below) than the wicks in other subregions. The characteristics of the wicks in a particular subregion of the non-uniform wick region 136 may be selected based on, among other factors, the power density of the heat source that will be proximate to that subregion when the vapor chamber 192 is included in an IC package 100 (examples of which are discussed below). For example, the amount of fluid that the non-uniform wick region 136 can hold is proportional to the height of the wicks, and the holding of an adequate amount of fluid by the wicks is critical to thermal performance of the vapor chamber 192. If an inadequate volume of water is held in the non-uniform wick region 136, the wicks may be said to "dry out" and the vapor chamber 192 may be unable to adequate transfer heat from the evaporator 132 to the condenser 130. However, the taller the wicks in the non-uniform wick region 136, the greater the thermal resistance presented by the wicks themselves and by the excess fluid.

Figure 39:
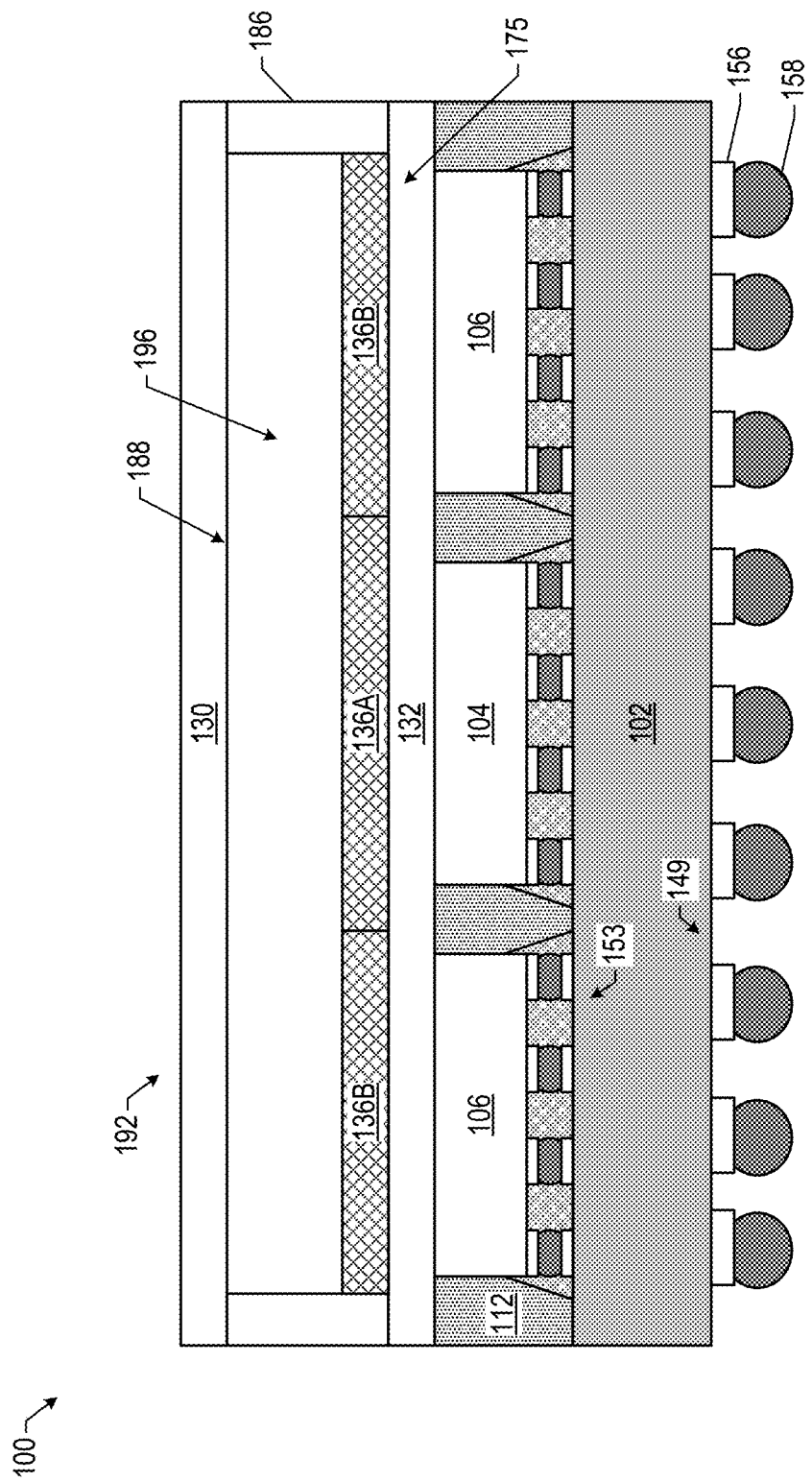
FIGS. 39-40 are side, cross-sectional views of example IC assemblies including vapor chambers in example thermal management arrangements, in accordance with various embodiments.
Figure 40:
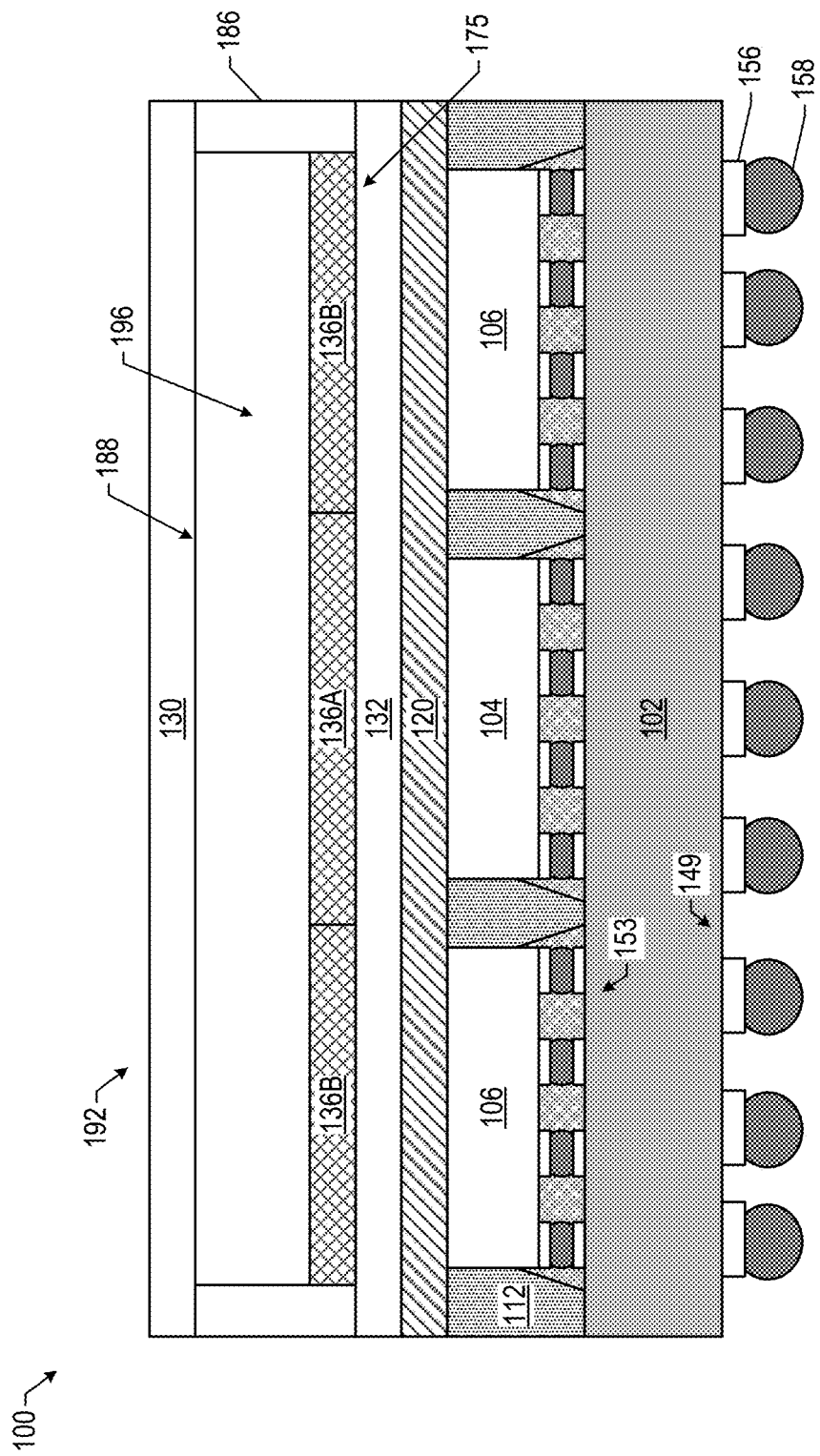

The non-uniform wick regions 136 disclosed herein may balance the demand for adequate fluid at the evaporator 132 with the demand for low thermal resistance at the evaporator 132 by having different subregions of the non-uniform wick region 136 have different properties. For example, a non-uniform wick region 136 may include one or more fine wick subregions 136A and one or more coarse wick subregions 136B. The terms "fine" and "coarse" are used here to refer to the critical dimensions (e.g., height, width, pitch, etc.) of wicks in the subregions; a fine wick subregion 136A may have shorter, narrower, more closely spaced wicks than a coarse wick subregion 136B. Different fine wick subregions 136A included in an evaporator 132 may have different wick properties, and different coarse wick subregions 136B may have different wick properties. A non-uniform wick region 136 may include a fine wick subregion 136A where a HPD component (e.g., an HG component 104, such as a PA) is in the shadow of the fine wick subregion 136A in an IC package 100 (as illustrated in FIGS. 39 and 40, and discussed further below), and may include a coarse wick subregion 136B where a LPD component (e.g., a TS component 106, such as a resonator) is in the shadow of the coarse wick subregion 136B in an IC package 100. The fine wick subregion 136A "above" the HPD component may provide low thermal resistance (and thereby produce a lower temperature) proximate to the HPD component, while the coarse wick subregion 136B "above" the LPD component may provide a greater fluid reservoir to help mitigate the risk of dry out of the fine wick subregion 136A. Because the coarse wick subregion 136B is "above" the LPD component, the greater thermal resistance of the coarse wick subregion 136B may be an acceptable cost for the benefit of a greater fluid reservoir. FIGS. 30-32 illustrate some example arrangements of fine wick subregions 136A and coarse wick subregions 136B in a non-uniform wick region 136 of a vapor chamber 192; these are simply illustrative, and any non-uniform wick region 136 may include any number and arrangement of subregions with different wick properties.

In some embodiments, a non-uniform wick region 136 may include one or more subregions in which the wicks are provided by pillars of a thermally conductive material (e.g., a metal, such as copper). The volume fraction of the wicks in such a subregion may be associated with the diameter, height, and pitch of the pillars. FIGS. 33-35 illustrate examples of vapor chambers 192 having pillar wicks in various arrangements of fine wick subregions 136A and coarse wick subregions 136B, corresponding to the vapor chambers 192 of FIGS. 30-32, respectively. In some embodiments, the diameter 185 of the pillars in a fine wick subregion 136A may be between 1 micron and 100 microns.

In some embodiments, the pitch 171 of the pillars in a fine wick subregion 136A may be between 2 microns and 150 microns. In some embodiments, the height 169 of the pillars in a fine wick subregion 136A may be between 1 micron and 50 microns. In some embodiments, the diameter 165 of the pillars in a coarse wick subregion 136B may be between 10 microns and 500 microns. In some embodiments, the pitch 173 of the pillars in a coarse wick subregion 136B may be between 15 microns and 1000 microns. In some embodiments, the height 167 of the pillars in a coarse wick subregion 136B may be between 10 microns and 500 microns. In some embodiments, the height: diameter aspect ratio of pillar wicks may be between 10:1 and 1:10. In some embodiments, the volume fraction of pillar wicks may be between 25% and 75%.

Figure 36:
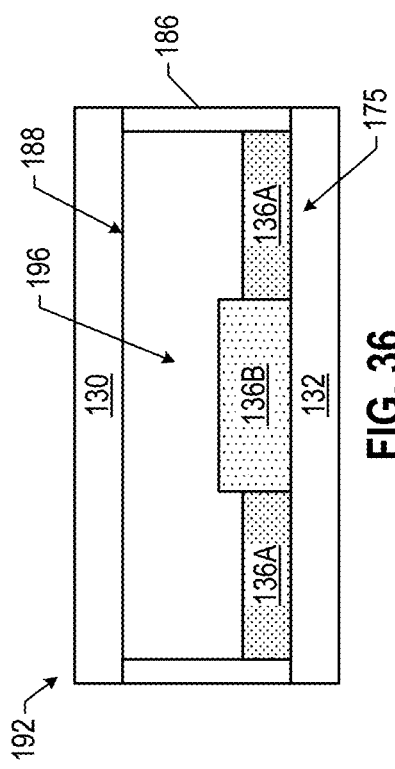
Figure 38:
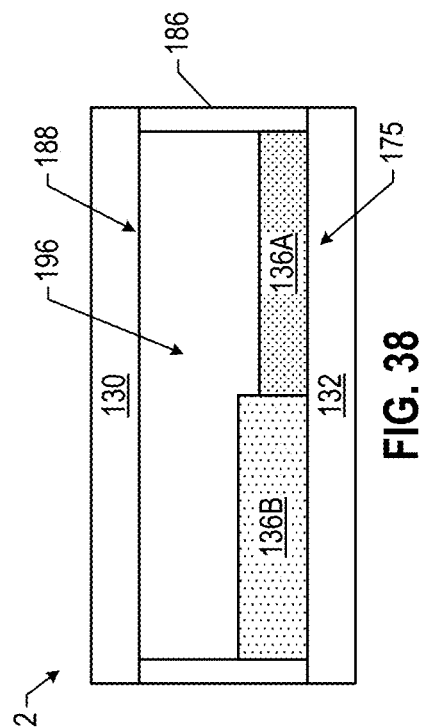
Figure 37:
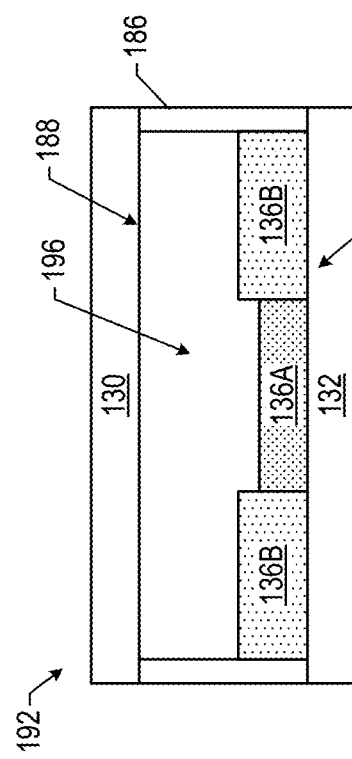

In some embodiments, a non-uniform wick region 136 may include one or more subregions in which the wicks are provided by sintered particles of a thermally conductive material (e.g., a metal, such as copper). The fluid retention in the wicks in such a subregion may be associated with the size of the particles and the porosity of the sintered mass; smaller particles (and lower porosity) may cause the retention of less fluid, while larger particles (and higher porosity) may cause the retention of more fluid. FIGS. 36-38 illustrate examples of vapor chambers 192 having sintered particle wicks in various arrangements of fine wick subregions 136A and coarse wick subregions 1368, corresponding to the vapor chambers 192 of FIGS. 30-32, respectively. In some embodiments, the diameter of the particles in a fine wick subregion 136A may be between 1 micron and 25 microns, while the diameter of the particles in a coarse wick subregion 1368 may be between 30 microns and 500 microns. In some embodiments, the total height of the sintered particles in a coarse wick subregion 1368 may be greater than the total height of the sintered particles in a fine wick subregion 136A, as shown in FIGS. 36-38. In some embodiments, the volume fraction of sintered particle wicks may be between 25% and 75%. In some embodiments, a non-uniform wick region 136 may include one or more subregions having pillar wicks, and one or more subregions having sintered particle wicks, in any desired arrangement.

As noted above, the vapor chambers disclosed herein (e.g., the vapor chambers 192) may be included in an IC package 100. For example, FIGS. 39 and 40 illustrate IC packages 100 having an HG component 104 between two TS components 106. In FIG. 39, a vapor chamber 192 may be fabricated directly above the HG component 104/TS components 106/mold compound 112 (e.g., using an additive manufacturing process), with the HG component 104 in the shadow of a fine wick subregion 136A and the TS components 106 in the shadows of corresponding coarse wick subregions 1368. The IC package 100 of FIG. 40 is similar to the IC package 100 of FIG. 39, but includes a layer of TIM 120 between the HG component 104/TS components 106/mold compound 112 and the vapor chamber 192; such an embodiment may be appropriate when the vapor chamber 192 is separately manufactured.

The elements of FIGS. 39 and 40 may take any suitable form (e.g., any of the forms disclosed herein), and the IC packages 100 of FIGS. 39 and 40 may further include any of the thermal arrangements disclosed herein. For example, the package substrate 102 of the IC packages 100 of FIGS. 39 and 40 may include thermal vias 127, cooling devices 122, etc. The wick regions 134 of the vapor chambers 180 and 190 (as well as the vapor chamber 187, discussed below) may take the form of any of the wick subregions discussed above with reference to the vapor chamber 192. Further, the vapor chamber 192, in some embodiments, may not include the superhydrophobic material 188 or the superhydrophilic material 175, and/or may include wick regions 184 on the side walls 186; in such embodiments, the vapor chamber 192 may no longer be considered a "jumping drops" vapor chamber, but may include the non-uniform wick region 136.

Figure 41:
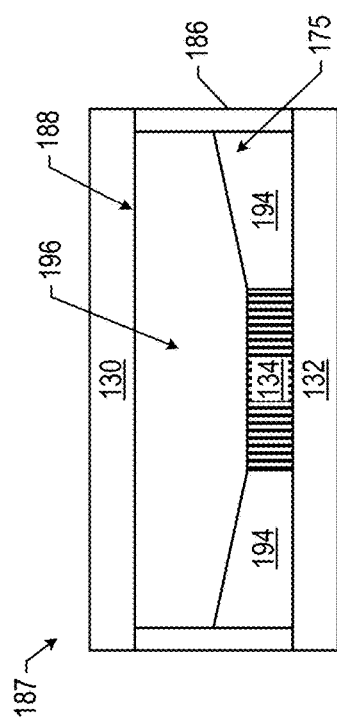
FIG. 41 is a side, cross-sectional view of an example vapor chamber that may be included in a thermal management arrangement in an IC package, in accordance with various embodiments.

FIG. 41 illustrates an example vapor chamber 187 that may be included in any of the IC packages 100 disclosed herein. Like the vapor chambers 190 and 192 of FIGS. 28 and 29, respectively, the vapor chamber 187 may include a condenser 130, an evaporator 132, and side walls 186 between the condenser 130 and the evaporator 132, all defining a vapor space 196. The vapor chamber 187 may also include a superhydrophobic material 188 at the interior face of the condenser 130, as well as a superhydrophilic material 175 at the interior face of the evaporator 132. A fluid (e.g., water, not shown) may also be disposed in the vapor space 196. In contrast to the vapor chambers 190 and 192, the evaporator 132 may include sloped surface portions 194 (formed of the same material as the rest of the evaporator 132, e.g., copper), which provide a sloped surface (e.g., linear, as illustrated in FIG. 41, curved, polygonal, or having another shape) between the side walls 186 and the wick region 134 of the evaporator 132. The concave surface of the evaporator 132 (including the sloped surface portions 194), in conjunction with gravity, may accelerate the return of the condensed fluid from outside the wick region 134 to the wick region 134, improving thermal performance by increasing the rate of fluid replenishment in the wick region 134. A vapor chamber 187 including sloped surface portions 194 may be particularly advantageous in devices that maintain a fixed orientation in space so that gravity may reliably act to pull the condensed fluid down the sloped surface portions 194 to the wick region 134. Such devices may include server computing devices, base stations, or other devices that typically remain stationary and in a predictable orientation relative to the force of gravity. The wick region 134 may take the form of any of the wick regions disclosed herein; in some embodiments, the wick region 134 may be a non-uniform wick region 136, as discussed above. Further, the vapor chamber 187, in some embodiments, may not include the superhydrophobic material 188 or the superhydrophilic material 175, and/or may include wick regions 184 on the side walls 186; in such embodiments, the vapor chamber 187 may no longer be considered a "jumping drops" vapor chamber, but may include the sloped surface portions 194.

When the vapor chamber 187 of FIG. 41 is included in an IC package 100, an HPD component may be advantageously located in the shadow of the wick region 134, while LPD components may be located in the shadow of the sloped surface portions 194. The wick region 134 "above" the HPD component may provide low thermal resistance (and thereby enable greater thermal transfer) proximate to the HPD component, while the sloped surface portions 194 "above" the LPD component may aid in the return of fluid to the wick region 134. Because the sloped surface portions 194 are "above" the LPD components, the greater thermal resistance of the sloped surface portions 194 may be an acceptable cost for the benefit of mitigated dry out risk in the wick region 134.

Figure 42:
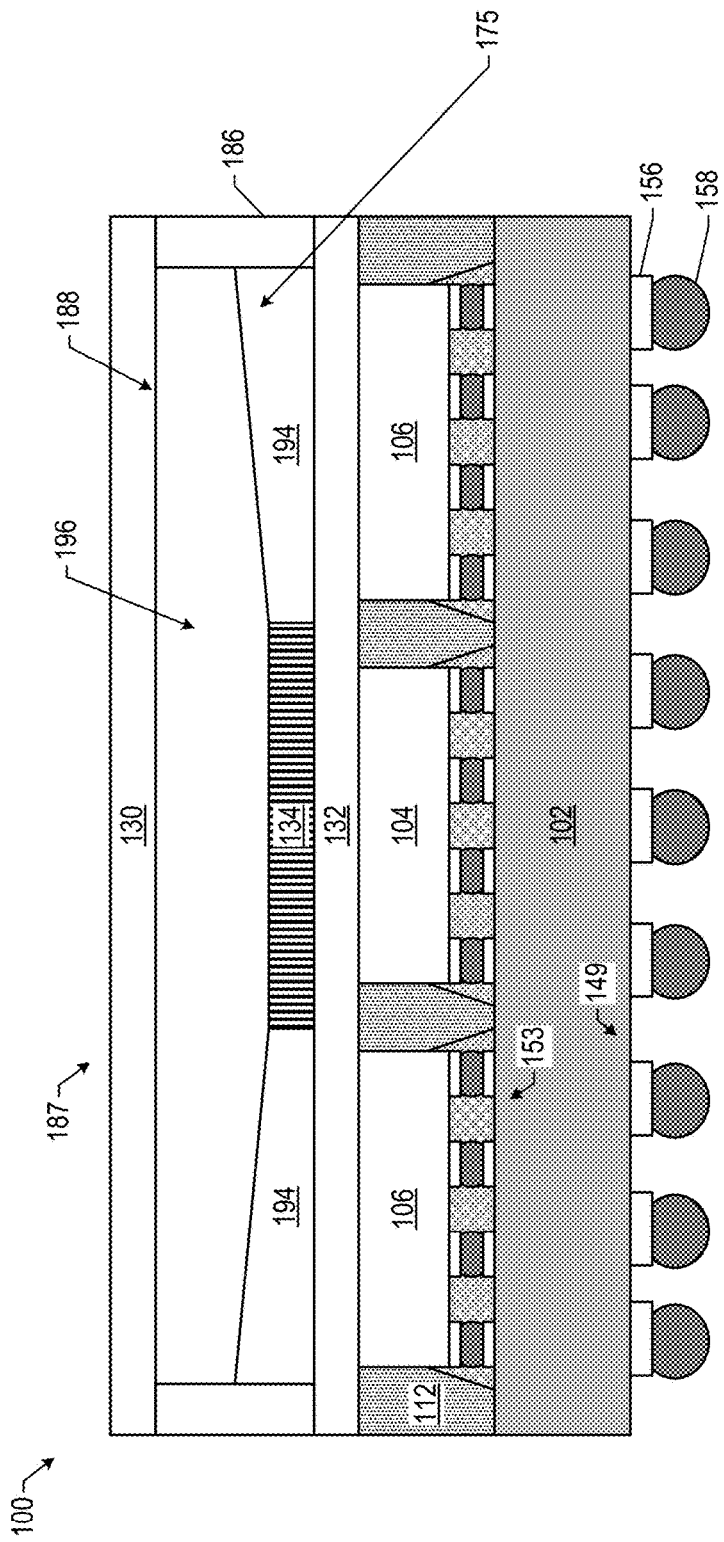
FIG. 42 is a side, cross-sectional view of an example IC assembly including the vapor chamber of FIG. 41 in an example thermal management arrangement, in accordance with various embodiments.

FIG. 42 illustrates an IC package 100 having an HG component 104 between two TS components 106. In FIG. 42, a vapor chamber 187 may be fabricated directly above the HG component 104/TS components 106/mold compound 112 (e.g., using an additive manufacturing process), with the HG component 104 in the shadow of the wick region 134 and the TS components 106 in the shadows of the sloped surface portions 194. In other embodiments, a layer of TIM 120 may be present between the HG component 104/TS components 106/mold compound 112 and the vapor chamber 187; such an embodiment may be appropriate when the vapor chamber 187 is separately manufactured. The elements of FIG. 42 may take any suitable form (e.g., any of the forms disclosed herein), and the IC package 100 of FIG. 42 may further include any of the thermal arrangements disclosed herein. For example, the package substrate 102 of the IC package 100 of FIG. 42 may include thermal vias 127, cooling devices 122, etc. In some embodiments, an IC package 100 including any of the vapor chambers disclosed herein may not include a heat spreader 114; the vapor chamber may take the place of a heat spreader 114.

The IC packages 100 and vapor chambers disclosed herein may include, or may be included in, any suitable electronic component. FIGS. 43-47 illustrate various examples of apparatuses that may be included in any of the IC packages 100 disclosed herein, or may include any of the IC packages 100 or vapor chambers disclosed herein.

Figure 43:
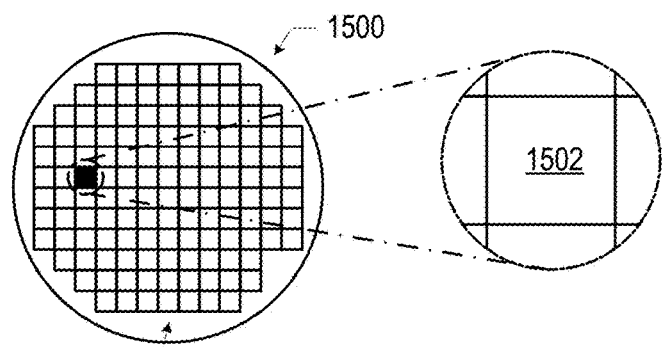
FIG. 43 is a top view of a wafer and dies that may be part of an IC package including any of the thermal management arrangements disclosed herein.

FIG. 43 is a top view of a wafer 1500 and dies 1502 that may be included in an IC package 100, in accordance with various embodiments. For example, a die 1502 may be, or may be included in, an HG component 104 or a TS component 106. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 44, discussed below) and/or supporting circuitry to route electrical signals to the transistors, as well as any other IC components. In some embodiments, the wafer 1500 or the die 1502 may include a PA, one or more resonators, one or more switches, one or more lasers (e.g., VCSELS), a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 46) or other logic that is configured to store information in the memory devices or execute instructions stored in the memory array.

Figure 44:
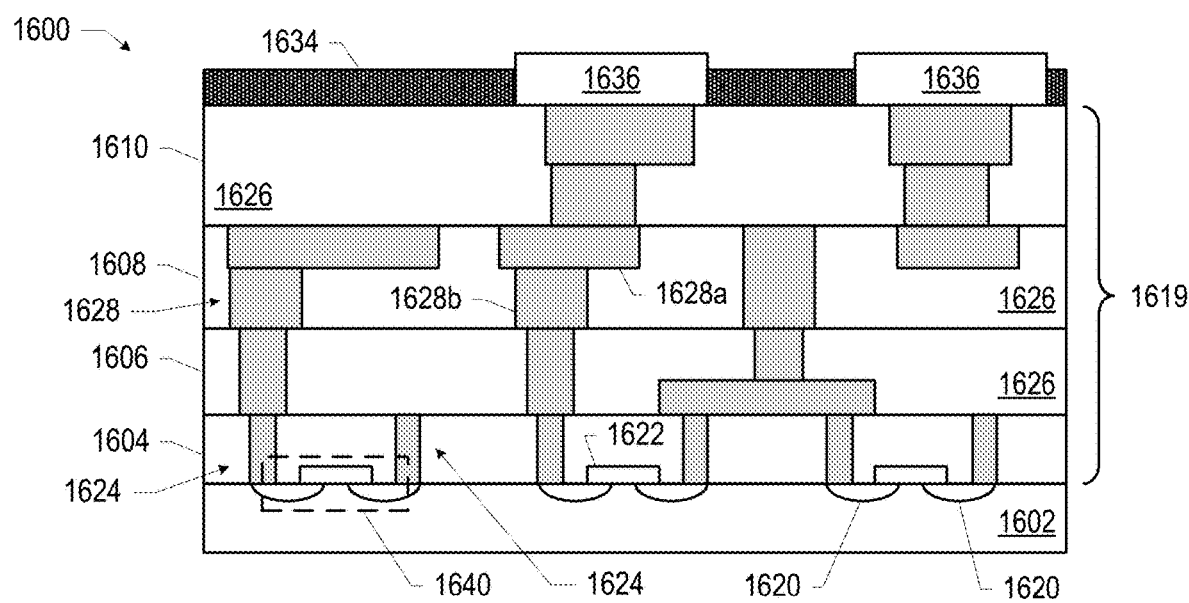
FIG. 44 is a side, cross-sectional view of an IC device that may be part of an IC package including any of the thermal management arrangements disclosed herein.

FIG. 44 is a side, cross-sectional view of an IC device 1600 that may be included in an IC package 100, in accordance with various embodiments. For example, the IC device 1600 may be included in a die 1502. One or more of the IC devices 1600 may be included in one or more dies 1502 (FIG. 43). The IC device 1600 may be formed on a substrate 1602 (e.g., the wafer 1500 of FIG. 43) and may be included in a die (e.g., the die 1502 of FIG. 43). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 43) or a wafer (e.g., the wafer 1500 of FIG. 43).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 44 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 44 as interconnect layers 1606-1610). For example, electrically conductive features of the device layer 1604 (e.g., the gate 1622 and the S/D contacts 1624)

may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 44). Although a particular number of interconnect layers 1606-1610 is depicted in FIG. 44, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 44. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 44. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 44, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 45:
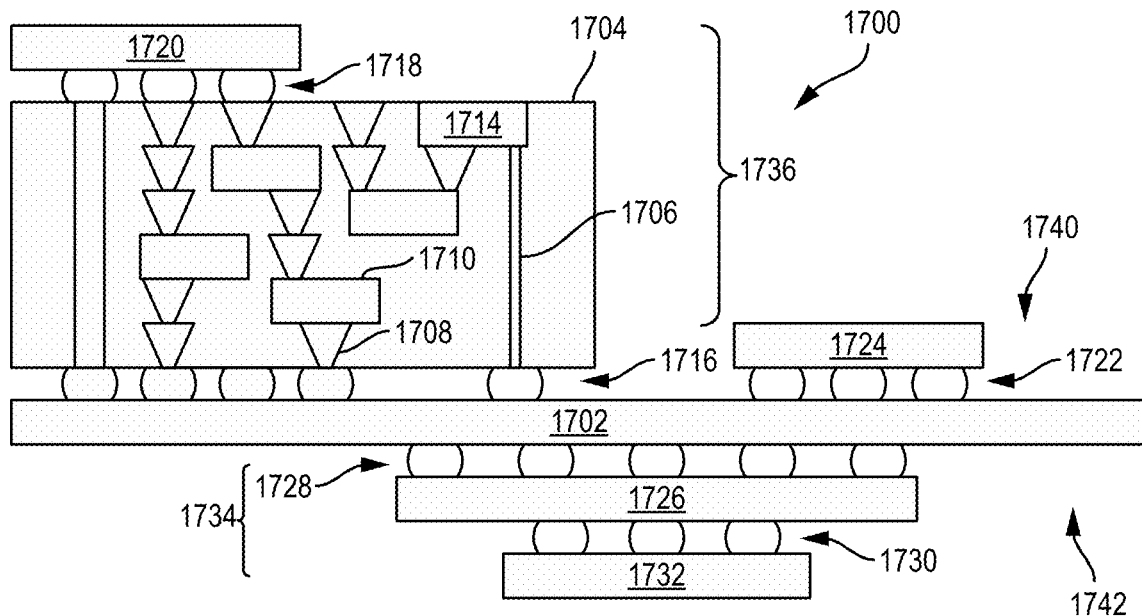
FIG. 45 is a side, cross-sectional view of an IC assembly that may include an IC package including any of the thermal management arrangements disclosed herein.

FIG. 45 is a side, cross-sectional view of an IC assembly 1700 that may include one or more IC packages 100 and/or vapor chambers, in accordance with various embodiments. For example, any of the IC packages included in the IC assembly 1700 may be an IC package 100 including any of the thermal arrangements (or combination of thermal arrangements) disclosed herein. The IC assembly 1700 includes a number of components disposed on a circuit board 1702 (which may be, e.g., a motherboard). The IC assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC assembly 1700 illustrated in FIG. 45 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 45), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 45, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 43), an IC device (e.g., the IC device 1600 of FIG. 44), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 45, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC assembly 1700 illustrated in FIG. 45 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art. Further, any of the vapor chambers disclosed herein (e.g., the vapor chambers 192 and 187) may be included in any suitable location in an IC assembly 1700.

Figure 46:
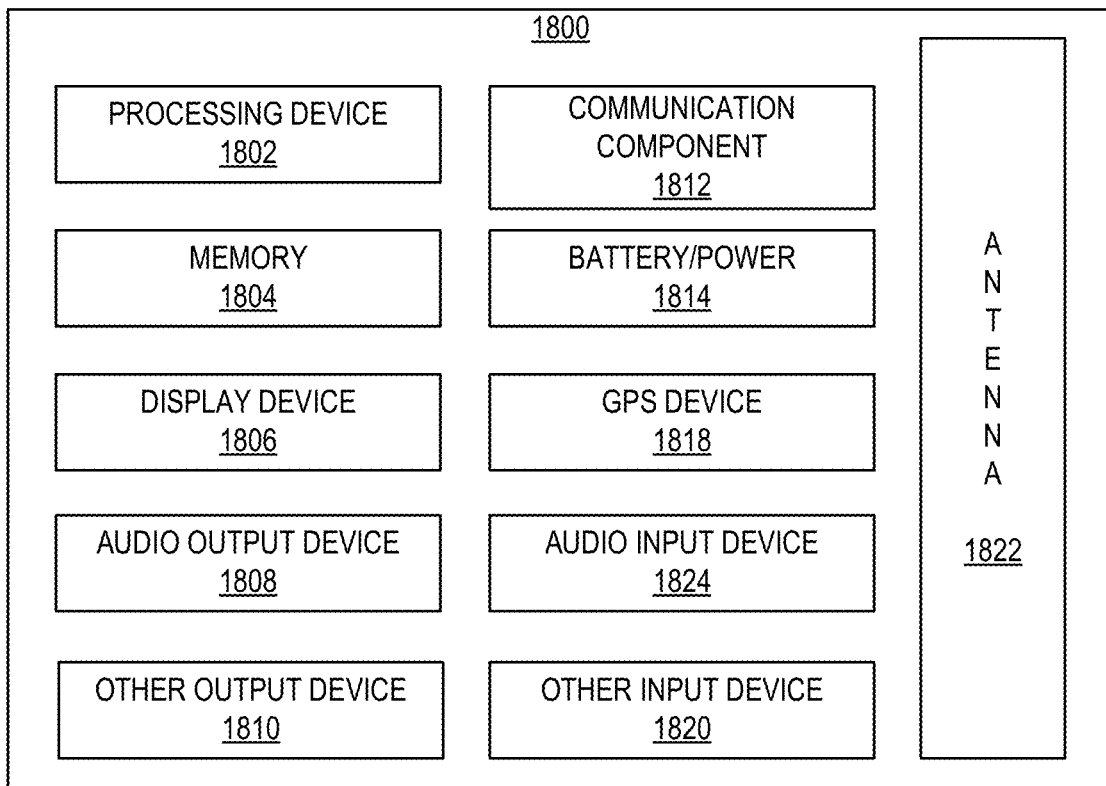
FIG. 46 is a block diagram of an example electrical device that may include an IC package including any of the thermal management arrangements disclosed herein.

FIG. 46 is a block diagram of an example electrical device 1800 that may include one or more IC packages 100 or vapor chambers, in accordance with various embodiments. For example, any suitable ones of the components of the electrical device 1800 may include one or more of the IC assemblies 150/1700, IC packages 100, vapor chambers 192 or 187, IC devices 1600, or dies 1502 disclosed herein. A number of components are illustrated in FIG. 46 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 46, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication component 1812 (e.g., one or more communication components). For example, the communication component 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication component 1812 may include RF components (e.g., PAs and resonators) packaged in any of the IC packages 100 disclosed herein.

The communication component 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication component 1812 may manage wired communications, such as electrical, optical, or any other suitable communication protocols (e.g., the Ethernet). As noted above, the communication component 1812 may include multiple communication components. For instance, a first communication component 1812 may be dedicated to shorter-range wireless communications such as Wi-Fi or Bluetooth, and a second communication component 1812 may be dedicated to longer-range wireless communications such as global positioning system (GPS), EDGE, GPRS, CDMA, WiMAX, LTE, EV-DO, or others. In some embodiments, a first communication component 1812 may be dedicated to wireless communications, and a second communication component 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Figure 47:
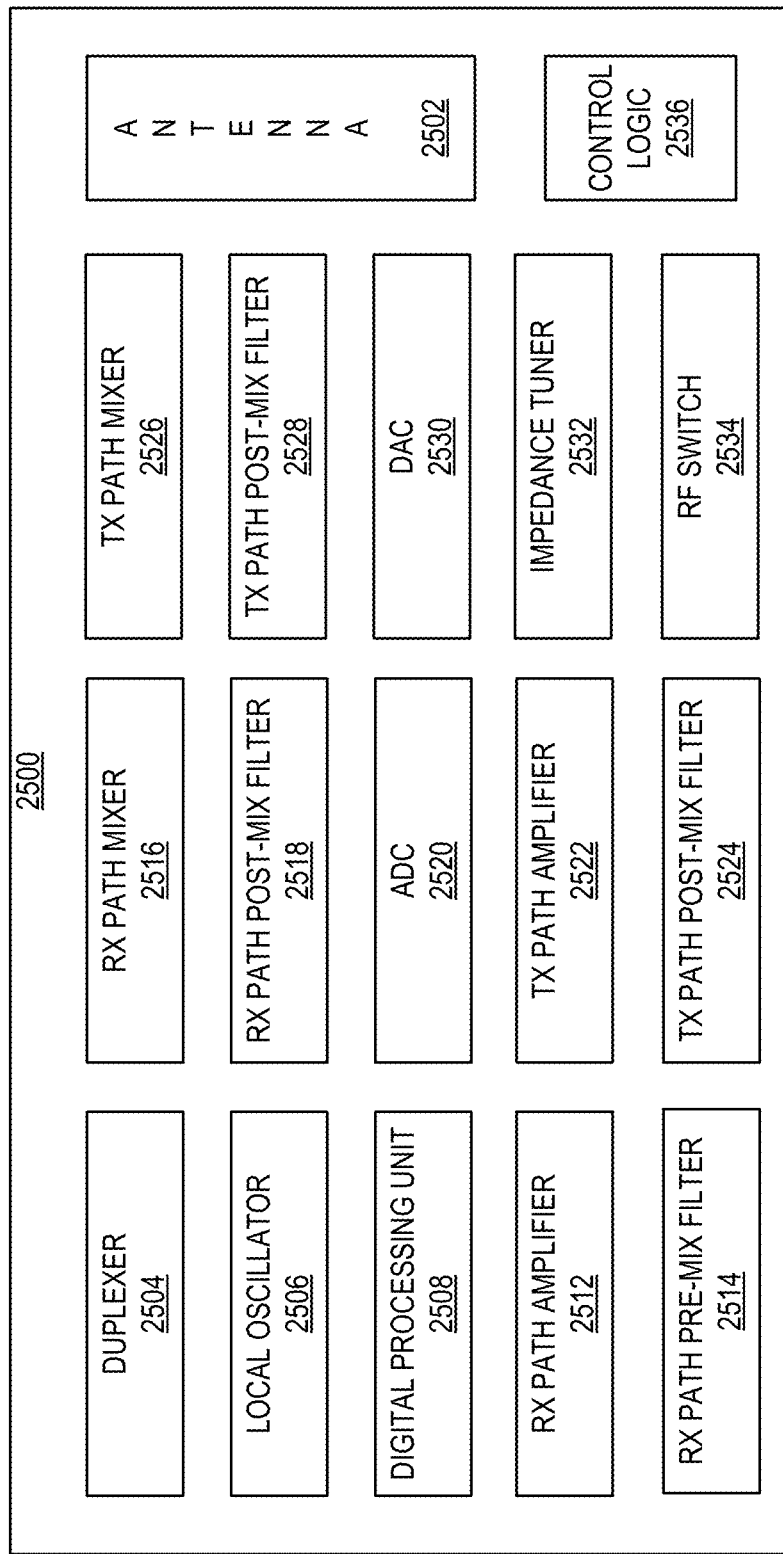
FIG. 47 is a block diagram of an example radio frequency (RF) device that may include an IC package including any of the thermal management arrangements disclosed herein.

FIG. 47 is a block diagram of an example RF device 2500 that may include one or more IC packages 100 and/or vapor chambers, in accordance with any of the embodiments disclosed herein. For example, any suitable ones of the components of the RF device 2500 may include, or may be included in, an IC package 100 in accordance with any of the embodiments disclosed herein. Any of the components of the RF device 2500 may include, or be included in, an IC assembly 1700 as described with reference to FIG. 45. In some embodiments, the RF device 2500 may be included within any components of the computing device 1800 as described above with reference to FIG. 46 (e.g., the communication component 1812), or may be coupled to any of the components of the electrical device 1800 (e.g., may be coupled to the memory 1804 and/or to the processing device 1802 of the electrical device 1800).

In still other embodiments, the RF device 2500 may further include any of the components described above with reference to FIG. 46, such as, but not limited to, the battery/power circuitry 1814, the memory 1804, and various input and output devices as discussed above with reference to FIG. 46.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a base station (BS) or a user equipment (UE) device of any suitable cellular wireless communications technology, such as GSM, WCDMA, or LTE. In a further example, the RF device 2500 may be used as, or in, a BS or a UE device of a millimeter-wave wireless technology such as fifth generation (5G) wireless (e.g., high-frequency/short wavelength spectrum, with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, corresponding to a wavelength of about 5 cm). For example, the RF device 2500 may be included in a Wi-Fi-enabled device such as a desktop, a laptop, a video game console, a smart phone, a tablet, a smart TV, a digital audio player, a car, a printer, etc. In some implementations, a Wi-Fi-enabled device may be a node (e.g., a smart sensor) in a smart system configured to communicate data with other nodes. In another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication (e.g., in an automotive radar system, or in medical applications such as magnetic resonance imaging (MRI)).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 47 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In various embodiments, the RF device 2500 may not include one or more of the components illustrated in FIG. 47, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 47, the RF device 2500 may include an antenna 2502, a duplexer 2504, a local oscillator 2506, and a digital processing unit 2508. As also shown in FIG. 47, the RF device 2500 may include an RX path that may include an RX path amplifier 2512 (which may include any of the PAs disclosed herein, and may include or be included in an HG component 104), an RX path pre-mix filter 2514, a RX path mixer 2516, an RX path post-mix filter 2518, and an analog-to-digital converter (ADC) 2520. As further shown in FIG. 47, the RF device 2500 may include a TX path that may include a TX path amplifier 2522 (which may include any of the PAs disclosed herein, and may include or be included in an HG component 104), a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534 (which may include, or be included in, an HG component 104), and control logic 2536. In various embodiments, the RF device 2500 may include multiple instances of any of the components shown in FIG. 47. In some embodiments, the RX path amplifier 2512, the TX path amplifier 2522, the duplexer 2504, and the RF switch 2534 may be considered to form, or be a part of, an RF front-end (FE) of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 47) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 47 as control logic 2536 (providing, for example, an RF FE control interface). The control logic 2536 may be used to enhance control of complex RF system environment, support implementation of envelope tracking techniques, reduce dissipated power, etc.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, e.g., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (e.g., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 1802 of FIG. 46, descriptions of which are provided above. The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 47, in some embodiments, the RF device 2500 may further include a memory device (e.g., the memory device 1804 described above with reference to FIG. 46) configured to cooperate with the digital processing unit 2508.

Turning to the details of the RX path that may be included in the RF device 2500, the RX path amplifier 2512 may include a low noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the RX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-intermediate frequency (IF) receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an IF. IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 47, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the RX path post-mix filter 2518.

The ADC 2520 may be configured to convert the mixed RX signals from the RX path mixer 2516 from the analog to the digital domain. The ADC 2520 may be a quadrature ADC that, similar to the RX path mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the RX path mixer 2516 in the RX path and the TX path mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

As noted above, the TX path amplifier 2522 may be a PA (e.g., included in an HG component 104), configured to amplify the upconverted RF signal before providing it to the antenna 2502 for transmission In various embodiments, any of the RX path pre-mix filter 2514, the RX path post-mix filter 2518, the TX path post-mix filter 2524, and the TX path pre-mix filter 2528 may be implemented as RF filters. In some embodiments, each of such RF filters may include one or more resonators (e.g., AWRs, film bulk acoustic resonators (FBARs), Lamb wave resonators, and/or contour-wave resonators), arranged in any suitable manner (e.g., in a ladder configuration). Any of the RX path pre-mix filter 2514, the RX path post-mix filter 2518, the TX path post-mix filter 2524, and the TX path pre-mix filter 2528 may include one or more resonator components 191. As discussed above with reference to the resonator component 191, an individual resonator (e.g., the resonator 103) of an RF filter may include a layer of a piezoelectric material such as aluminum nitride, enclosed between two or more electrodes or sets of electrodes, with a cavity (e.g., the cavity 105) provided around a portion of each electrode or set of electrodes in order to allow a portion of the piezoelectric material to vibrate during operation of the filter. Any such resonators may be included in an IC package 100 as a TS component 106. In some embodiments, an RF filter may be implemented as a plurality of RF filters, or a filter bank. A filter bank may include a plurality of RF resonators that may be coupled to a switch (e.g., the RF switch 2534) configured to selectively switch any one of the plurality of RF resonators on and off (e.g., activate any one of the plurality of RF resonators), in order to achieve desired filtering characteristics of the filter bank (e.g., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be a device configured to route high-frequency signals through transmission paths in order to selectively switch between a plurality of instances of any one of the components shown in FIG. 47 (e.g., to achieve desired behavior and characteristics of the RF device 2500). The RF switch 2534 may be part of an HG component 104. In some embodiments, an RF switch 2534 may be used to switch between different antennas 2502. In other embodiments, an RF switch may be used to switch between a plurality of RF resonators (e.g., by selectively switching RF resonators on and off) of any of the filters included in the RF device 2500. Typically, an RF system may include a plurality of such RF switches.

The RF device 2500 provides a simplified version and, in further embodiments, other components not specifically shown in FIG. 47 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may include a suitable phase-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

The following paragraphs provide various examples of the embodiments disclosed herein.

Example 1 is a vapor chamber, including: an evaporator having a wick region, wherein the wick region includes a first wick density region and a second wick density region, and the first wick density region has a different wick density than the second wick density region.

Example 2 includes the subject matter of Example 1, and further specifies that the first wick density region includes first sintered particles, the second wick density region includes second sintered particles, and a first diameter of the first sintered particles is different than a second diameter of the second sintered particles.

Example 3 includes the subject matter of Example 2, and further specifies that the first sintered particles include copper.

Example 4 includes the subject matter of any of Examples 2-3, and further specifies that the second sintered particles include copper.

Example 5 includes the subject matter of any of Examples 2-4, and further specifies that the first diameter is between 1 micron and 25 microns.

Example 6 includes the subject matter of any of Examples 2-5, and further specifies that the second diameter is between 30 microns and 500 microns.

Example 7 includes the subject matter of Example 1, and further specifies that the first wick density region includes first pillars having a first pitch, the second wick density region includes second pillars having a second pitch, and the first pitch is different than the second pitch.

Example 8 includes the subject matter of Example 7, and further specifies that the first pillars include copper.

Example 9 includes the subject matter of any of Examples 7-8, and further specifies that the second pillars include copper.

Example 10 includes the subject matter of any of Examples 7-9, and further specifies that the first pitch is between 2 micron and 150 microns.

Example 11 includes the subject matter of Example 10, and further specifies that a height of the first pillars is between 1 micron and 50 microns.

Example 12 includes the subject matter of any of Examples 7-11, and further specifies that the second pitch is between 15 microns and 1000 microns.

Example 13 includes the subject matter of any of Examples 7-12, and further specifies that a height of the second pillars is between 10 microns and 500 microns.

Example 14 includes the subject matter of any of Examples 7-13, and further specifies that a diameter of individual pillars in the wick region is between 1 micron and 500 microns.

Example 15 includes the subject matter of any of Examples 7-14, and further specifies that individual pillars have a width-to-height aspect ratio between 10:1 and 1:10.

Example 16 includes the subject matter of any of Examples 1-15, and further specifies that the wick region includes a third wick density region, and the third wick density region has a different wick density than the first wick density region.

Example 17 includes the subject matter of Example 16, and further specifies that the first wick density region is between the second wick density region and the third wick density region.

Example 18 includes the subject matter of Example 17, and further specifies that the first wick density region has a greater wick density than the second wick density region, and the first wick density region has a greater wick density than the third wick density region.

Example 19 includes the subject matter of any of Examples 1-18, and further includes: a condenser; and side walls between the condenser and the evaporator.

Example 20 includes the subject matter of Example 19, and further specifies that the condenser has a superhydrophobic surface.

Example 21 includes the subject matter of any of Examples 19-20, and further specifies that the evaporator has a superhydrophilic surface.

Example 22 includes the subject matter of any of Examples 19-21, and further includes: wicks on the side walls.

Example 23 includes the subject matter of any of Examples 19-21, and further specifies that no wicks are present on the side walls.

Example 24 includes the subject matter of any of Examples 19-23, and further specifies that a peripheral region of an interior surface of the evaporator is not parallel to an interior surface of the condenser.

Example 25 includes the subject matter of any of Examples 1-24, and further specifies that the wick region is at an interior surface of the evaporator, and a portion of the interior surface is sloped.

Example 26 includes the subject matter of Example 25, and further specifies that a peripheral region of the interior surface is sloped toward the wick region.

Example 27 includes the subject matter of any of Examples 25-26, and further specifies that no wicks are present at a peripheral region of the interior surface.

Example 28 includes the subject matter of any of Examples 25-26, and further specifies that the wick region is proximate to a center of the interior surface.

Example 29 includes the subject matter of any of Examples 1-28, and further includes: a liquid in a vapor space of the vapor chamber.

Example 30 includes the subject matter of Example 29, and further specifies that the liquid includes water.

Example 31 includes the subject matter of any of Examples 1-30, and further specifies that a height of the vapor chamber is between 200 microns and 3 millimeters.

Example 32 includes the subject matter of any of Examples 1-31, and further specifies that a volume fraction of wick material in the wick region is between 25 percent and 75 percent.

Example 33 is a vapor chamber, including: an evaporator having a wick region at an interior surface, wherein a portion of the interior surface of the evaporator, outside the wick region, is angled toward the wick region.

Example 34 includes the subject matter of Example 33, and further specifies that a thickness of the evaporator is greater at a location outside the wick region than inside the wick region.

Example 35 includes the subject matter of any of Examples 33-34, and further specifies that no wicks are present at the portion of the interior surface.

Example 36 includes the subject matter of any of Examples 33-35, and further includes: a liquid in a vapor space of the vapor chamber.

Example 37 includes the subject matter of Example 36, and further specifies that the liquid includes water.

Example 38 includes the subject matter of any of Examples 33-37, and further specifies that a height of the vapor chamber is between 200 microns and 3 millimeters.

Example 39 includes the subject matter of any of Examples 33-38, and further specifies that a volume fraction of wick material in the wick region is between 25 percent and 75 percent.

Example 40 includes the subject matter of any of Examples 33-39, and further includes: a condenser; and side walls between the condenser and the evaporator.

Example 41 includes the subject matter of Example 40, and further specifies that the condenser has a superhydrophobic surface.

Example 42 includes the subject matter of any of Examples 40-41, and further specifies that the evaporator has a superhydrophilic surface.

Example 43 includes the subject matter of any of Examples 40-42, and further includes: wicks on the side walls.

Example 44 includes the subject matter of any of Examples 40-42, and further specifies that no wicks are present on the side walls.

Example 45 includes the subject matter of any of Examples 40-44, and further specifies that the portion of the interior surface of the evaporator is not parallel to a surface of the condenser.

Example 46 includes the subject matter of any of Examples 33-45, and further specifies that the wick region includes sintered particles.

Example 47 includes the subject matter of Example 46, and further specifies that the sintered particles have a diameter between 1 micron and 500 microns.

Example 48 includes the subject matter of any of Examples 33-47, and further specifies that the wick region includes pillars.

Example 49 includes the subject matter of Example 48, and further specifies that the pillars have a pitch between 2 microns and 1000 microns.

Example 50 includes the subject matter of any of Examples 48-49, and further specifies that the pillars have a diameter between 1 micron and 500 microns.

Example 51 includes the subject matter of any of Examples 48-50, and further specifies that individual pillars in the wick region have a width-to-height aspect ratio between 10:1 and 1:10.

Example 52 includes the subject matter of any of Examples 33-51, and further specifies that the wick region includes copper.

Example 53 includes the subject matter of any of Examples 33-52, and further specifies that the wick region includes a first wick density region and a second wick density region, and the first wick density region has a different wick density than the second wick density region.

Example 54 includes the subject matter of Example 53, and further specifies that the first wick density region includes first sintered particles, the second wick density region includes second sintered particles, and a first diameter of the first sintered particles is different than a second diameter of the second sintered particles.

Example 55 includes the subject matter of Example 54, and further specifies that the first sintered particles include copper.

Example 56 includes the subject matter of any of Examples 54-55, and further specifies that the second sintered particles include copper.

Example 57 includes the subject matter of any of Examples 54-56, and further specifies that the first diameter is between 1 micron and 25 microns.

Example 58 includes the subject matter of any of Examples 54-57, and further specifies that the second diameter is between 30 microns and 500 microns.

Example 59 includes the subject matter of Example 53, and further specifies that the first wick density region includes first pillars having a first pitch, the second wick density region includes second pillars having a second pitch, and the first pitch is different than the second pitch.

Example 60 includes the subject matter of Example 59, and further specifies that the first pillars include copper.

Example 61 includes the subject matter of any of Examples 59-60, and further specifies that the second pillars include copper.

Example 62 includes the subject matter of any of Examples 59-61, and further specifies that the first pitch is between 2 micron and 150 microns.

Example 63 includes the subject matter of Example 62, and further specifies that a height of the first pillars is between 1 micron and 50 microns.

Example 64 includes the subject matter of any of Examples 59-63, and further specifies that the second pitch is between 15 microns and 1000 microns.

Example 65 includes the subject matter of any of Examples 59-64, and further specifies that a height of the second pillars is between 10 microns and 500 microns.

Example 66 includes the subject matter of any of Examples 59-65, and further specifies that a diameter of individual pillars is between 1 micron and 500 microns.

Example 67 includes the subject matter of any of Examples 53-66, and further specifies that the wick region includes a third wick density region, and the third wick density region has a different wick density than the first wick density region.

Example 68 includes the subject matter of Example 67, and further specifies that the first wick density region is between the second wick density region and the third wick density region.

Example 69 includes the subject matter of any of Examples 68, and further specifies that the first wick density region has a greater wick density than the second wick density region, and the first wick density region has a greater wick density than the third wick density region.

Example 70 is an integrated circuit (IC) package, including: a package substrate; a first component coupled to the package substrate; a second component coupled to the package substrate; and a vapor chamber, wherein the first component is between the vapor chamber and the package substrate, the second component is between the vapor chamber and the package substrate, and the vapor chamber includes: a wick region, wherein the wick region includes a first wick subregion and a second wick subregion, the first wick subregion has a different wick structure than the second wick subregion, the first component is between the first wick subregion and the package substrate, and the second component is between the second wick subregion and the package substrate.

Example 71 includes the subject matter of Example 70, and further specifies that the first wick subregion includes first sintered particles, the second wick subregion includes second sintered particles, and a first diameter of the first sintered particles is different than a second diameter of the second sintered particles.

Example 72 includes the subject matter of Example 71, and further specifies that the first sintered particles include copper.

Example 73 includes the subject matter of any of Examples 71-72, and further specifies that the second sintered particles include copper.

Example 74 includes the subject matter of any of Examples 71-73, and further specifies that the first diameter is between 1 micron and 25 microns.

Example 75 includes the subject matter of any of Examples 71-74, and further specifies that the second diameter is between 30 microns and 500 microns.

Example 76 includes the subject matter of Example 70, and further specifies that the first wick subregion includes first pillars having a first pitch, the second wick subregion includes second pillars having a second pitch, and the first pitch is different than the second pitch.

Example 77 includes the subject matter of Example 76, and further specifies that the first pillars include copper.

Example 78 includes the subject matter of any of Examples 76-77, and further specifies that the second pillars include copper.

Example 79 includes the subject matter of any of Examples 76-78, and further specifies that the first pitch is between 2 micron and 150 microns.

Example 80 includes the subject matter of Example 79, and further specifies that a height of the first pillars is between 1 micron and 50 microns.

Example 81 includes the subject matter of any of Examples 76-80, and further specifies that the second pitch is between 15 microns and 1000 microns.

Example 82 includes the subject matter of any of Examples 76-81, and further specifies that a height of the second pillars is between 10 microns and 500 microns.

Example 83 includes the subject matter of any of Examples 76-82, and further specifies that a diameter of individual pillars in the wick region is between 1 micron and 500 microns.

Example 84 includes the subject matter of any of Examples 76-83, and further specifies that individual pillars have a width-to-height aspect ratio between 10:1 and 1:10.

Example 85 includes the subject matter of any of Examples 70-84, and further specifies that the wick region includes a third wick subregion, and the third wick subregion has a different wick density than the first wick subregion.

Example 86 includes the subject matter of Example 85, and further specifies that the first wick subregion is between the second wick subregion and the third wick subregion.

Example 87 includes the subject matter of Example 86, and further specifies that the first wick subregion has a greater wick density than the second wick subregion, and the first wick subregion has a greater wick density than the third wick subregion.

Example 88 includes the subject matter of any of Examples 70-87, and further specifies that the wick region is on an evaporator, and the vapor chamber further includes: a condenser; and side walls between the condenser and the evaporator.

Example 89 includes the subject matter of Example 88, and further specifies that the condenser has a superhydrophobic surface.

Example 90 includes the subject matter of any of Examples 88-89, and further specifies that the evaporator has a superhydrophilic surface.

Example 91 includes the subject matter of any of Examples 88-90, and further includes: wicks on the side walls.

Example 92 includes the subject matter of any of Examples 88-90, and further specifies that no wicks are present on the side walls.

Example 93 includes the subject matter of any of Examples 88-92, and further specifies that a peripheral region of a surface of the evaporator is not parallel to a surface of the condenser.

Example 94 includes the subject matter of any of Examples 70-93, and further specifies that the wick region is at a surface of an evaporator, and a peripheral region of the surface is sloped.

Example 95 includes the subject matter of Example 94, and further specifies that the peripheral region of the surface is sloped downward toward an interior region of the surface.

Example 96 includes the subject matter of any of Examples 94-95, and further specifies that no wicks are present at the peripheral region of the surface.

Example 97 includes the subject matter of any of Examples 94-95, and further specifies that the wick region is at an interior region of the surface.

Example 98 includes the subject matter of any of Examples 70-97, and further includes: a liquid in a vapor space of the vapor chamber.

Example 99 includes the subject matter of Example 98, and further specifies that the liquid includes water.

Example 100 includes the subject matter of any of Examples 70-99, and further specifies that a height of the vapor chamber is between 200 microns and 3 millimeters.

Example 101 includes the subject matter of any of Examples 70-100, and further specifies that a volume fraction of wick material in the wick region is between 25 percent and 75 percent.

Example 102 includes the subject matter of any of Examples 70-101, and further specifies that the first component is a higher power component than the second component.

Example 103 includes the subject matter of any of Examples 70-102, and further specifies that the first component includes a power amplifier, and the second component includes a resonator.

Example 104 includes the subject matter of any of Examples 70-103, and further includes: a thermal interface material (TIM) between the vapor chamber and the first component.

Example 105 includes the subject matter of Example 104, and further specifies that the TIM includes indium or tin.

Example 106 includes the subject matter of any of Examples 104-105, and further specifies that the TIM includes a polymer material.

Example 107 includes the subject matter of any of Examples 70-106, and further includes: a mold material adjacent to the first component and the second component.

Example 108 is an integrated circuit (IC) package, including: a package substrate; a first component coupled to a surface of the package substrate; a second component coupled to a surface of the package substrate; and a vapor chamber having an evaporator with a wick region at an interior surface, wherein the first component is between the vapor chamber and the package substrate, the second component is between the vapor chamber and the package substrate, the interior surface includes a recess, and the wick region is in the recess.

Example 109 includes the subject matter of Example 108, and further specifies that the recess has angled side walls.

Example 110 includes the subject matter of Example 109, and further specifies that no wicks are present on side walls of the recess.

Example 111 includes the subject matter of any of Examples 108-110, and further specifies that side walls of the recess are planar.

Example 112 includes the subject matter of any of Examples 108-111, and further specifies that a thickness of the evaporator is least at the wick region.

Example 113 includes the subject matter of any of Examples 108-112, and further specifies that the first component is between the wick region and the package substrate, and the second component is not between the wick region and the package substrate.

Example 114 includes the subject matter of any of Examples 108-113, and further specifies that the first component is a higher power component than the second component.

Example 115 includes the subject matter of any of Examples 108-114, and further specifies that the first component includes a power amplifier, and the second component includes a resonator.

Example 116 includes the subject matter of any of Examples 108-115, and further includes: a thermal interface material (TIM) between the vapor chamber and the first component.

Example 117 includes the subject matter of Example 116, and further specifies that the TIM includes indium or tin.

Example 118 includes the subject matter of any of Examples 116-117, and further specifies that the TIM includes a polymer material.

Example 119 includes the subject matter of any of Examples 108-118, and further includes: a mold material adjacent to the first component and the second component.

Example 120 includes the subject matter of any of Examples 108-119, and further specifies that the vapor chamber further includes a liquid in a vapor space of the vapor chamber.

Example 121 includes the subject matter of Example 120, and further specifies that the liquid includes water.

Example 122 includes the subject matter of any of Examples 108-121, and further specifies that a height of the vapor chamber is between 200 microns and 3 millimeters.

Example 123 includes the subject matter of any of Examples 108-122, and further specifies that a volume fraction of wick material in the wick region is between 25 percent and 75 percent.

Example 124 includes the subject matter of any of Examples 108-123, and further specifies that the vapor chamber further includes: a condenser; and side walls between the condenser and the evaporator.

Example 125 includes the subject matter of Example 124, and further specifies that the condenser has a superhydrophobic surface.

Example 126 includes the subject matter of any of Examples 124-125, and further specifies that the evaporator has a superhydrophilic surface.

Example 127 includes the subject matter of any of Examples 124-126, and further specifies that the vapor chamber further includes wicks on the side walls.

Example 128 includes the subject matter of any of Examples 124-126, and further specifies that no wicks are present on the side walls.

Example 129 includes the subject matter of any of Examples 124-128, and further specifies that a peripheral region of the interior surface of the evaporator is not parallel to a surface of the condenser.

Example 130 includes the subject matter of any of Examples 108-129, and further specifies that side walls of the recess contact the side walls of the vapor chamber.

Example 131 includes the subject matter of any of Examples 108-130, and further specifies that the wick region includes sintered particles.

Example 132 includes the subject matter of Example 131, and further specifies that the sintered particles have a diameter between 1 micron and 500 microns.

Example 133 includes the subject matter of any of Examples 108-132, and further specifies that the wick region includes pillars.

Example 134 includes the subject matter of Example 133, and further specifies that the pillars have a pitch between 2 microns and 1000 microns.

Example 135 includes the subject matter of any of Examples 133-134, and further specifies that the pillars have a diameter between 1 micron and 500 microns.

Example 136 includes the subject matter of any of Examples 133-135, and further specifies that individual pillars in the wick region have a width-to-height aspect ratio between 10:1 and 1:10.

Example 137 includes the subject matter of any of Examples 108-136, and further specifies that the wick region includes copper.

Example 138 includes the subject matter of any of Examples 108-137, and further specifies that the wick region includes a first wick density region and a second wick density region, and the first wick density region has a different wick density than the second wick density region.

Example 139 includes the subject matter of Example 138, and further specifies that the first wick density region includes first sintered particles, the second wick density region includes second sintered particles, and a first diameter of the first sintered particles is different than a second diameter of the second sintered particles.

Example 140 includes the subject matter of Example 139, and further specifies that the first sintered particles include copper.

Example 141 includes the subject matter of any of Examples 139-140, and further specifies that the second sintered particles include copper.

Example 142 includes the subject matter of any of Examples 139-141, and further specifies that the first diameter is between 1 micron and 25 microns.

Example 143 includes the subject matter of any of Examples 139-142, and further specifies that the second diameter is between 30 microns and 500 microns.

Example 144 includes the subject matter of Example 138, and further specifies that the first wick density region includes first pillars having a first pitch, the second wick density region includes second pillars having a second pitch, and the first pitch is different than the second pitch.

Example 145 includes the subject matter of Example 144, and further specifies that the first pillars include copper.

Example 146 includes the subject matter of any of Examples 144-145, and further specifies that the second pillars include copper.

Example 147 includes the subject matter of any of Examples 144-146, and further specifies that the first pitch is between 2 microns and 150 microns.

Example 148 includes the subject matter of Example 147, and further specifies that a height of the first pillars is between 1 micron and 50 microns.

Example 149 includes the subject matter of any of Examples 144-148, and further specifies that the second pitch is between 15 microns and 1000 microns.

Example 150 includes the subject matter of any of Examples 144-149, and further specifies that a height of the second pillars is between 10 microns and 500 microns.

Example 151 includes the subject matter of any of Examples 144-150, and further specifies that a diameter of individual pillars is between 1 micron and 500 microns.

Example 152 includes the subject matter of any of Examples 138-151, and further specifies that the wick region includes a third wick density region, and the third wick density region has a different wick density than the first wick density region.

Example 153 includes the subject matter of Example 152, and further specifies that the first wick density region is between the second wick density region and the third wick density region.

Example 154 includes the subject matter of Example 153, and further specifies that the first wick density region has a greater wick density than the second wick density region, and the first wick density region has a greater wick density than the third wick density region.

Example 155 is an integrated circuit (IC) assembly, including: the IC package of any of Examples 70-154; and a circuit board, wherein the IC package is electrically coupled to the circuit board.

Example 156 includes the subject matter of Example 155, and further includes: an interposer, wherein the interposer is between the IC package and the circuit board.

Example 157 includes the subject matter of any of Examples 155-156, and further includes: a heat sink, wherein the IC package is between the heat sink and the circuit board.

Example 158 includes the subject matter of Example 157, and further includes: a thermal interface material (TIM) between the IC package and the heat sink.

Example 159 includes the subject matter of any of Examples 155-158, and further includes: a housing around the IC package and the circuit board.

Example 160 includes the subject matter of any of Examples 155-159, and further includes: wireless communication circuitry communicatively coupled to the circuit board.

Example 161 includes the subject matter of any of Examples 155-159, and further includes: a display communicatively coupled to the circuit board.

Example 162 includes the subject matter of any of Examples 155-161, and further specifies that the IC assembly is a mobile computing device.

Example 163 includes the subject matter of any of Examples 155-161, and further specifies that the IC assembly is a server computing device.

Example 164 includes the subject matter of any of Examples 155-161, and further specifies that the IC assembly is a wearable computing device.

The invention claimed is:

1. A vapor chamber, comprising:
an evaporator having a wick region at a first portion of an interior surface of the evaporator;
a condenser having an interior surface facing the interior surface of the evaporator; and
side walls between the interior surface of the condenser and the interior surface of the evaporator, the side walls sealing a vapor space between the interior surface of the condenser and the interior surface of the evaporator,
wherein:
the interior surface of the evaporator further includes a second portion,
the second portion is outside of the wick region,
within the vapor space, the second portion is angled toward the wick region and is in contact with the first portion, and
the vapor space separates the second portion and the condenser.

2. The vapor chamber of claim 1, wherein a thickness of the evaporator is greater at a location outside the wick region than inside the wick region.

3. The vapor chamber of claim 1, wherein no wicks are present at the second portion of the interior surface.

4. The vapor chamber of claim 1, wherein the condenser has a superhydrophobic surface or the evaporator has a superhydrophilic surface.

5. The vapor chamber of claim 1, wherein the second portion of the interior surface of the evaporator is not parallel to the interior surface of the condenser.

6. The vapor chamber of claim 1, wherein the wick region includes a first wick density region and a second wick density region, and the first wick density region has a different wick density than the second wick density region.

7. The vapor chamber of claim 6, wherein the first wick density region includes first sintered particles, the second wick density region includes second sintered particles, and a first diameter of the first sintered particles is different than a second diameter of the second sintered particles.

8. The vapor chamber of claim 6, wherein the first wick density region includes first pillars having a first pitch, the second wick density region includes second pillars having a second pitch, and the first pitch is different than the second pitch.

9. The vapor chamber of claim 1, wherein a height of the vapor chamber is between 200 microns and 3 millimeters.

10. An integrated circuit (IC) package, comprising:
a package substrate;
a first component coupled to the package substrate;
a second component coupled to the package substrate; and
a vapor chamber, wherein the first component is between the vapor chamber and the package substrate, the second component is between the vapor chamber and the package substrate, and the vapor chamber includes:
an evaporator having a wick region at a first portion of an interior surface of the evaporator,
a condenser having an interior surface facing the interior surface of the evaporator, and
side walls between the interior surface of the condenser and the interior surface of the evaporator, the side walls sealing a vapor space between the interior surface of the condenser and the interior surface of the evaporator,
wherein:
the interior surface of the evaporator further includes a second portion,
the second portion is outside of the wick region, and
within the vapor space, the second portion is angled toward the wick region, is in contact with the first portion, and is separated from the condenser by the vapor space.

11. The IC package of claim 10, wherein the wick region includes a first wick subregion and a second wick subregion, the first wick subregion includes first sintered particles, the second wick subregion includes second sintered particles, and a first diameter of the first sintered particles is different than a second diameter of the second sintered particles.

12. The IC package of claim 10, wherein the wick region includes a first wick subregion and a second wick subregion, the first wick subregion includes first pillars having a first pitch, the second wick subregion includes second pillars having a second pitch, and the first pitch is different than the second pitch.

13. The IC package of claim 10, wherein the wick region includes a first wick subregion, a second wick subregion, and a third wick subregion, the first wick subregion has a different wick structure than the second wick subregion, and the third wick subregion has a different wick density than the first wick subregion.

14. The IC package of claim 13, wherein the first wick subregion is between the second wick subregion and the third wick subregion.

15. The IC package of claim 14, wherein the first wick subregion has a greater wick density than the second wick subregion, and the first wick subregion has a greater wick density than the third wick subregion.

16. The IC package of claim 10, wherein the first component includes a power amplifier, and the second component includes a resonator.

17. A vapor chamber, comprising:
an evaporator having a wick region at an interior surface, wherein a portion of the interior surface of the evaporator, outside the wick region, is angled toward the wick region and is in contact with the wick region;
a condenser, wherein an interior surface of the condenser is opposite the interior surface of the evaporator; and
side walls between the interior surface of the condenser and the interior surface of the evaporator,
wherein the interior surface of the condenser and the interior surface of the evaporator are separated from one another by a space, and wherein the space is a vapor conduit sealed by the side walls.

18. The vapor chamber of claim 17, wherein the portion of the interior surface of the evaporator is angled toward the wick region inside the vapor conduit.

19. The vapor chamber of claim 17, wherein the side walls include solder.

20. The vapor chamber of claim 17, wherein the side walls include an impermeable adhesive.

* * * * *